(12) United States Patent
Matsusaki et al.

(10) Patent No.: US 12,422,596 B2
(45) Date of Patent: Sep. 23, 2025

(54) LIGHT-EMITTING ELEMENT AND DISPLAY DEVICE

(71) Applicant: Sony Semiconductor Solutions Corporation, Kanagawa (JP)

(72) Inventors: Koji Matsusaki, Kumamoto (JP); Kiyoshi Kaneuchi, Kumamoto (JP); Koji Tanaka, Kanagawa (JP); Yosuke Motoyama, Kanagawa (JP); Kouhei Sugiyama, Aichi (JP); Chugen Hamachi, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 449 days.

(21) Appl. No.: 18/014,877

(22) PCT Filed: Aug. 20, 2021

(86) PCT No.: PCT/JP2021/030503
§ 371 (c)(1),
(2) Date: Jan. 6, 2023

(87) PCT Pub. No.: WO2022/044980
PCT Pub. Date: Mar. 3, 2022

(65) Prior Publication Data
US 2023/0221469 A1    Jul. 13, 2023

(30) Foreign Application Priority Data
Aug. 28, 2020   (JP) .................................. 2020-144319

(51) Int. Cl.
*G02B 3/00*    (2006.01)
*H10K 59/12*   (2023.01)
*H10K 59/80*   (2023.01)

(52) U.S. Cl.
CPC ........... *G02B 3/0068* (2013.01); *H10K 59/12* (2023.02); *H10K 59/879* (2023.02)

(58) Field of Classification Search
CPC ...... G02B 3/0068; G02B 5/201; H10K 59/12; H10K 59/879; H10K 59/38; G09F 9/30; H05B 33/02; H05B 33/12
See application file for complete search history.

(56) References Cited

U.S. PATENT DOCUMENTS

2016/0043145 A1   2/2016  Choi
2016/0087018 A1*  3/2016  Shim ................... H10K 59/122
                                                    257/40

(Continued)

FOREIGN PATENT DOCUMENTS

CN       105390528 A    3/2016
CN       111584571 A    8/2020

(Continued)

OTHER PUBLICATIONS

International Search Report (PCT/ISA/210), International Application No. PCT/JP2021/030503, dated Nov. 9, 2021.

*Primary Examiner* — James C. Jones
(74) *Attorney, Agent, or Firm* — Michael Best & Friedrich LLP

(57) ABSTRACT

A light-emitting element (10) includes: a light-emitting part (30) including a light-emitting region; a first optical path control unit (71) which has positive optical power and to which light emitted from the light-emitting region enters; a second optical path control unit (72) which has positive optical power and to which light exited from the first optical path control unit (71) enters; and a bonding member (35) interposed between the first optical path control unit (71) and the second optical path control unit (72), in which an optical axis ($LN_1$) of the first optical path control unit (71)

(Continued)

is displaced from an optical axis ($LN_2$) of the second optical path control unit (72).

9 Claims, 38 Drawing Sheets

(56) References Cited

U.S. PATENT DOCUMENTS

| | | | |
|---|---|---|---|
| 2019/0251318 A1 | 8/2019 | Jung | |
| 2020/0212364 A1 | 7/2020 | Kim | |

FOREIGN PATENT DOCUMENTS

| | | | |
|---|---|---|---|
| JP | 2004342448 A | 12/2004 | |
| JP | 2008177109 A | 7/2008 | |
| JP | 2010272858 A | 12/2010 | |
| JP | 2015523673 A | 8/2015 | |
| JP | 2016018698 A | 2/2016 | |
| KR | 20120001997 A | 1/2012 | |
| WO | 2020111101 A1 | 6/2020 | |

\* cited by examiner

LIGHT-EMITTING ELEMENT AND DISPLAY DEVICE

FIELD

The present disclosure relates to a light-emitting element and a display device.

BACKGROUND

In recent years, there are being developed display devices (organic electroluminescence (EL) display devices) in which an organic EL element is used as a light-emitting element. In the light-emitting element as a component of this organic EL display device, for example, an organic layer including at least a light-emitting layer, and a second electrode (an upper electrode, for example, a cathode electrode) are formed on a first electrode (a lower electrode, for example, an anode electrode) formed separately for each pixel. Moreover, for example, a red light-emitting element in which an organic layer that emits white light or red light is combined with a red color filter layer, a green light-emitting element in which an organic layer that emits white light or green light is combined with a green color filter layer, and a blue light-emitting element in which an organic layer that emits white light or blue light is combined with a blue color filter layer each are provided as a subpixel, and these subpixels are included in one pixel. Light from the organic layer is outputted to the outside via the second electrode (upper electrode). Furthermore, a structure in which microlenses are provided in order to improve the light outcoupling efficiency, for example, a structure in which two microlenses are vertically provided is well-known from, for example, JP 2008-177109 A.

CITATION LIST

Patent Literature

Patent Literature 1: JP 2008-177109 A

SUMMARY

Technical Problem

As described above, the vertical provision of two microlenses enables to enhance the utilization efficiency of the light emitted from the organic EL element. However, there is a demand for a technology to further enhance the utilization efficiency of the light emitted from the organic EL element.

Therefore, an object of the present disclosure is to provide a light-emitting element having a configuration and a structure capable of further enhancing a front light outcoupling efficiency, and a display device including the light-emitting element.

Solution to Problem

A light-emitting element of the present disclosure in order to solve the above problem includes:
a light-emitting part including a light-emitting region;
a first optical path control unit on which light emitted from the light-emitting region is incident, the first optical path control unit having positive optical power;
a second optical path control unit to which light exited from the first optical path control unit enters, the second optical path control unit having positive optical power; and
a bonding member interposed between the first optical path control unit and the second optical path control unit, wherein
an optical axis of the first optical path control unit is displaced from an optical axis of the second optical path control unit.

A display device of the present disclosure in order to solve the above problem includes:
a first substrate and a second substrate; and
a plurality of light-emitting element units each including a first light-emitting element, a second light-emitting element, and a third light-emitting element, provided on the first substrate, wherein
each light-emitting element includes:
a light-emitting part provided above the first substrate, the light-emitting part including a light-emitting region;
a first optical path control unit to which light emitted from the light-emitting region enters, the first optical path control unit having positive optical power;
a second optical path control unit to which light exited from the first optical path control unit enters, the second optical path control unit having positive optical power; and
a bonding member interposed between the first optical path control unit and the second optical path control unit, and
an optical axis of the first optical path control unit is displaced from an optical axis of the second optical path control unit.

Note that, in all light-emitting elements of the display device of the present disclosure, an optical axis of the first optical path control unit is displaced from an optical axis of the second optical path control unit.

DESCRIPTION OF EMBODIMENTS

Figure 1:
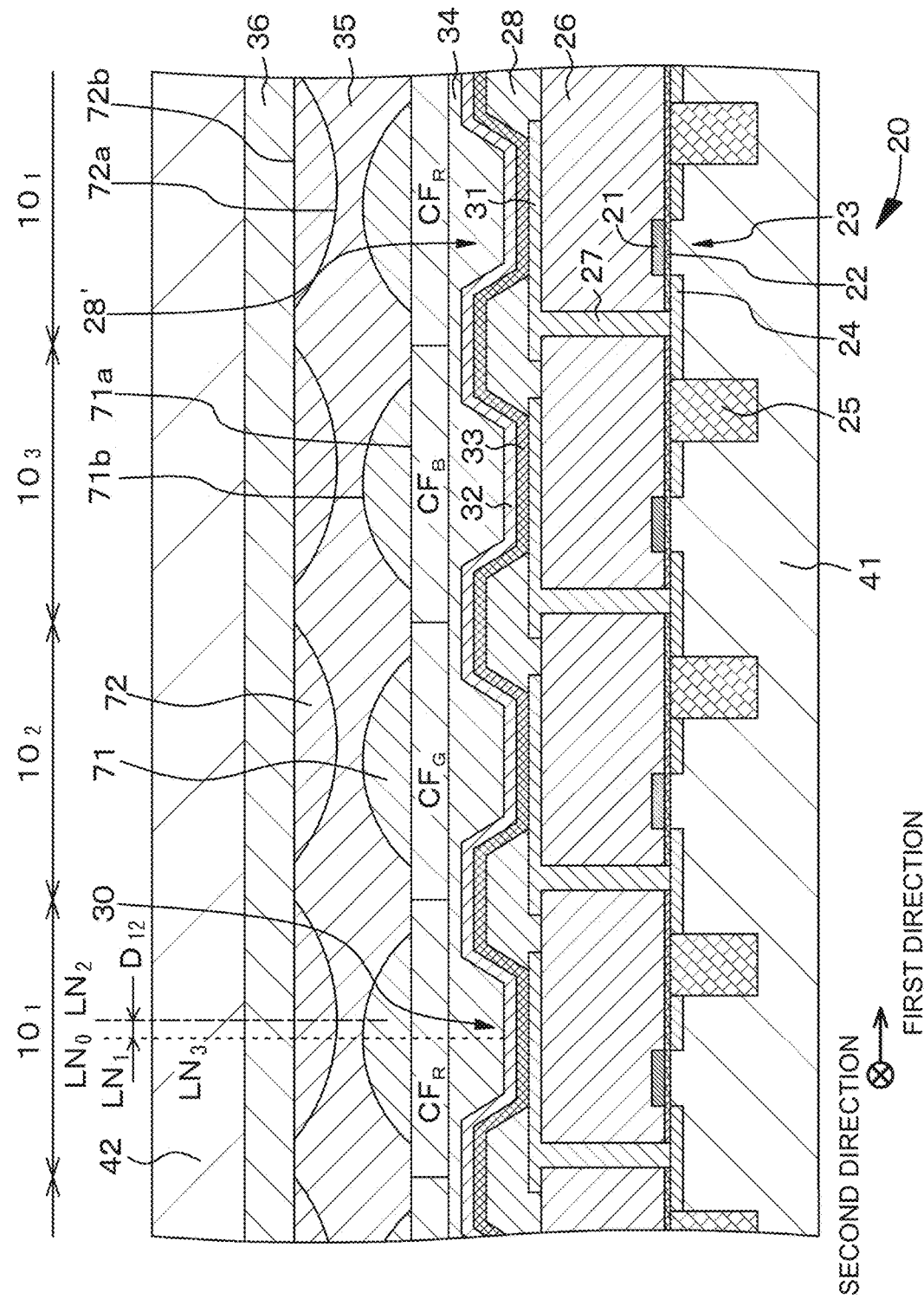
FIG. 1 is a schematic partial cross-sectional view of a light-emitting element and a display device of Example 1.

Hereinafter, the present disclosure will be described based on Examples with reference to the drawings, but the present disclosure is not limited to Examples, and various numerical values and materials in Examples are illustrative. Note that the description will be given in the following order.

1. General description of the light-emitting element of the present disclosure and the display device of the present disclosure
2. Example 1 (The light-emitting element of the present disclosure and the display device of the present disclosure)
3. Example 2 (Modification of Example 1)
4. Example 3 (Modification of Examples 1 and 2)
5. Example 4 (Modification of Examples 1 to 3)
6. Example 5 (Application example of display device of Examples 1 to 4)
7. Others <General Description of the Light-Emitting Element of the Present Disclosure and the Display Device of the Present Disclosure>

The display device of the present disclosure can be in a configuration in which the amount of displacement between the optical axis of the first optical path control unit and the optical axis of the second optical path control unit is the same among the first light-emitting element, the second light-emitting element, and the third light-emitting element in each light-emitting element unit. In this case, the direction of displacement between the optical axis of the first optical path control unit and the optical axis of the second optical path control unit can be configured to be the same among the first light-emitting element, the second light-emitting element, and the third light-emitting element in each light-emitting element unit. Alternatively, the amount of displacement between the optical axis of the first optical path control unit and the optical axis of the second optical path control unit may be varied depending on which area is taken up by the light-emitting element unit in the image display region (referred to as a "display panel" for convenience) of the display device. As the amount of displacement, there can be exemplified from 6% to 14% of the size of a light-emitting region (described later), but is not limited thereto. Here, when the light-emitting region has a planar shape as a circle, the size of the light-emitting region is the diameter of the circle. Alternatively, when the light-emitting region has a planar shape other than a circle, the planar shape of the light-emitting region is deformed into a circle, and the diameter of the circle is defined as the size of the light-emitting region.

In the light-emitting element of the present disclosure and the light-emitting element included in the display device of the present disclosure (hereinafter, these light-emitting elements may be referred to as "light-emitting element and the like of the present disclosure" for convenience) including the preferable configurations described above, the optical axis of the first optical path control unit can be configured to pass through the center of the light-emitting region. However, the optical axis of the first optical path control unit is not limited thereto, the optical axis of the first optical path control unit can be configured to be displaced from the center of the light-emitting region depending on the position of the light-emitting element in the display panel, or the amount of displacement between the optical axis of the first optical path control unit and the center of the light-emitting region can be configured to vary depending on the position of the light-emitting element in the display panel. Note that, in the description of the light-emitting element and the like of the present disclosure, as a general rule, a direction away from a light-emitting part is expressed as "upper", and a direction toward the light-emitting part is expressed as "lower".

In the light-emitting element and the like of the present disclosure including the preferable configurations described above, a bonding member can be configured to be present between the top of a first optical path control unit and the top of a second optical path control unit. That is, the first optical path control unit and the second optical path control unit can be configured to be spaced apart from each other. Alternatively, the top of the first optical path control unit and the top of the second optical path control unit can be configured to be in contact with each other. In this case, the top of the first optical path control unit and the top of the second optical path control unit can be configured to be in a state of point contact, or can be configured to be in a state of surface contact. In the latter case, a flat portion can be configured to be formed by the top where the first optical path control unit and the second optical path control unit are in contact with each other. In this case, when the area of the flat portion where the first optical path control unit and the second optical path control unit are in contact with each other is denoted by $S_{12}$ and the area of the light-emitting region is denoted by $S_0$, then $$0.5 \leq S_0/S_{12} \leq 1.2$$

can be configured to be satisfied. When the radius of curvature of the portion of the first optical path control unit is denoted by $r_1$ and the radius of curvature of the portion of the second optical path control unit other than the flat portion is denoted by $r_2$, then $r_2=r_1$ can be satisfied, $r_2>r_1$ can be satisfied, or $r_2<r_1$ can be satisfied.

Furthermore, in the light-emitting element and the like of the present disclosure including the preferable configurations described above, when the refractive index of the material included in the first optical path control unit is denoted by $n_1$, the refractive index of the material included in the second optical path control unit is denoted by $n_2$, and the refractive index of the material included in the bonding member is denoted by $n_0$, then $$n_1 > n_0$$

and $$n_2 > n_0$$

can be configured to be satisfied. Note that, $$n_2 = n_1 > n_0$$

can be satisfied $$n_2 > n_1 > n_0$$

can be satisfied, or $$n_1 > n_2 > n_0$$

can be satisfied. Alternatively, $$n_1 - n_0 \geq 0.1$$

$$n_2 - n_0 \geq 0.1$$

are preferably satisfied.

Furthermore, in the light-emitting element and the like of the present disclosure including the preferable configurations described above, a wavelength selector can be configured to be provided between the light-emitting part and the first optical path control unit. However, the wavelength selector is not limited thereto, the wavelength selector can be configured to be provided between a second substrate and a second optical path control unit, or the wavelength selector can be configured to be provided between the first optical path control unit and the second optical path control unit. That is, the wavelength selector needs to be provided above the first substrate, and the wavelength selector can be provided on the first substrate side, or can be provided on the second substrate side. The size of the wavelength selector (e.g., a color filter layer) can be appropriately varied in accordance with light emitted by the light-emitting element.

As the wavelength selector, a color filter layer can be exemplified. Examples of the color filter layer include: not only a color filter layer that transmits, green, or blue; but also a color filter that transmits a specific wavelength such as cyan, magenta, or yellow in some cases. The color filter layer is made of a resin (e.g., a photocurable resin) added with a colorant including a desired pigment or dye, and is adjusted by selecting the pigment or dye so as to have a high light transmittance in a desired wavelength region such as red, green, or blue, as well as a low light transmittance in the other wavelength regions. Such color filter layer can be made by a well-known color resist material. In a light-emitting element that emits white light to be described later, a transparent filter layer needs to be disposed. Alternatively, examples of the wavelength selector include: a photonic crystal; a plasmon application wavelength selection element (e.g., a wavelength selector having a conductor lattice structure in which a lattice-shaped hole structure is provided in a conductor thin film, disclosed in JP 2008-177191 A, or a wavelength selector based on surface plasmon excitation using a diffraction grating); a wavelength selector with use of a dielectric multilayer film in which a specific wavelength can be transmitted through multiple reflections in the thin films by layering of dielectric thin films; a thin film made of an inorganic material such as thin film amorphous silicon; and a quantum dot. Hereinafter, there may be a case where an explanation will be made with a color filter layer as a representative wavelength selector, but the wavelength selector is not limited to the color filter layer.

As described above, the light emitted from the light-emitting part can be configured to pass through the wavelength selector, the first optical path control unit, and the second optical path control unit in this order, can be configured to pass through the first optical path control unit, the wavelength selector, and the second optical path control unit in this order, or can be configured to pass through the first optical path control unit, the second optical path control unit, and the wavelength selector in this order.

When an orthographic projection image to the first substrate is defined as an orthographic projection image (the same applies hereinafter), (a) the orthographic projection image of the first optical path control unit can be configured to coincide with the orthographic projection image of the wavelength selector, (b) the orthographic projection image of the first optical path control unit can be configured to be included in the orthographic projection image of the wavelength selector, or (c) the orthogonal projection image of the wavelength selector can be configured to be included in the orthogonal projection image of the first optical path control unit.

That is, the planar shape of the wavelength selector may be the same as, similar to, approximate to, or different from the planar shape of the first optical path control unit. Note that, when using a configuration in which the orthogonal projection image of the first optical path control unit is included in the orthogonal projection image of the wavelength selector, the occurrence of color mixture between adjacent light-emitting elements can be reliably suppressed.

The planar shape of the wavelength selector may be the same as, similar to, approximate to, or different from the planar shape of the light-emitting region, but the wavelength selector is preferably larger than the light-emitting region.

The center of the wavelength selector (the center of its orthogonal projection onto the first substrate) can be configured to pass through the center of the light-emitting region, or can be configured not to pass through the center of the light-emitting region. The size of the wavelength selector may be appropriately modified in accordance with the distance (offset amount) $d_0$ (described later) between the normal line passing through the center of the light-emitting region and the normal line passing through the center of the wavelength selector. Here, various normal lines each are a perpendicular line to the first substrate.

Here, the center of a wavelength selector refers to the area centroid of a region taken up by the wavelength selector. Alternatively, when the planar shape of a wavelength selector is a circle, an ellipse, a square (including a square with rounded corners), a rectangle (including a rectangle with rounded corners), or a regular polygon (including a regular polygon with rounded corners), the center of each of these figures corresponds to the center of the wavelength selector; when a part of these figures is cut out, the figure is filled up with the cutout portion, and the center of the complemented figure corresponds to the center of the wavelength selector; when these figures are connected, the connecting portion is removed, the figure is filled up with the removed portion, and the center of the complemented figure corresponds to the center of the wavelength selector. Note that, the center of a first optical path control unit refers to the area centroid of a region taken up by the first optical path control unit. Alternatively, when the planar shape of a first optical path control unit is a circle, an ellipse, a square (including a square with rounded corners), a rectangle (including a rectangle with rounded corners), or a regular polygon (including a regular polygon with rounded corners), the center of each of these figures corresponds to the center of the first optical path control unit. Note that the center of a light-emitting region refers to the area centroid of an area where a first electrode and an organic layer (which will be described later) are in contact with each other.

Furthermore, in the light-emitting element and the like of the present disclosure including the preferable configurations described above, the first optical path control unit can be configured to be made of a first lens member such as a plano-convex lens having a convex shape protruding in a direction away from the light-emitting part, and the second optical path control unit can be configured to be made of a second lens member such as a plano-convex lens having a convex shape protruding in a direction toward the light-emitting part. That is, the first optical path control unit (first lens member) can be configured to have a light exit surface with a convex shape, and a light incident surface that is flat, for example; the second optical path control unit (second lens member) can be configured to have a light incident surface with a convex shape, and a light exit surface that is flat, for example. The size of the second optical path control unit may be the same as the size of the first optical path control unit, the second optical path control unit may be larger than the first optical path control unit, or the first optical path control unit may be larger than the second optical path control unit, but the second optical path control unit is preferably larger than the first optical path control unit.

In the display device of the present disclosure, the sizes of planar shapes of the first optical path control unit and the second optical path control unit (hereinafter, these optical path control units may be collectively referred to as "optical path control unit and the like") may be varied depending on the light-emitting element. For example, in a case where one light-emitting element unit (pixel) includes three light-emitting elements (subpixels), the sizes of the planar shapes of the optical path control unit and the like may have the same value among three light-emitting elements included in one light-emitting element unit, may have the same value between two light-emitting elements except for one light-emitting element, or may have different values among three light-emitting elements. The refractive index of a material included in the optical path control unit and the like may be changed in accordance with the light-emitting element. For example, in a case where one light-emitting element unit (pixel) includes three light-emitting elements (subpixels), the refractive indices of materials included in the optical path control unit and the like may be the same value among the three light-emitting elements, may be the same values between the two light-emitting elements except for one light-emitting element, or may be different values among the three light-emitting elements.

In the light-emitting element and the like of the present disclosure including the various preferable configurations and compositions described above, the first lens member and the second lens member included in the optical path control unit and the like (hereinafter, these lens members may be collectively referred to as "lens member and the like") can be configured to include a hemispherical shape or a shape composed of a part of a sphere, alternatively, in general, the lens member and the like can be configured to include a shape suitable to serve as a lens. Specifically, as described above, the lens member and the like can include a convex lens member, specifically, a plano-convex lens. Alternatively, the lens member can be a spherical lens, or can be an aspherical lens. Note that, the optical path control unit and the like can be a refractive lens, or can be a diffractive lens.

Alternatively, the optical path control unit and the like can be a lens member, assumed to be a rectangular parallelepiped having a square or rectangular bottom surface, the four side surfaces and one top surface of this rectangular parallelepiped each have a convex shape, and a portion of each edge where two side surface meet is rounded, a portion of each edge where the top surface meets each side surface is also rounded, and having a three-dimensional shape rounded as a whole. Alternatively, a lens member can be assumed to be a rectangular parallelepiped (including a cube approximated to a rectangular parallelepiped) having a square or rectangular bottom surface, the four side surfaces and one top surface of this rectangular parallelepiped are planar, in which, in some cases, a lens member can have a three-dimensional shape in which a portion of an edge where two side surfaces meet is rounded in some cases, or in some cases, a portion of an edge where the top surface meets the side surface is also rounded. Alternatively, the lens member can be configured to include a lens member whose cross-section cut along a virtual plane (vertical virtual plane) including the thickness direction has a rectangular or isosceles trapezoidal shape. In other words, the lens member can be configured to include a lens member whose cross-sectional shape is constant, or varies along the thickness direction.

Alternatively, in the light-emitting element and the like of the present disclosure, the optical path control unit and the like can be configured to include a light output direction control member whose cross-section cut along a virtual plane (vertical virtual plane) including the thickness direction has a rectangular or isosceles trapezoidal shape. In other words, the optical path control unit and the like can be configured to include a light output direction control member whose cross-sectional shape is constant, or varies along the thickness direction.

Furthermore, in the light-emitting element and the like of the present disclosure including the preferable configurations described above, the light-emitting part can be configured to have a convex cross-sectional shape protruding toward the first substrate.

In the light-emitting element and the like of the present disclosure including the various preferable configurations and compositions described above, the light-emitting part (organic layer) can be configured to include an organic electroluminescence layer. That is, the light-emitting element and the like of the present disclosure including the various preferable configurations and compositions described above can be configured to include an organic electroluminescence element (organic EL element), and the display device and the like of the present disclosure can be configured to include an organic electroluminescence display device (organic EL display device).

An organic EL display device including:
a first substrate, and a second substrate; and
a plurality of light-emitting elements located between the first substrate and the second substrate and arranged two-dimensionally, in which
each light-emitting element provided on a substratum formed on the first substrate includes the light-emitting element and the like of the present disclosure including the preferable configurations described above, alternatively
each light-emitting element provided on a substratum formed on the first substrate includes a light-emitting part, and
the light-emitting part includes:
a first electrode;
a second electrode; and
an organic layer (including a light-emitting layer made of an organic electroluminescence layer) interposed between the first electrode and the second electrode, in which
light from the organic layer is outputted to the outside via the second substrate. That is, the display device of the present disclosure can be a top-emission type (top surface-emission type) display device (top surface-emission type display device) that outputs light from the second substrate.

Alternatively, to say in other words, the display device of the present disclosure includes: a first substrate; a second substrate; and an image display region (display panel) interposed between the first substrate and the second substrate, and in the image display region, a plurality of light-emitting elements including the preferable configurations and compositions described above is arranged in a two-dimensional matrix.

In the display device of the present disclosure, the first light-emitting element can be configured to emit red light, the second light-emitting element can be configured to emit green light, and the third light-emitting element can be configured to emit blue light, and furthermore, a fourth light-emitting element that emits white light, or a fourth light-emitting element that emits light of a color other than red light, green light, and blue light can be added.

In the display device of the present disclosure, as an example of the arrangement of the pixels (or subpixels), a delta array can be mentioned, alternatively, a stripe array, a diagonal array, a rectangle array, a pentile array, or a square array can be mentioned. The wavelength selectors also can be arranged in a delta array, alternatively in a stripe array, a diagonal array, a rectangle array, a pentile array, or a square array in accordance with the pixel (or subpixel) arrangement.

That is, the light-emitting element and the like of the present disclosure specifically include: a first electrode; an organic layer formed on the first electrode; a second electrode formed on the organic layer; and a protective layer (planarized layer) formed on the second electrode. The first optical path control unit is formed on the protective layer or above the protective layer. As such, light from the organic layer is outputted to the outside via the second electrode, the protective layer, the first optical path control unit, the bonding member, the second optical path control unit, and the second substrate; or in some cases, light from the organic layer is outputted to the outside via the second electrode, the protective layer, the first optical path control unit, the second optical path control unit, and the second substrate; or in a case where a wavelength selector is provided in these optical paths of the outgoing light, or in a case where an underlying layer is provided on an inner surface (surface facing toward the first substrate) of the second substrate, the light is outputted to the outside via the wavelength selector and the underlying layer as well.

The first electrode is provided for each light-emitting element. The organic layer including the light-emitting layer made of the organic light emitting material is provided for each light-emitting element, or is provided in common to the light-emitting elements. The second electrode is provided in common to the plurality of light-emitting elements. That is, the second electrode is a so-called solid electrode, and is a common electrode. The first substrate is disposed below or under the substratum, and the second substrate is disposed above the second electrode. A light-emitting element is formed nearer to the first substrate side, and the light-emitting part is provided on the substratum. Specifically, the light-emitting part is provided on a substratum formed on the first substrate, or is provided on a substratum formed above the first substrate. As described above, the first electrode, the organic layer (including the light-emitting layer), and the second electrode, each as a component of the light-emitting part, are formed on the substratum one on another.

In the light-emitting element and the like of the present disclosure, the first electrode can be configured to be in contact with a part of the organic layer, alternatively a part of the first electrode can be configured to be in contact with the organic layer, or the first electrode can be configured to be in contact with the organic layer. In these cases, specifically, the size of the first electrode can be configured to be smaller than that of the organic layer, or the size of the first electrode can be configured to be the same as that of the organic layer, or the size of the first electrode can be configured to be larger than that of the organic layer. An insulating layer can be configured to be formed in a part between the first electrode and the organic layer. A region where the first electrode and the organic layer are in contact with each other is a light-emitting region. The size of the light-emitting region is the size of an area where the first electrode and the organic layer are in contact with each other. The size of the light-emitting region may be varied in accordance with the color of the light emitted from a light-emitting element.

In the light-emitting element and the like of the present disclosure, the organic layer includes a layered structure of at least two light-emitting layers that emit different colors, and can be configured such that the color of light emitted in the layered structure is white light. That is, the organic layer included in the red light-emitting element (first light-emitting element), the organic layer included in the green light-emitting element (second light-emitting element), and the organic layer included in the blue light-emitting element (third light-emitting element) can be configured to emit white light. In this case, the organic layer that emits white light can be configured to include a layered structure of a red light-emitting layer that emits red light, a green light-emitting layer that emits green light, and a blue light-emitting layer that emits blue light. Alternatively, the organic layer that emits white light can be configured to include a layered structure of a blue light-emitting layer that emits blue light and a yellow light-emitting layer that emits yellow light, or can be configured to include a layered structure of a blue light-emitting layer that emits blue light and an orange light-emitting layer that emits orange light. Specifically, the organic layer can be a three layered structure of a red light-emitting layer that emits red light (wavelength: from 620 nm to 750 nm), a green light-emitting layer that emits green light (wavelength: from 495 nm to 570 nm), and a blue light-emitting layer that emits blue light (wavelength: from 450 nm to 495 nm), and emits white light as a whole. Such an organic layer (light-emitting part) that emits white light is combined with a wavelength selector that transmits red light (or a protective layer that serves as a red color filter layer) to form a red light-emitting element, an organic layer (light-emitting part) that emits white light is combined with a wavelength selector that transmits green light (or a protective layer that serves as a green color filter layer) to form a green light-emitting element, and an organic layer (light-emitting part) that emits white light is combined with a wavelength selector that transmits blue light (or a protective layer that serves as a blue color filter layer) to form a blue light-emitting element. A combination of subpixels such as a red light-emitting element, a green light-emitting element, and a blue light-emitting element forms one pixel (light-emitting element unit). In some cases, one pixel may include a red light-emitting element, a green light-emitting element, a blue light-emitting element, and a light-emitting element that emits white light (or a light-emitting element that emits complementary color light). In a configuration including at least two light-emitting layers that emit different colors, there is practically a case where the light-emitting layers that emit different colors are mixed and each of the layers is not clearly separated. The organic layer may be common to a plurality of light-emitting elements, or may be individually provided in each light-emitting element.

As described above, the protective layer having a function as a color filter layer can be made of a well-known color resist material. In a light-emitting element that emits white light, a transparent filter layer needs to be disposed. When a protective layer is allowed to serve also as a color filter layer as described above, the protective layer (color filter layer) comes to close to an organic layer and hence a color mixing can be effectively prevented even with a wider angle of the light emitted from the light-emitting element, so that viewing angle characteristics are improved.

Alternatively, the organic layer can be configured to include one light-emitting layer. In this case, the light-emitting element can include, for example, a red light-emitting element having an organic layer including a red light-emitting layer, a green light-emitting element having an organic layer including a green light-emitting layer, or a blue light-emitting element having an organic layer including a blue light-emitting layer. That is, the organic layer included in the red light-emitting element can be configured to emit red light, the organic layer included in the green light-emitting element can be configured to emit green light, and the organic layer included in the blue light-emitting element can be configured to emit blue light. As such, these three types of light-emitting elements (subpixels) form one pixel. In the case of display device to represent color, one pixel includes these three types of light-emitting elements (subpixels). Note that, the formation of color filter layer is unnecessary in principle, but a color filter layer may be provided for improving color purity.

In a case where the light-emitting element unit (one pixel) includes a plurality of light-emitting elements (subpixels), the size of the light-emitting region of the light-emitting element may be changed in accordance with the light-emitting element. Specifically, the size of the light-emitting region of the third light-emitting element (blue light-emitting element) can be configured to be larger than each of the size of the light-emitting region of the first light-emitting element (red light-emitting element) and the size of the light-emitting region of the second light-emitting element (green light-emitting element). As a result, the amount of luminescence of the blue light-emitting element can be more than each of the amount of luminescence of the red light-emitting element and the amount of luminescence of the green light-emitting element, alternatively the amount of luminescence of the blue light-emitting element, the amount of luminescence of the red light-emitting element, and the amount of luminescence of the green light-emitting element can be optimized, so that an image quality can be improved. Alternatively, when a light-emitting element unit (one pixel) is assumed to include a white light-emitting element that emits white light in addition to the red light-emitting element, the green light-emitting element, and the blue light-emitting element, from the viewpoint of luminance, the size of the light-emitting region in each of the green light-emitting element and the white light-emitting element is preferably larger than the size of the light-emitting region in each of the red light-emitting element and the blue light-emitting element. Besides, it is preferable from the viewpoint of the life of the light-emitting element that the size of the light-emitting region of the blue light-emitting element is larger than the size of the light-emitting region of each of the red light-emitting element, the green light-emitting element, and the white light-emitting element. However, the size of the light-emitting region is not limited thereto.

The first optical path control unit and the second optical path control unit can be made of, for example, a well-known transparent resin material such as an acrylic based resin, and can be obtained by melt-flowing of the transparent resin material, alternatively they can be obtained by etch-back of the transparent resin material, can be obtained based on an organic material or an inorganic material by a combination of an etching method and a photolithography technique using a gray tone mask or a halftone mask, or can be obtained by a method such as forming the transparent resin material into a lens shape based on a nanoimprint process. Examples of the outer shapes of the first optical path control unit and the second optical path control unit include, but are not limited to, a circle, an ellipse, a square, and a rectangle.

Examples of the material included in the bonding member include: a thermosetting adhesive such as an acrylic-based adhesive, an epoxy-based adhesive, a urethane-based adhesive, a silicone-based adhesive, and a cyanoacrylate-based adhesive; and an ultraviolet curable adhesive.

Examples of the material included in the protective layer (planarized layer) include: an acrylic based resin, an epoxy-based resin, and various inorganic materials [e.g., $SiO_2$, SiN, SiON, SiC, amorphous silicon (α-Si), $Al_2O_3$, $TiO_2$]. The protective layer may have a single layer configuration or may include a plurality of layers, but in the latter case, in the light-emitting element and the like of the present disclosure, the materials included in the protective layer preferably have refractive indices whose values decreasing in order from the light incident direction to the light output direction. As for the method of forming the protective layer, the protective layer can be formed based on a known method such as various CVD methods, various coating methods, various PVD methods including a sputter deposition method and a vacuum vapor deposition method, or various printing methods including a screen printing method. Besides, as a method of forming the protective layer, an atomic layer deposition (ALD) process can also be used. The protective layer may be common to a plurality of light-emitting elements, or may be individually provided in each light-emitting element.

The first substrate or the second substrate can be made of a silicon semiconductor substrate, a high strain point glass substrate, a soda glass ($Na_2O \cdot CaO \cdot SiO_2$) substrate, a borosilicate glass ($Na_2O \cdot B_2O \cdot SiO_2$) substrate, a forsterite ($2MgO \cdot SiO_2$) substrate, a lead glass ($Na_2O \cdot PbO \cdot SiO_2$) substrate, various glass substrates on whose surface an insulating material layer is formed, a quartz substrate, a quartz substrate on whose surface an insulating material layer is formed, an organic polymer (having a polymer material form such as a flexible plastic film, a plastic sheet, or a plastic substrate, made of a polymer material.) exemplified by polymethyl methacrylate (PMMA), polyvinyl alcohol (PVA), polyvinylphenol (PVP), polyethersulfone (PES), polyimide, polycarbonate, polyethylene terephthalate (PET), and polyethylene naphthalate (PEN). The material included in the first substrate and the material included in the second substrate may be the same or different from each other. However, because of being for a top surface-emission type display device, the second substrate is required to be transparent to light from the light-emitting element.

When the first electrode is allowed to serve as an anode electrode, examples of the material included in the first electrode include: a metal having a high work function such as platinum (Pt), gold (Au), silver (Ag), chromium (Cr), tungsten (W), nickel (Ni), copper (Cu), iron (Fe), cobalt (Co), or tantalum (Ta); or an alloy (e.g., an Ag—Pd—Cu alloy having silver as a main component and containing from 0.3% by mass to 1% by mass of palladium (Pd) and from 0.3% by mass to 1% by mass of copper (Cu), an Al—Nd alloy, an Al—Cu alloy, or an Al—Cu—Ni alloy). Besides, in the case of using a conductive material having a small value of work function and a high light reflectance, such as aluminum (Al) and an alloy containing aluminum, in a case where an appropriate hole injection layer or the like is provided to enhance hole injection characteristics, the conductive material can be used as an anode electrode. As the thickness of the first electrode, there can be exemplified from 0.1 μm to 1 μm. Alternatively, when providing a light reflection layer included in a resonator structure to be described later, the first electrode is required to be transparent to light from the light-emitting element, and hence, as examples of materials included in the first electrode, there can be mentioned various transparent conductive materials such as a transparent conductive material having a matrix layer made of: indium oxide, indium-tin oxide (including ITO, Sn-doped $In_2O_3$, crystalline ITO, or amorphous ITO), indium-zinc oxide (IZO), indium-gallium oxide (IGO), indium-doped gallium-zinc oxide (IGZO, In—$GaZnO_4$), IFO (F-doped $In_2O_3$), ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide and magnesium oxide-doped zinc oxide), antimony oxide, titanium oxide, NiO, a spinel type oxide, an oxide having a $YbFe_2O_4$ structure, gallium oxide, titanium oxide, niobium oxide, nickel oxide, or the like. Alternatively, the first electrode also may have a structure in which a transparent conductive material having excellent hole injection characteristics, such as an oxide of indium and tin (ITO) or an oxide of indium and zinc (IZO), is layered on a dielectric multilayer film or on a reflective film having high light reflectivity, such as aluminum (Al) or an alloy thereof (e.g., an Al—Cu—Ni alloy). On the other hand, in a case where the first electrode is allowed to serve as a cathode electrode, the first electrode is desirable to include a conductive material having a small value of work function and a high light reflectance, however, by providing an appropriate electron injection layer or the like to enhance electron injection characteristics, a conductive material having a high light reflectance used as an anode electrode can also be used as a cathode electrode.

In a case where the second electrode is allowed to serve as a cathode electrode, a material included in the second electrode (semi-light transmissive material or light transmissive material) desirably includes a conductive material having a small value of work function so as to transmit luminous light as well as to efficiently inject electrons into the organic layer (light-emitting layer). Examples thereof include metals having a small work function or alloys: such as aluminum (Al), silver (Ag), magnesium (Mg), calcium (Ca), sodium (Na), strontium (Sr), an alloy of an alkali metal or an alkaline earth metal and silver (Ag) [e.g., an alloy of magnesium (Mg) and silver (Ag) (Mg—Ag alloy)], an alloy of magnesium-calcium (Mg—Ca alloy), and an alloy of aluminum (Al) and lithium (Li) (Al—Li alloy). Among them, a Mg—Ag alloy is preferable, and as a volume ratio of magnesium to silver, Mg:Ag=5:1 to 30:1 can be exemplified. Alternatively, as a volume ratio of magnesium to calcium, Mg:Ca=2:1 to 10:1 can be exemplified. As the thickness of the second electrode, from 4 nm to 50 nm, preferably from 4 nm to 20 nm, more preferably from 6 nm to 12 nm can be exemplified. Alternatively, as a material included in the second electrode, at least one material selected from the group consisting of Ag—Nd—Cu, Ag—Cu, Au, and Al—Cu can be mentioned. Alternatively, the second electrode may have a layered structure of the above-described material layer and a so-called transparent electrode (e.g., having a thickness of from $3 \times 10^{-8}$ m to $1 \times 10^{-6}$ m) made of ITO or IZO, for example, in this order from the organic layer side. A bus electrode (auxiliary electrode) made of a low-resistance material such as aluminum, an aluminum alloy, silver, a silver alloy, copper, a copper alloy, gold, or a gold alloy may be provided to the second electrode in order to reduce the resistance of the overall second electrode. The average light transmittance of the second electrode is preferably from 50% to 90%, and preferably from 60% to 90%. On the other hand, when the second electrode is allowed to serve as an anode electrode, the second electrode is desirably made of a conductive material that transmits luminous light and has a large value of work function.

Examples of the method of forming the first electrode or the second electrode include: a vapor deposition method (including an electron beam vapor deposition method, a hot filament vapor deposition method, and a vacuum vapor deposition method), a sputter deposition method, a chemical vapor deposition method (CVD method), an MOCVD method, and a combination of an ion plating method and an etching method; various printing methods such as a screen printing method, an inkjet printing method, or a metal mask printing method; a plating method (an electroplating method or an electroless plating method); a lift-off process; a laser ablation method; and a sol-gel method. According to various printing methods or plating methods, the first electrode or the second electrode having a desired shape (pattern) can be directly formed. Note that, in a case where the organic layer is formed and then the second electrode is formed, the second electrode is preferably formed based on a deposition method with low energy deposition particles, such as a vacuum vapor deposition method in particular, or a deposition method such as an MOCVD process, from the viewpoint of preventing the organic layer from being damaged. When the organic layer is damaged, there is a concern for the generation of a non-light emitting pixel (or a non-light emitting subpixel) called a "unlit defect" due to the occurrence of a leakage current.

As described above, the organic layer includes a light-emitting layer made of an organic light emitting material. Specifically, the organic layer can include, for example: a layered structure of a hole transport layer, a light-emitting layer, and an electron transport layer; a layered structure of a hole transport layer and a light-emitting layer that is also serving as an electron transport layer; a layered structure of a hole injection layer, a hole transport layer, a light-emitting layer, an electron transport layer, and an electron injection layer; or the like. Examples of a method of forming the organic layer include: a physical vapor deposition method (PVD method) such as a vacuum vapor deposition method; a printing method such as a screen printing method or an inkjet printing method; a laser transfer method in which a layered structure of a laser absorption layer and an organic layer formed on a transfer substrate is irradiated with a laser beam to separate the organic layer on the laser absorption layer thereby transferring the organic layer, and various coating methods. When the organic layer is formed based on a vacuum vapor deposition method, for example, a so-called metal mask is used, and the organic layer can be obtained by depositing a material having passed through an opening provided in the metal mask.

In the light-emitting element or the display device of the present disclosure, a substratum, an insulating layer, an interlayer insulating layer, and an interlayer insulating material layer (to be described later) are formed, and examples of an insulating material included therein include: a $SiO_x$-based material (material included in a silicon-based oxide film) such as $SiO_2$, NSG (non-doped silicate glass), BPSG (boron-phosphorus silicate glass), PSG, BSG, AsSG, SbSG, PbSG, SOG (spin-on-glass), LTO (low temperature oxide, low temperature CVD-$SiO_2$), low-melting-point glass, or glass paste; SiN-based material including SiON-based material; SiOC; SiOF; and SiCN. Alternatively, examples thereof include inorganic insulating materials such as titanium oxide ($TiO_2$), tantalum oxide ($Ta_2O_5$), aluminum oxide ($Al_2O_3$), magnesium oxide (MgO), a chromium oxide ($CrO_x$), zirconium oxide ($ZrO_2$), niobium oxide ($Nb_2O_5$), tin oxide ($SnO_2$), and a vanadium oxide ($VO_x$). Alternatively, examples thereof include: various resins such as a polyimide-based resin, an epoxy-based resin, and an acryl-based resin; and low dielectric constant insulating materials (e.g., a material having a dielectric constant k ($=\varepsilon/\varepsilon_0$) of, for example, 3.5 or less, and specifically, for example, fluorocarbon, a cycloperfluorocarbon polymer, benzocyclobutene, a cyclic fluorine-based resin, polytetrafluoroethylene, amorphous tetrafluoroethylene, polyaryl ether, fluorinated aryl ether, fluorinated polyimide, amorphous carbon, parylene (polyparaxylylene), or fluorinated fullerene) such as SiOCH, an organic SOG, or a fluorine-based resin. Silk (a trademark of the Dow Chemical Co., and is a coating-type low-dielectric-constant interlayer insulating film material) and Flare (a trademark of Honeywell Electronic Materials Co., and is a polyallyl ether (PAE)-based material) can also be exemplified. These can be used alone or in an appropriate combination. The insulating layer, the interlayer insulating layer, and the substratum may have a single layer structure, or may have a layered structure. The insulating layer, the interlayer insulating layer, the interlayer insulating material layer, and the substratum can be formed based on known methods such as various CVD methods, various coating methods, various PVD methods including a sputter deposition method and a vacuum vapor deposition method, various printing methods such as a screen printing method, a plating method, an electrodeposition method, an immersion method, or a sol-gel method.

On the light-exiting outermost surface (specifically, the outer surface of the second substrate) of the display device, an ultraviolet absorbing layer, a contamination preventing layer, a hard coat layer, and an antistatic layer may be formed, or a protective member (e.g., cover glass) may be disposed.

Under or below the substratum, not limited to, but a light-emitting element driving unit (driving circuit) is provided. The light-emitting element driving unit includes, for example, a transistor (specifically, for example, a MOSFET) formed on a silicon semiconductor substrate included in the first substrate, or a thin film transistor (TFT) provided on various substrates included in the first substrate. The transistor and the TFT included in the light-emitting element driving unit can be configured to be connected to the first electrode via a contact hole (contact plug) formed in the substratum. The light-emitting element driving unit can be in a well-known circuit configuration. The second electrode can be configured to be connected to the light-emitting element driving unit via the contact hole (contact plug) formed in the substratum, for example, in the outer peripheral portion (specifically, the outer peripheral portion of a pixel array unit) of the display device.

The organic EL display device preferably has a resonator structure in order to even more improve the light outcoupling efficiency. Specifically, light emitted from the light-emitting layer is resonated between a first interface included in the first electrode/organic layer interface (alternatively, a first interface included in the light reflection layer/interlayer insulating material layer interface in a structure where the interlayer insulating material layer is provided under the first electrode and the light reflection layer is provided under the interlayer insulating material layer) and a second interface included in the second electrode/organic layer interface, and a part of the resonated light is outputted from the second electrode. When the optical distance from the maximum light emitting position of the light-emitting layer to the first interface is denoted by $OL_1$, the optical distance from the maximum light emitting position of the light-emitting layer to the second interface is denoted by $OL_2$, and $m_1$ and $m_2$ each are an integer, then the organic EL display device can be configured to satisfy the following Formulae (1-1) and (1-2).

$$0.7\{-\Phi_1/(2\pi)+m_1\} \le 2 \times OL_1/\lambda \le 0.2\{-\Phi_1/(2\pi)+m_1\} \quad (1\text{-}1)$$

$$0.7\{-\Phi_2/(2\pi)+m_2\} \le 2 \times OL_2/\lambda \le 1.2\{-\Phi_2/(2\pi)+m_2\} \quad (1\text{-}2)$$

where, $\lambda$: maximum peak wavelength in the spectrum of light produced in light-emitting layer (alternatively, a desired wavelength of light produced in the light-emitting layer)

$\Phi_1$: a phase shift amount (unit: radian) of light reflected at the first interface, with the proviso of $-2\pi < \Phi_1 \leq 0$ $\Phi_2$: a phase shift amount (unit: radian) of light reflected at the second interface, with the proviso of $-2\pi < \Phi_2 \leq 0$.

Here, the value of $m_1$ is a value of 0 or more, and the value of $m_2$ is a value of 0 or more independently of the value of $m_1$. However, a configuration in which $(m_1, m_2) = (0, 0)$, a configuration in which $(m_1, m_2) = (0, 1)$, a configuration in which $(m_1, m_2) = (1, 0)$, and a configuration in which $(m_1, m_2) = (1, 1)$ can be exemplified.

The distance $SD_1$ from the maximum light emission position of the light-emitting layer to the first interface refers to an actual distance (physical distance) from the maximum light emission position of the light-emitting layer to the first interface, and the distance $SD_2$ from the maximum light emission position of the light-emitting layer to the second interface refers to an actual distance (physical distance) from the maximum light emission position of the light-emitting layer to the second interface. The optical distance is also referred to an optical path length, and generally refers to n×SD where a light ray propagates by a distance SD through a medium having a refractive index n. The same applies to the following. Therefore, when the average refractive index is denoted by $n_{ave}$, there are following relationships:

$$OL_1 = SD_1 \times n_{ave} \text{ and}$$

$$OL_2 = SD_2 \times n_{ave}.$$

Here, the average refractive index $n_{ave}$ is the sum of the products of the refractive index and the thickness of each layer included in the organic layer (alternatively, the organic layer, the first electrode, and the interlayer insulating material layer) divided by the thickness of the organic layer (alternatively, the organic layer, the first electrode, and the interlayer insulating material layer).

In order to design the light-emitting element, the desired wavelengths $\lambda$ (specifically, for example, a red wavelength, a green wavelength, and a blue wavelength) in light produced in the light-emitting layer need to be determined and various parameters such as $OL_1$ and $OL_2$ in the light-emitting element need to be obtained based on Formulae (1-1) and (1-2).

The first electrode or the light reflection layer and the second electrode absorb a part of the incident light and reflect the rest thereof. Therefore, the light to be reflected undergoes a phase shift. The values of the real part and the imaginary part of the complex refractive index of the material included in the first electrode or the light reflection layer and the second electrode are measured with use of an ellipsometer, for example, and a calculation based on these values can determine the phase shift amounts $\Phi_1$ and $\Phi_2$ (see, e.g., "Principles of Optic", Max Born and Emil Wolf, 1974 (Pergamon Press)). The refractive index of the organic layer, of the interlayer insulating material layer, or the like; the refractive index of the first electrode; or the refractive index of the first electrode in a case where the first electrode absorbs a part of incident light and reflects the rest thereof can also be determined by the measurements with use of an ellipsometer.

Examples of a material included in the light reflection layer include: aluminum, an aluminum alloy (e.g., Al—Nd or Al—Cu), an Al/Ti layered structure, an Al—Cu/Ti layered structure, chromium (Cr), silver (Ag), a silver alloy (e.g., Ag—Cu, Ag—Pd—Cu, Ag—Sm—Cu), copper, a copper alloy, gold, and a gold alloy. The light reflection layer can be formed by an electron beam vapor deposition method, a hot filament vapor deposition method, a vapor deposition method including a vacuum vapor deposition method, a sputter deposition method, a CVD method, an ion plating method; a plating method (electroplating method or electroless plating method); a lift-off process; a laser ablation method; a sol-gel method, or the like. Depending on a material included in the light reflection layer, an underlying layer made of TiN, for example, is preferably formed in advance in order to control the crystalline state of the light reflection layer to be formed.

As such, in an organic EL display device having a resonator structure, in fact, in a light-emitting part included in a red light-emitting element, white light emitted in the organic layer is resonated and then reddish light (light having a peak in the red region of the light spectrum) is outputted from the second electrode. In the same way, in the light-emitting part included in the green light-emitting element, white light emitted in the organic layer is resonated and then greenish light (light having a peak in a green region of the light spectrum) is outputted from the second electrode. Furthermore, in the light-emitting part included in the blue light-emitting element, white light emitted in the organic layer is resonated, and bluish light (light having a peak in a blue region of the light spectrum) is outputted from the second electrode. That is, in order to design each light-emitting element, a desired wavelength $\lambda$ (specifically, a red wavelength, a green wavelength, and a blue wavelength) of light produced in the light-emitting layer need to be determined and various parameters such as $OL_1$ and $OL_2$ in each of the red light-emitting element, the green light-emitting element, and the blue light-emitting element need to be obtained based on Formulae (1-1) and (1-2). For example, in the paragraph number[0041] of JP 2012-216495 A, there is disclosed an organic EL element having a resonator structure in which an organic layer is used as a resonator unit, and is described that a film thickness of the organic layer is preferably 80 nm or more and 500 nm or less, and more preferably 150 nm or more and 350 nm or less, so as an appropriate adjustment of the distance from a light emitting point (light emitting surface) to a reflecting surface to be enabled. Typically, the values of $(SD_1 + SD_2 = SD_{12})$ vary among the red light-emitting element, the green light-emitting diode, and the blue light-emitting diode.

In the organic EL display device, it is desirable that the thickness of the hole transport layer (hole supply layer) is approximately equal to the thickness of the electron transport layer (electron supply layer). Alternatively, the electron transport layer (electron supply layer) may be thicker than the hole transport layer (hole supply layer), as a result of this, an electron supply necessary for high efficiency at a low drive voltage and sufficient to the light-emitting layer can be available. That is, a hole transport layer is disposed between the light-emitting layer and the first electrode equivalent to an anode electrode, and is formed to have a film thickness smaller than that of the electron transport layer, so that the supply of holes can be increased. As a result of this, there is neither excess nor deficiency of holes and electrons, and a carrier balance with sufficiently large amount of carrier supply can be achieved, so that an elevated luminous efficacy can be available. In addition, as there is neither excess nor deficiency of holes and electrons, the carrier balance is less likely to be lost, the deterioration of drive is suppressed, and a light emission lifetime can be extended.

Furthermore, in the light-emitting element and the like of the present disclosure including the preferable configurations and compositions described above, a light absorption layer (black matrix layer) can be configured to be formed between wavelength selectors, or above a position between wavelength selectors, or above a position between first optical path control units, and as a result of this, the occurrence of color mixture between adjacent light-emitting elements can be reliably suppressed. The light absorption layer (black matrix layer) is made of, for example, a black resin film (specifically, for example, made of a black polyimide-based resin) mixed with a black colorant and having an optical density of 1 or more; or the light absorbing layer (black matrix layer) includes a thin film filter using thin-film interference. The thin film filter is formed by layering two or more thin films made of a metal, a metal nitride, or a metal oxide, for example, and attenuates light using thin-film interference. Specific examples of the thin film filter include a thin film filter in which Cr and chromium(III) oxide ($Cr_2O_3$) are alternately layered one on another. The size of the light absorption layer (black matrix layer) can be appropriately changed in accordance with the light emitted by the light-emitting element.

Furthermore, a light shielding unit may be provided between light-emitting elements. As specific examples of the light shielding material included in the light shielding unit, there can be mentioned materials capable of shielding light, such as titanium (Ti), chromium (Cr), tungsten (W), tantalum (Ta), aluminum (Al), and $MoSi_2$. The light shielding unit can be formed by: a vapor deposition method including an electron beam vapor deposition method, a hot filament vapor deposition method, and a vacuum vapor deposition method; a sputter deposition method; a CVD method; an ion plating method, or the like.

The display device of the present disclosure can be used as, for example, a monitor included in personal computers, a television receiver, a mobile phone, a personal digital assistant (PDA), a monitor built in game devices, or a display built in projectors. Alternatively, the display device of the present disclosure can be applied to an electronic viewfinder (EVF), a head-mounted display (HMD), eyewear, AR glasses, and EVR, and can be applied to a display for virtual reality (VR), for mixed reality (MR), or for augmented reality (AR). Alternatively, the display device of the present disclosure can be included in: an electronic book; an electronic paper such as an electronic newspaper; a bulletin board such as a signboard, a poster, or a blackboard; a rewritable paper as a substitute for printer paper; a display unit in home appliances; a card display unit in loyalty cards or the like; an electronic advertisement; or an image display in electronic POP devices. The display device of the present disclosure can be used as a light emitting device, and can be included in various lighting devices including a backlight device used in liquid crystal displays and a planar light source device.

The head-mounted display includes, for example,
(a) a frame to be worn on the head of an observer; and
(b) an image display device attached to the frame, in which
the image display device includes:
(A) a display device of the present disclosure; and
(B) an optical device to which light outputted from the display device of the present disclosure enters and outputted, in which the optical device is formed of:
(B-1) a light guide plate through which the incident light from the display device of the present disclosure propagates by total reflection and then is outputted toward the observer,
(B-2) a first deflection unit (made of a volume hologram diffraction grating film, for example) that deflects the light incident on the light guide plate such that the light incident on the light guide plate is totally reflected inside the light guide plate; and
(B-3) a second deflection unit (made of a volume hologram diffraction grating film, for example) that allows multiple times of deflections of the light propagated by total reflection through the inside of the light guide plate so that the light propagated by total reflection through the inside of the light guide plate is outputted from the light guide plate.

Example 1

Figure 2A:
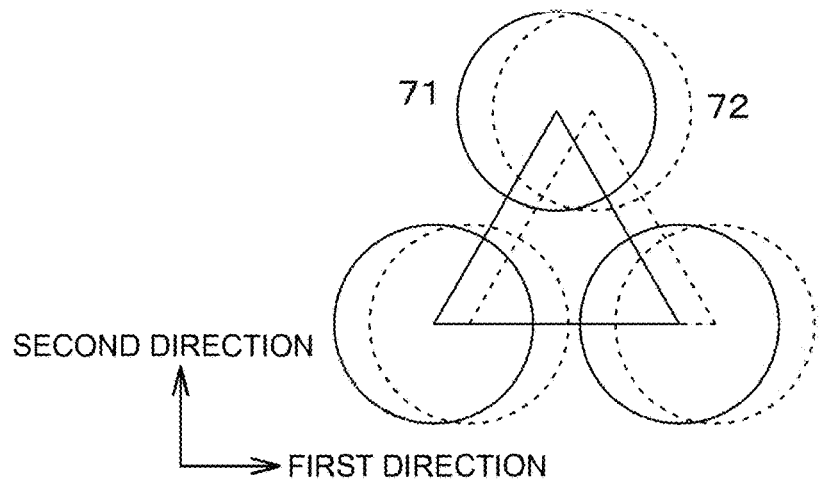
FIG. 2A is a diagram schematically illustrating an arrangement relationship between a first optical path control unit and a second optical path control unit.
Figure 2B:
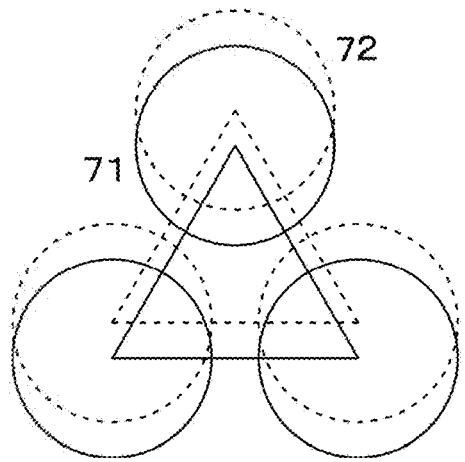
FIG. 2B is a diagram schematically illustrating an arrangement relationship between the first optical path control unit and the second optical path control unit.
Figure 2C:
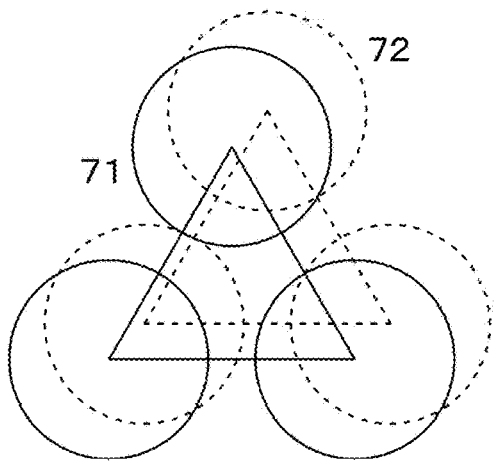
FIG. 2C is a diagram schematically illustrating an arrangement relationship between the first optical path control unit and the second optical path control unit.

Example 1 relates to a light-emitting element of the present disclosure and a display device of the present disclosure. FIG. 1 illustrates a schematic partial cross-sectional view of a light-emitting element and a display device of Example 1, and FIGS. 2A, 2B, and 2C schematically illustrate an arrangement relationship between a first optical path control unit and a second optical path control unit. In Example 1 or Examples 2 to 4 described later, the display device includes an organic electroluminescence display device (organic EL display device), and is an active matrix display device. The light-emitting element includes an electroluminescent element (organic EL element), and a light-emitting layer includes an organic electroluminescent layer. The display device of Example 1 or Examples 2 to 4 described later is a top emission type (top surface-emission type) display device (top surface-emission type display device) that outputs light from the second substrate. Furthermore, in the light-emitting element and the display device of Example 1, a color filter layer as a wavelength selector is provided near the first substrate side.

The light-emitting element 10 of Example 1 includes:
a light-emitting part 30 including a light-emitting region;
a first optical path control unit (a first optical path controller, specifically, a first lens member) 71 to which light emitted from the light-emitting region enters and which has positive optical power;
a second optical path control unit (a second optical path controller, specifically, a second lens member) 72 to which the light exited from the first optical path control unit 71 enters and which has positive optical power; and
a bonding member 35 interposed between the first optical path control unit 71 and the second optical path control unit 72, in which
the optical axis of the first optical path control unit 71 is displaced from the optical axis of the second optical path control unit 72.

The display device according to Example 1 includes:
a first substrate 41 and a second substrate 42; and
a plurality of light-emitting element units, each including the first light-emitting element $10_1$, the second light-emitting element $10_2$, and the third light-emitting element $10_3$, provided on the first substrate 41, in which each light-emitting element 10 includes:

a light-emitting part 30 provided above the first substrate 41 and having a light-emitting region;

a first optical path control unit (specifically, a first lens member) 71 to which light emitted from the light-emitting region enters and which has positive optical power;

a second optical path control unit (specifically, a second lens member) 72 to which the light exited from the first optical path control unit 71 enters and which has positive optical power; and a bonding member 35 interposed between the first optical path control unit 71 and the second optical path control unit 72, in which the optical axis of the first optical path control unit 71 is displaced from the optical axis of the second optical path control unit 72.

Here, in the display device of Example 1, the optical axis of the first optical path control unit 71 is displaced from the optical axis of the second optical path control unit 72 in all the light-emitting elements 10. The direction of displacement between the optical axis of the first optical path control unit 71 and the optical axis of the second optical path control unit 72 is the same among the first light-emitting element 10₁, the second light-emitting element 10₂, and the third light-emitting element 10₃ in each light-emitting element unit. In the first light-emitting element 10₁, the second light-emitting element 10₂, and the third light-emitting element 10₃ in each light-emitting element unit, the amount of the displacement between the optical axis of the first optical path control unit 71 and the optical axis of the second optical path control unit 72 is the same among all the light-emitting element units, and the amount of the displacement between the optical axis of the first optical path control unit 71 and the optical axis of the second optical path control unit 72 is the same among all the light-emitting element units independent of which region is taken up by the light-emitting element unit in the display panel. The optical axis of the first optical path control unit 71 coincides with the normal line $LN_1$ passing through the center of the first optical path control unit, and the optical axis of the second optical path control unit 72 coincides with the normal line $LN_2$ passing through the center of the second optical path control unit.

The optical axis of the first optical path control unit 71 passes through the center of the light-emitting region. In addition, a bonding member (sealing resin layer) 35 is present between the top of the first optical path control unit 71 and the top of the second optical path control unit 72. That is, the first optical path control unit 71 and the second optical path control unit 72 are spaced apart from each other.

Furthermore, in the light-emitting element of Example 1 or Examples 2 to 4 described later, when the refractive index of the material included in the first optical path control unit 71 is denoted by $n_1$, the refractive index of the material included in the second optical path control unit 72 is denoted by $n_2$, and the refractive index of the material included in the bonding member 35 is denoted by $n_0$, $$n_1 > n_0$$

and $$n_2 > n_0$$

are satisfied. Specifically, the first optical path control unit 71 and the second optical path control unit 72 are made of an acrylic-based adhesive having a refractive index $n_1 = n_2 = 1.55$. The bonding member 35 is made of an acrylic-based adhesive having a refractive index $n_0 = 1.35$. Note that the acrylic-based adhesive included in the first optical path control unit 71 and in the second optical path control unit 72 is different from the acrylic-based adhesive included in the bonding member 35. The first optical path control unit 71 and the second optical path control unit 72 are laminated together by a bonding member 35.

Furthermore, the light-emitting element 10 includes a wavelength selector (specifically, a color filter layer) CF between the light-emitting part 30 and the first optical path control unit 71. That is, the light emitted from the light-emitting part 30 passes through the wavelength selector CF, the first optical path control unit 71, and the second optical path control unit 72 in this order. The center of the wavelength selector (color filter layer) CF passes through the center of the light-emitting region. Specifically, the wavelength selector CF includes color filter layers $CF_R$, $CF_G$, and $CF_B$, and is provided near the first substrate side. As such, the color filter layer CF has an on-chip color filter layer structure (OCCF structure). As a result, the distance between an organic layer 33 and the wavelength selector CF can be reduced, thereby enabling to suppress the occurrence of color mixture due to the entering of the light emitted from the organic layer 33 into an adjacent wavelength selector CF for another color.

The first optical path control unit 71 is made of a first lens member such as a plano-convex lens having a convex shape protruding in a direction away from the light-emitting part 30, and the second optical path control unit 72 is made of a second lens member such as a plano-convex lens having a convex shape protruding in a direction toward the light-emitting part 30. That is, the light exit surface 71b of the first optical path control unit (first lens member) 71 has a convex shape, the light incident surface 71a thereof is flat, for example; the light incident surface 72a of the second optical path control unit (second lens member) 72 has a convex shape, and the light exit surface 72b thereof is flat, for example. The outer shapes of the first optical path control unit 71 and of the second optical path control unit 72 each are circular, but are not limited to such shapes.

In the display device of Example 1 or Examples 2 to 4 described later, one light-emitting element unit (pixel) includes three light-emitting elements (three subpixels): a first light-emitting element (red light-emitting element) 10₁; a second light-emitting element (green light-emitting element) 10₂; and a third light-emitting element (blue light-emitting element) 10₃. The organic layer 33 included in the first light-emitting element 10₁, the organic layer 33 included in the second light-emitting element 10₂, and the organic layer 33 included in the third light-emitting element 10₃ emit white light overall. That is, the first light-emitting element 10₁ that outputs red light includes a combination of the organic layer 33 that emits white light and a red color filter layer $CF_R$. The second light-emitting element 10₂ that outputs green light includes a combination of the organic layer 33 that emits white light and a green color filter layer $CF_G$. The third light-emitting element 10₃ that outputs blue light includes a combination of the organic layer 33 that emits white light and a blue color filter layer $CF_B$. In some cases, the light-emitting element unit (one pixel) may include a light-emitting element that outputs white color (or a fourth color) (alternatively a light-emitting element that outputs complementary color light) 10₄, in addition to the first light-emitting element (red light-emitting element) 10₁, the second light-emitting element (green light-emitting element) 10₂, and the third light-emitting element (blue light-emitting element) $10_3$. The first light-emitting element $10_1$, the second light-emitting element $10_2$, and the third light-emitting element $10_3$ have substantially the same configuration and structure, except for the configuration of the color filter layer, and in some cases, except for the arrangement position of the light-emitting layer in the thickness direction of the organic layer. The number of pixels is, for example, 1920×1080, one light-emitting element (display element) 10 includes one subpixel, and the number of light-emitting elements (specifically, organic EL elements) 10 is three times as much as the number of pixels.

In the display device of Example 1 or Examples 2 to 4 described later, the light-emitting element specifically includes:
a first electrode 31;
an organic layer 33 formed on the first electrode 31;
a second electrode 32 formed on the organic layer 33;
a protective layer (planarized layer) 34 formed on the second electrode 32; and
a color filter layer CF ($CF_R$, $CF_G$, and $CF_B$) formed on the protective layer 34. The light-emitting element 10 is formed near the first substrate side. As such, the color filter layer CF is disposed above the second electrode 32, and the second substrate 42 is disposed above the color filter layer CF. Note that the following description can be appropriately applied to Examples 2 to 4 described later in general, except for the arrangement of the color filter layer CF.

Thus, light from the organic layer 33 is outputted to the outside via the second electrode 32, the protective layer 34, the color filter layer CF, the first optical path control unit 71, the bonding member 35, the second optical path control unit 72, an underlying layer 36, and the second substrate 42.

A light-emitting element driving unit (driving circuit) is provided below the substratum 26 made of an insulating material formed based on CVD method. The light-emitting element driving unit can have a well-known circuit configuration. The light-emitting element driving unit includes a transistor (specifically, MOSFET) formed on a silicon semiconductor substrate equivalent to the first substrate 41. The transistor 20 made of a MOSFET includes: a gate insulating layer 22 formed on the first substrate 41; a gate electrode 21 formed on the gate insulating layer 22; source and drain regions 24 formed in the first substrate 41; a channel formation region 23 formed between the source and drain regions 24; and an element isolation region 25 surrounding the channel formation region 23 and the source and drain regions 24. The transistor 20 and the first electrode 31 are electrically connected via a contact plug 27 provided in the substratum 26. Note that, in the drawings, one transistor 20 is illustrated for one light-emitting element driving unit. As the insulating material included in the substratum 26, $SiO_2$, SiN, and SiON can be exemplified.

The light-emitting part 30 is provided on the substratum 26. Specifically, the first electrode 31 of each light-emitting element 10 is provided on the substratum 26. An insulating layer 28 having an opening 28', at the bottom of which the first electrode 31 is exposed, is formed on the substratum 26, and the organic layer 33 is at least formed on the first electrode 31 exposed at the bottom of the opening 28'. Specifically, the organic layer 33 is formed extending from on top of the first electrode 31 exposed at the bottom of the opening 28' to on top of the insulating layer 28, and the insulating layer 28 is formed extending from the first electrode 31 to top of the substratum 26. The portion in the organic layer 33 that actually emits light is surrounded by the insulating layer 28. That is, the light-emitting region includes: the first electrode 31; and a region of the organic layer 33 formed on the first electrode 31, and the light-emitting region is provided on the substratum 26. In other words, the region of the organic layer 33 surrounded by the insulating layer 28 is equivalent to the light-emitting region. The insulating layer 28 and the second electrode 32 are overlaid with a protective layer 34 made of SiN. A wavelength selector CF (color filter layers $CF_R$, $CF_G$, and $CF_B$) made by a well-known method and of a well-known material is formed on the protective layer 34, and a first optical path control unit 71 is formed on the protective layer 34.

The first electrode 31 serves as an anode electrode, and the second electrode 32 serves as a cathode electrode. The first electrode 31 is made of a light reflecting material layer, specifically, for example, is made of an Al—Nd alloy layer, an Al—Cu alloy layer, or a layered structure of an Al—Ti alloy layer and an ITO layer; and the second electrode 32 is made of a transparent conductive material such as ITO. The first electrode 31 is formed on the substratum 26 based on a combination of a vacuum vapor deposition method and an etching method. The second electrode 32 is formed by a deposition method with low energy deposition particles, such as a vacuum vapor deposition method, and is not patterned. The organic layer 33 is also not patterned. That is, the organic layer 33 is provided common to a plurality of light-emitting elements 10. However, the organic layer 33 is not limited thereto. The first substrate 41 is made of a silicon semiconductor substrate, and the second substrate 42 is made of a glass substrate.

The second electrode 32 is a common electrode among the plurality of light-emitting elements 10. That is, the second electrode 32 is a so-called solid electrode. The second electrode 32 is connected to the light-emitting element driving unit via a not illustrated contact hole (contact plug) formed in the substratum 26 at the outer peripheral portion (specifically, the outer peripheral portion of the pixel array unit) of the display device. Alternatively, an auxiliary electrode connected to the second electrode 32 may be provided below the second electrode 32 at the outer peripheral portion of the display device, and the auxiliary electrode may be connected to the light-emitting element driving unit.

In Example 1, the organic layer 33 has a layered structure including a hole injection layer (HIL), a hole transport layer (HTL), a light-emitting layer, an electron transport layer (ETL), and an electron injection layer (EIL). The light-emitting layer includes at least two light-emitting layers that emit different colors, and the light emitted from the organic layer 33 is white. Specifically, the organic layer has a three-layered structure including a red light-emitting layer that emits red light, a green light-emitting layer that emits green light, and a blue light-emitting layer that emits blue light. The organic layer may have a two-layered structure including a blue light-emitting layer that emits blue light and a yellow light-emitting layer that emits yellow light (white light is emitted overall), or a two-layered structure including a blue light-emitting layer that emits blue light and an orange light-emitting layer that emits orange light (white light is emitted overall). As described above, the first light-emitting element $10_1$ to display red is provided with a red color filter layer $CF_R$, the second light-emitting element $10_2$ to display green is provided with a green color filter layer $CF_G$, and the third light-emitting element $10_3$ to display blue is provided with a blue color filter layer $CF_B$.

The hole injection layer is a layer that enhances hole injection efficiency and serves as a buffer layer that prevents leakage, and the thickness of the hole injection layer is approximately from 2 nm to 10 nm. The hole injection layer is made of, for example, a hexaazatriphenylene derivative represented by the following Formula (A) or Formula (B). Note that, when the end surface of the hole injection layer comes into a condition of being contact with the second electrode, this condition becomes a main cause of the occurrence of luminance variation among pixels, which leads to the deterioration in display image quality.

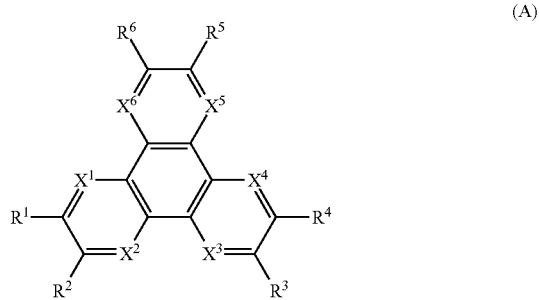

(A)

Here, $R^1$ to $R^6$ are each independently a substituent selected from hydrogen, a halogen, hydroxy group, an amino group, an aryl amino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, nitrile group, cyano group, nitro group, or a silyl group, and adjacent $R^m$ (m=1 to 6) may be bonded to each other via a cyclic structure. $X^1$ to $X^6$ each independently represent a carbon atom or a nitrogen atom.

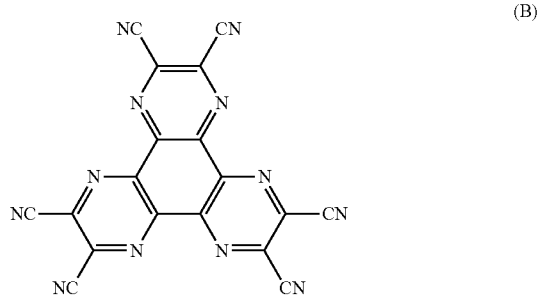 [SMILES: N#Cc1nc2c3nc(C#N)c(C#N)nc3c3nc(C#N)c(C#N)nc3c2nc1C#N]

(B)

The hole transport layer is a layer that enhances hole transport efficiency to the light-emitting layer. In the light-emitting layer, when an electric field is applied thereto, the recombination of electrons and holes takes place, and light is produced. The electron transport layer is a layer that enhances electron transport efficiency to the light-emitting layer, and the electron injection layer is a layer that enhances electron injection efficiency to the light-emitting layer.

The hole transport layer is made of, for example, 4,4',4''-tris(3-methylphenylphenylamino)triphenylamine (m-MTDATA) or α-naphthylphenyldiamine (αNPD) having a thickness of circa 40 nm.

The light-emitting layer is one that produces white light by color mixing, and is formed by layering of a red light-emitting layer, a green light-emitting layer, and a blue light-emitting layer, for example, as described above.

In the red light-emitting layer, when an electric field is applied thereto, some of holes injected from the first electrode 31 and some of electrons injected from the second electrode 32 are recombined to produce red light. Such red light-emitting layer contains at least one type of material selected from, for example, a red light emitting material, a hole transport material, an electron transport material, and an ambipolar charge transport material. The red light-emitting material may be a fluorescent material or a phosphorescent material. The red light-emitting layer having a thickness of circa 5 nm is made of a mixture of 30% by mass of 2,6-bis[(4'-methoxydiphenylamino)styryl]-1,5-dicyanonaphthalene (BSN) and 4,4-bis(2,2-diphenylvinyl)biphenyl (DPVBi), for example.

In the green light-emitting layer, when an electric field is applied thereto, some of holes injected from the first electrode 31 and some of electrons injected from the second electrode 32 are recombined to produce green light. Such green light-emitting layer contains at least one type of material selected from, for example, a green light emitting material, a hole transport material, an electron transport material, and an ambipolar charge transport material. The green light-emitting material may be a fluorescent material or a phosphorescent material. The green light-emitting layer having a thickness of circa 10 nm is made of, for example, a mixture of DPVBi and 5% by mass of coumarin 6.

In the blue light-emitting layer, when an electric field is applied thereto, some of holes injected from the first electrode 31 and some of electrons injected from the second electrode 32 are recombined to produce blue light. Such blue light-emitting layer contains at least one type of material selected from, for example, a blue light emitting material, a hole transport material, an electron transport material, and an ambipolar charge transport material. The blue light emitting material may be a fluorescent material or a phosphorescent material. The blue light-emitting layer having a thickness of circa 30 nm is made of, for example, a mixture of DPVBi and 2.5% by mass of 4,4'-bis[2-{4-(N,N-diphenylamino)phenyl}vinyl]biphenyl(DPAVBi).

The electron transport layer having a thickness of circa 20 nm is made of, for example, 8-hydroxyquinoline aluminum (Alq3). The electron injection layer having a thickness of circa 0.3 nm is made of, for example, LiF or $Li_2O$.

However, the material included in each layer set forth above is merely an example, and the material included in each layer is not limited to the materials set forth. Alternatively, for example, the light-emitting layer may include a blue light-emitting layer and a yellow light-emitting layer, or may include a blue light-emitting layer and an orange light-emitting layer.

Figure 16A:
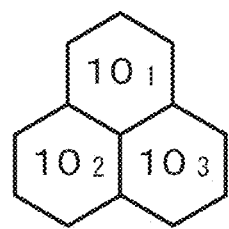
FIG. 16A is a diagram schematically illustrating an arrangement of light-emitting elements in the display device of Example 1.
Figure 16B:
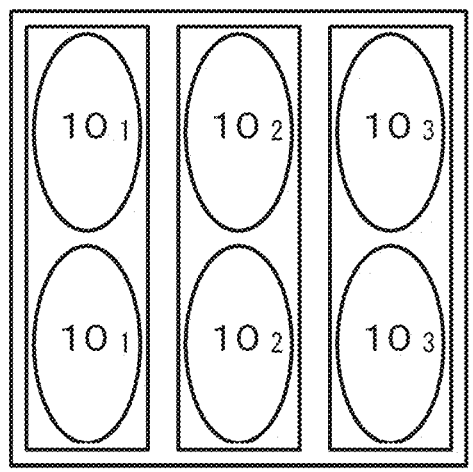
FIG. 16B is a diagram schematically illustrating an arrangement of light-emitting elements in the display device of Example 1.
Figure 16C:
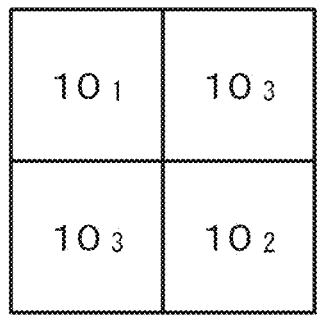
FIG. 16C is a diagram schematically illustrating an arrangement of light-emitting elements in the display device of Example 1.
Figure 16D:
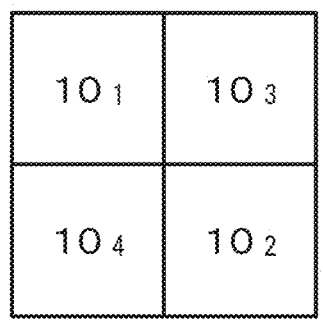
FIG. 16D is a diagram schematically illustrating an arrangement of light-emitting elements in the display device of Example 1.
Figure 16E:
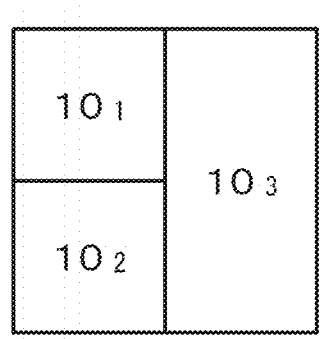
FIG. 16E is a diagram schematically illustrating an arrangement of light-emitting elements in the display device of Example 1.

In the display device of Example 1, examples of the subpixel arrangement include: a delta arrangement illustrated in FIG. 16A; a stripe arrangement as illustrated in FIG. 16B; a diagonal arrangement illustrated in FIG. 16C; and a rectangle arrangement. In some cases, as illustrated in FIG. 16D, one pixel may include a first light-emitting element $10_1$, a second light-emitting element $10_2$, a third light-emitting element $10_3$, and a fourth light-emitting element $10_4$ that emits white light (alternatively, a fourth light-emitting element that emits complementary color light). In the fourth light-emitting element $10_4$ that emits white light, a transparent filter layer needs to be provided, instead of providing a color filter layer. Alternatively, a square array as illustrated in FIG. 16E can also be chosen. Note that, in the example illustrated in FIG. 16E, (the area of the first light-emitting element $10_1$):(the area of the second light-emitting element $10_2$):(the area of the third light-emitting element $10_3$)=1:1:2, but the ratio may be 1:1:1.

In the display device of Example 1 or Examples 2 to 4 described later, the arrangement of the first light-emitting element $10_1$, the second light-emitting element $10_2$, and the third light-emitting element $10_3$ is specifically a delta arrangement, but is not limited thereto. Note that, in order to simplify the drawings, the schematic partial cross-sectional views of the display device illustrated in FIG. 1 and later-described FIGS. 9, 10, 11, 12, 13, 14, 15, 23, and 28 are different from the schematic partial cross-sectional views of the display device whose light-emitting elements 10 are arranged in a delta array.

In Example 1 or Examples 2 to 4 described later, the light-emitting element 10 may have a resonator structure in which the organic layer 33 is used as a resonator unit. In order to appropriately adjust the distance from the light emitting surface to the reflecting surface (specifically, for example, the distance from the light emitting surface to the first electrode 31 and the second electrode 32), the thickness of the organic layer 33 is preferably $8\times10^{-8}$ m or more and $5\times10^{-7}$ m or less, and more preferably $1.5\times10^{-7}$ m or more and $3.5\times10^{-7}$ m or less. In fact, in an organic EL display device having a resonator structure, the first light-emitting element (red light-emitting element) $10_1$ causes a resonance of light emitted in the light-emitting layer, and outputs reddish light (light having a peak in a red region of the light spectrum) from the second electrode 32. Moreover, the second light-emitting element (green light-emitting element) $10_2$ causes a resonance of light emitted in the light-emitting layer, and outputs greenish light (light having a peak in the green region of the light spectrum) from the second electrode 32. Furthermore, the third light-emitting element (blue light-emitting element) $10_3$ causes a resonance of light emitted from the light-emitting layer, and outputs bluish light (light having a peak in the blue region of the light spectrum) from the second electrode 32.

Hereinafter, an outline of a method of manufacturing the light-emitting element of Example 1 illustrated in FIG. 1 will be described.

[Step-100]

First, a light-emitting element driving unit is formed on a silicon semiconductor substrate (first substrate 41) based on a known MOSFET manufacturing process.

[Step-110]

Next, a substratum 26 is formed on the entire surface based on a CVD method.

[Step-120]

Next, a connection hole is formed in a portion of the substratum 26 located above one source/drain region of the transistor 20 based on a photolithography technique and an etching technique. Thereafter, a metal layer is formed on the substratum 26 including the connection hole based on, for example, a sputter deposition method, and then the metal layer is patterned based on a photolithography technique and an etching technique, whereby a first electrode 31 can be formed on a part of the substratum 26. The first electrode 31 is isolated for each light-emitting element. Along with this, a contact hole (contact plug) 27 that electrically connects the first electrode 31 and the transistor 20 can be formed in the connection hole.

[Step-130]

Thereafter, an insulating layer 28 is formed on the entire surface based on a CVD method, for example, and then an opening 28' is formed in a part of the insulating layer 28 on the first electrode 31 based on a photolithography technique and an etching technique. The first electrode 31 is exposed at the bottom of the opening 28'.

[Step-140]

Next, an organic layer 33 is formed on the first electrode 31 and on the insulating layer 28 by, for example, a PVD method such as a vacuum vapor deposition method or a sputter deposition method, a coating method such as a spin coating method or a die coating method, or the like. Next, a second electrode 32 is formed on the entire surface based on, for example, a vacuum vapor deposition method or the like. In this way, the organic layer 33 and the second electrode 32 can be formed on the first electrode 31. In some cases, the organic layer 33 may be patterned into a desired shape.

[Step-150]

Thereafter, a protective layer 34 is formed on the entire surface by, for example, a CVD method, a PVD method, or a coating method, and the top surface of the protective layer 34 is planarized. Since the protective layer 34 can be formed based on a coating method, the manufacturing process is less restrictive, the range of material choice is enlarged, and a high refractive index material can be used. Thereafter, a wavelength selector CF (color filter layers $CF_R$, $CF_G$, and $CF_B$) is formed on the protective layer 34 based on a well-known method.

[Step-160]

Next, a first lens formation layer for forming the first optical path control unit 71 is formed on the color filter layer CF ($CF_R$, $CF_G$, and $CF_B$), and a first resist material layer is formed thereon. Thereafter, the first resist material layer is patterned and further is heat treated thereby transforming the first resist material layer into a lens shape. Next, the first resist material layer and the first lens formation layer are etched back whereby the shape formed on the first resist material layer is transferred to the first lens formation layer. In this manner, the first optical path control unit 71 (first lens member) can be obtained.

[Step-170]

On the other hand, an underlying layer 36 is formed on a second substrate 42, and a second lens formation layer configured to form a second optical path control unit 72 is formed on the underlying layer 36, and a second resist material layer is formed thereon. Thereafter, the second resist material layer is patterned and further is heat treated thereby transforming the second resist material layer into a lens shape. Next, the second resist material layer and the second lens formation layer are etched back whereby the shape formed on the second resist material layer is transferred to the second lens formation layer. In this manner, the second optical path control unit (second lens member) 72 can be obtained.

[Step-180]

Subsequently, the first substrate 41 and the second substrate 42, specifically, the first optical path control unit 71 and the second optical path control unit 72 are laminated to each other via a bonding member (sealing resin layer) 35. In this way, the display device (organic EL display device) illustrated in FIG. 1 and FIGS. 2A, 2B, and 2C can be obtained. Note that, in FIGS. 2A, 2B, and 2C, a solid circle indicates the first optical path control unit 71, and a dotted circle indicates the second optical path control unit 72. In the example illustrated in FIG. 2A, the optical axis of the second optical path control unit is displaced in the first direction with respect to the optical axis of the first optical path control unit. In the example illustrated in FIG. 2B, the optical axis of the second optical path control unit is displaced in the second direction with respect to the optical axis of the first optical path control unit. Furthermore, in the example illustrated in FIG. 2C, the optical axis of the second optical path control unit is displaced in the first direction as well as in the second direction with respect to the optical axis of the first optical path control unit. In FIGS. 2A, 2B, and 2C, an equilateral triangle connecting the centers of the light-emitting regions is illustrated.

The arrangement of the light-emitting elements (subpixels) was chosen to be a delta arrangement, the center-to-center distance between the light-emitting elements was 8.0 µm, the planar shape of the light-emitting region was a circle having a diameter of 7.6 µm, the heights of the first optical path control unit 71 and the second optical path control unit 72 each were 1.9 µm, the distance between the virtual horizontal plane including the top of the first optical path control unit 71 and the virtual horizontal plane including the top of the second optical path control unit 72 was 0.3 µm, the distance from the light-emitting region to the top of the first optical path control unit 71 was 5.4 µm, and the distance from the light-emitting region to the position for determining the front luminance was 10 µm. As such, simulations for determining the front luminance were performed based on wave motion analysis (FDTD) for the cases of $D_{01}=0$ µm and $D_{12}=0$ µm, 0.5 µm, and 1.0 µm.

Note that, $D_{01}$ and $D_{12}$, and $d_0$ and $D_1$ to be described later are defined as follows.

$D_{01}$: Distance (offset amount) between the normal line $LN_0$ passing through the center of the light-emitting region and the normal line $LN_1$ passing through the center of the first optical path control unit $D_{12}$: Distance (offset amount) between the normal line $LN_1$ passing through the center of first optical path control unit and the normal line $LN_2$ passing through the center of the second optical path control unit $d_0$: Distance (offset amount) between the normal line $LN_0$ passing through the center of the light-emitting region and the normal line $LN_3$ passing through the center of the wavelength selector $D_1$: Distance from the reference point (reference region) P to the normal line $LN_0$ passing through the center of the light-emitting region Here, in the illustrated examples, $d_0=0$ µm in all the light-emitting elements 10.

Figure 3:
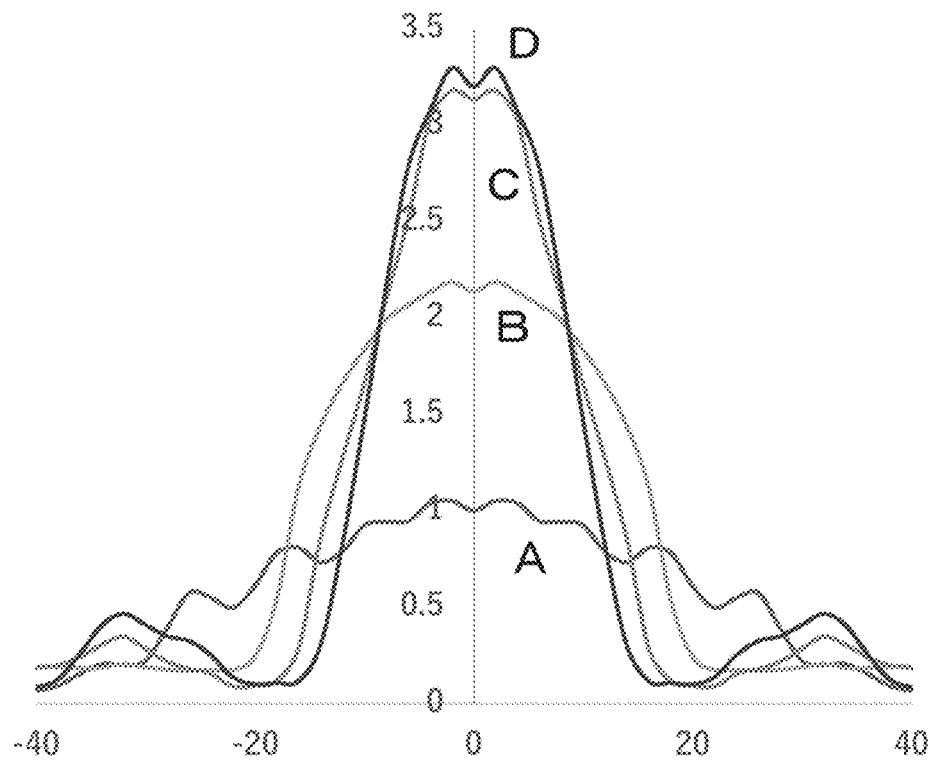
FIG. 3 is a diagram illustrating simulation results determining front luminance with $D_{01}=0$ μm, $D_{12}=0$ μm, 0.5 μm, and 1.0 μm in the first direction.
Figure 4:
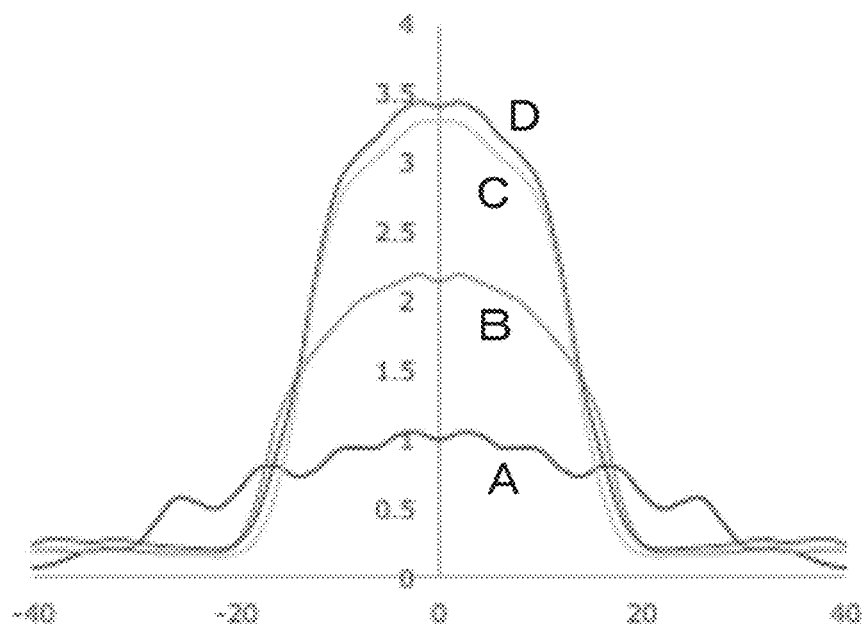
FIG. 4 is a diagram illustrating simulation results determining front luminance with $D_{01}=0$ μm, $D_{12}=0$ μm, 0.5 μm, and 1.0 μm in the second direction.
Figure 5:
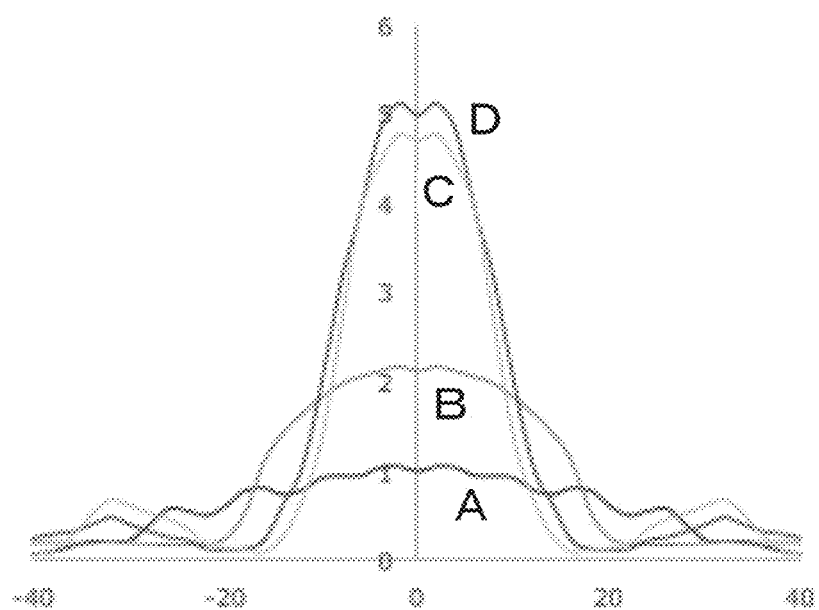
FIG. 5 is a diagram illustrating simulation results determining front luminance with $D_{01}=0$ μm, and $D_{12}=0$ μm, 0.5 μm, and 1.0 μm in each of the first direction and the second direction.

FIG. 3 illustrates the obtained results of the front luminance for the cases of $D_{01}=0$ µm, $D_{12}=0$ µm, 0.5 µm, and 1.0 µm in the first direction, FIG. 4 illustrates the obtained results of the front luminance for the cases of $D_{01}=0$ µm, $D_{12}=0$ µm, 0.5 µm, and 1.0 µm in the second direction, and FIG. 5 illustrates the obtained results of the front luminance for the cases of $D_{01}=0$ µm, $D_{12}=0$ µm, 0.5 µm, and 1.0 µm in each of the first direction and the second direction. Note that, in FIGS. 3, 4, and 5, "A" indicates the front luminance in a case where no optical path control unit and the like is provided, "B" indicates the front luminance in the case of $D_{01}=0$ µm, "C" indicates the front luminance in the case of $D_{01}=0.5$ µm, and "D" indicates the front luminance in the case of $D_{01}=1.0$ µm. In FIGS. 3, 4, and 5, the horizontal axis represents a distance (unit: µm, range: ±40 µm) from an origin (described later) for determining the front luminance, and the vertical axis represents a front luminance expressed as a relative value, with the front luminance being "1.0" in a case where no optical path control unit and the like is provided.

Figure 6:
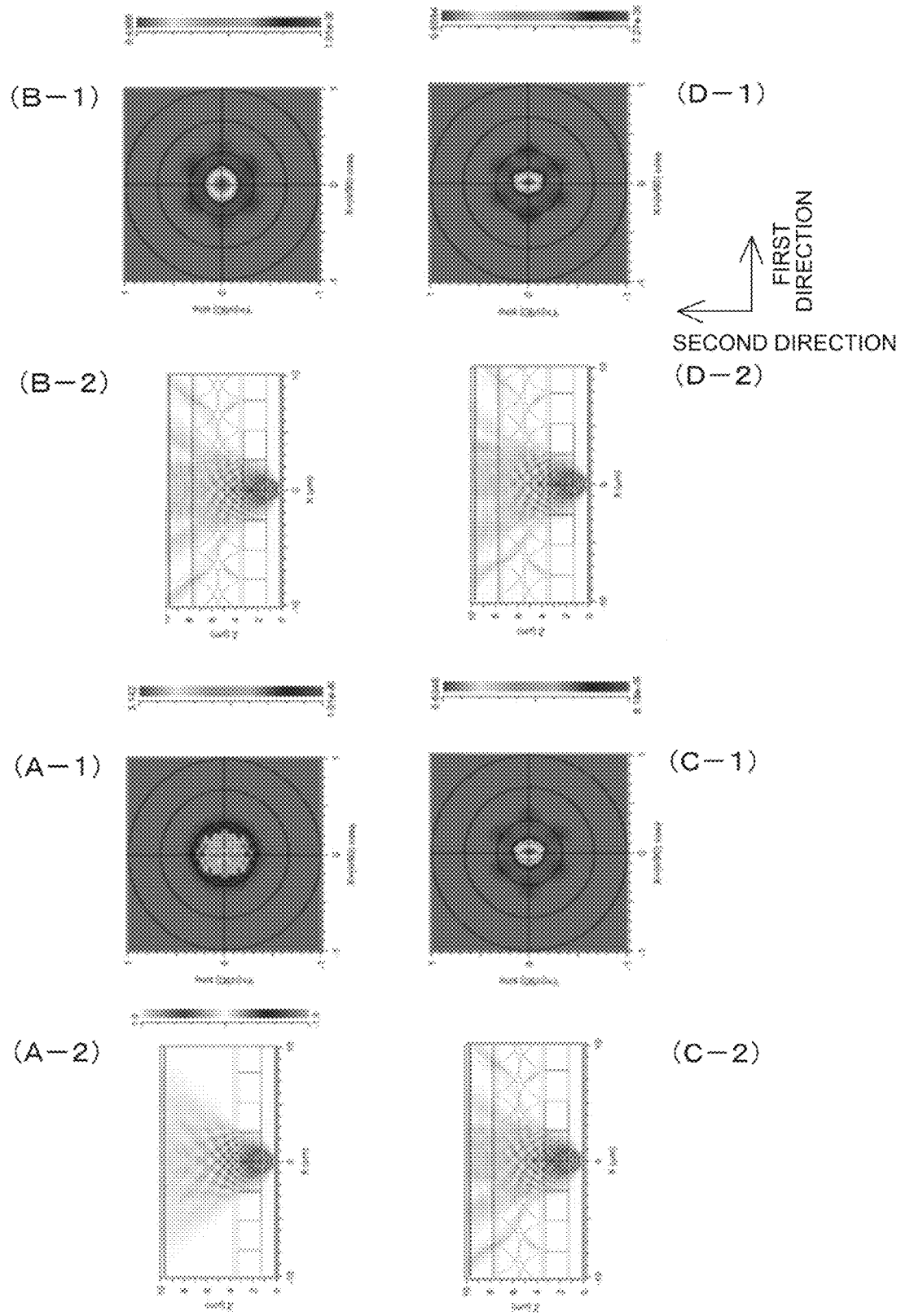
FIG. 6 is a diagram illustrating simulation results with $D_{01}=0$ μm, $D_{12}=0$ μm, $D_{12}=0.5$ μm, and $D_{12}1.=0$ μm in the first direction.

Furthermore,
the simulation result for the case of $D_{01}=0$ µm in the first direction is illustrated in (A-1) and (A-2) of FIG. 6,
the simulation result for the case of $D_{12}=0$ µm in the first direction is illustrated in (B-1) and (B-2) of FIG. 6,
the simulation result for the case of $D_{12}=0.5$ µm in the first direction is illustrated in (C-1) and (C-2) of FIG. 6, and
the simulation result for the case of $D_{12}=1.0$ µm in the first direction is illustrated in (D-1) and (D-2) of FIG. 6. Furthermore,
the simulation result for the case of $D_{01}=0$ µm in the second direction is illustrated in (A-1) and (A-2) of FIG. 7,
the simulation result for the case of $D_{12}=0$ µm in the second direction is illustrated in (B-1) and (B-2) of FIG. 7,
the simulation result for the case of $D_{12}=0.5$ µm in the second direction is illustrated in (C-1) and (C-2) of FIG. 7, and
the simulation result for the case of $D_{12}=1.0$ µm in the second direction is illustrated in (D-1) and (D-2) of FIG. 7. Furthermore,
the simulation result for the case of $D_{01}=0$ µm in each of the first direction and the second direction is illustrated in (A-1) and (A-2) of FIG. 8,
the simulation result for the case of $D_{12}=0$ µm in each of the first direction and the second direction is illustrated in (B-1) and (B-2) of FIG. 8,
the simulation result for the case of $D_{12}=0.5$ µm in each of the first direction and the second direction is illustrated in (C-1) and (C-2) of FIG. 8, and
the simulation result for the case of $D_{12}=1.0$ µm in each of the first direction and the second direction is illustrated in (D-1) and (D-2) of FIG. 8.

Figure 7:
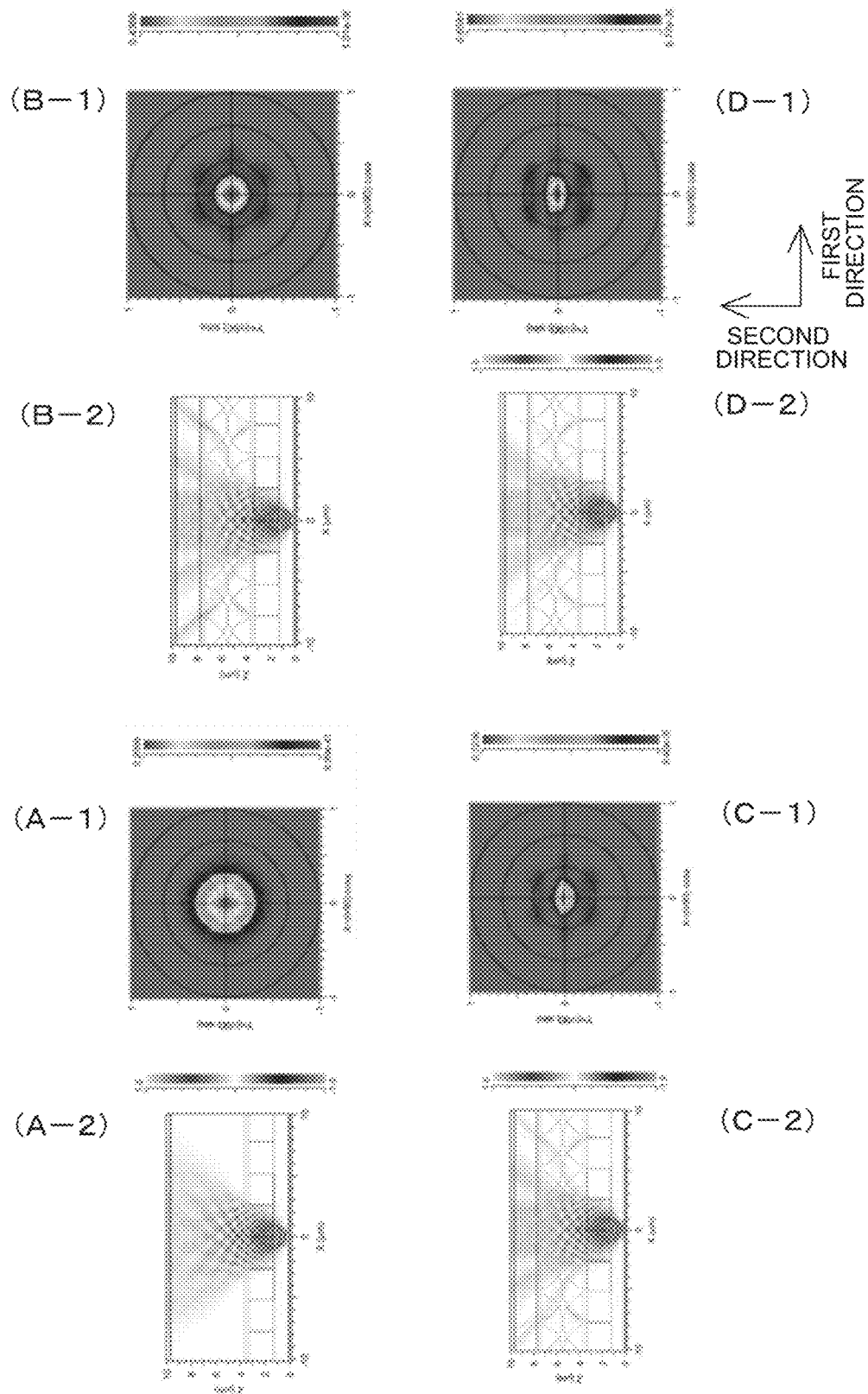
FIG. 7 is a diagram illustrating simulation results with $D_{01}=0$ μm, $D_{12}=0$ μm, $D_{12}=0.5$ μm, and $D_{12}1.=0$ μm in the second direction.
Figure 8:
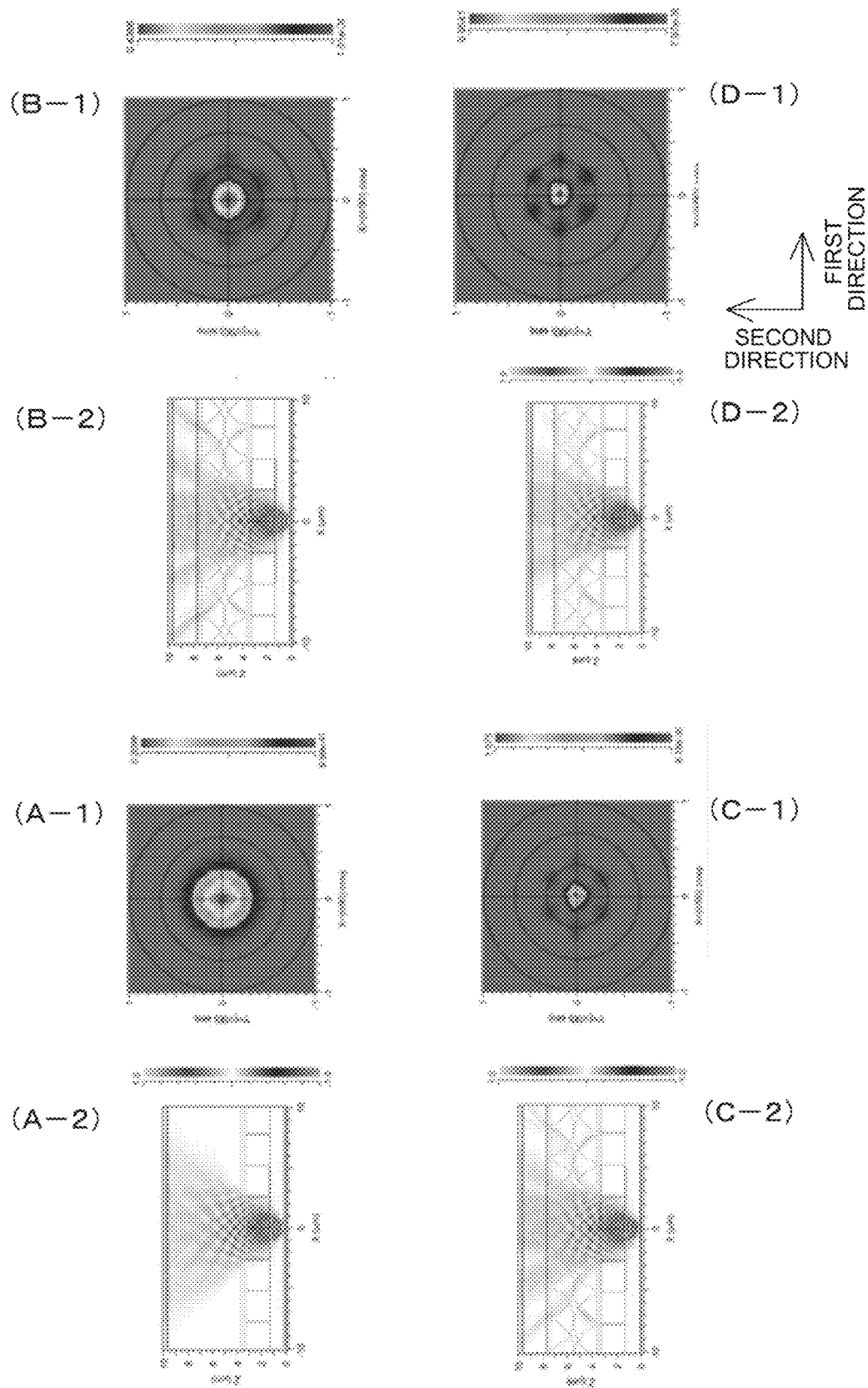
FIG. 8 is a diagram illustrating simulation results with $D_{01}=0$ µm, $D_{12}=0$ µm, $D_{12}=0.5$ µm, and $D_{12}1.=0$ µm in each of the first direction and the second direction.

Here, (A-1), (B-1), (C-1), and (D-1) in FIGS. 6, 7, and 8 illustrate the simulation results of the front luminance distribution in a virtual horizontal plane (a virtual horizontal plane orthogonal to the normal line $LN_0$ passing through the center of the light-emitting region) at a position for determining the front luminance from the light-emitting region. In the diagram illustrating these simulation results, the horizontal axis represents the distance (the unit is µm and a region of ±1 µm is indicated) along the first direction from the origin for determining the front luminance, and the vertical axis represents the distance (the unit is µm and a region of ±1 µm is indicated) along the second direction from the origin for determining the front luminance. Here, the "origin" is a point at the intersection of the normal line $LN_0$ passing through the center of the predetermined light-emitting region with the virtual horizontal plane, and refers to a position where the distance along the first direction is 0 µm and the distance along the second direction is 0 µm. On the other hand, (A-2), (B-2), (C-2), and (D-2) of FIGS. 6, 7, and 8 are the simulation results indicating the behavior of the light in a virtual vertical plane (a virtual vertical plane including the normal line $LN_0$ passing through the center of the light-emitting region) of the light exited from the light-emitting region. In the diagrams illustrating these simulation results, the horizontal axis represents the distance (the unit is µm and a region of ±10 µm is indicated) along the first direction from the origin for determining the front luminance, and the vertical axis represents the distance from the light-emitting region toward the position for determining the front luminance.

From the simulation results, the results shown in Tables 1, 2, and 3 below were obtained with the front luminance being 1.0 in the case where no optical path control unit and the like is provided.

TABLE 1

| | $D_{12}$ | | |
| --- | --- | --- | --- |
| | 0.0 µm | 0.5 µm | 1.0 µm |
| Front luminance | 2.1 times | 3.2 times | 3.3 times |

TABLE 2

| | $D_{12}$ | | |
| --- | --- | --- | --- |
| | 0.0 µm | 0.5 µm | 1.0 µm |
| Front luminance | 2.1 times | 3.5 times | 3.4 times |

TABLE 3

| | $D_{12}$ | | |
| --- | --- | --- | --- |
| | 0.0 µm | 0.5 µm | 1.0 µm |
| Front luminance | 2.1 times | 5.0 times | 4.7 times |

Tables 1, 2, and 3 indicate that the front luminance increases 2.1 times in the case of $D_{12}$=0.0 µm as compared with the case without any optical path control unit and the like. In contrast, it has been found that the front luminance increases more than 3 times to less than 4 times in the case of $D_{12}$=0.5 µm or 1.0 µm in the first direction or the second direction (see FIGS. 2A and 2B), and the front luminance increases by about 5 times in the case of $D_{12}$=0.5 µm or 1.0 µm in each of the first direction and the second direction (see FIG. 2C). It has yet to be sufficiently clarified at the present time the reason why the front luminance greatly increases in the case where the value of $D_{12}$ is not 0.0 µm, but it is considered that the front luminance was able to increase as a result of the light emitted from the light-emitting region being focused on a small region as compared with the case where the value of $D_{12}$ is 0.0 µm.

It can be seen that, the smaller the area (referred to as a "high intensity distribution region" for convenience) indicated in dark gray including the origin of (B-1), (C-1), and (D-1) in FIGS. 6, 7, and 8, the larger the value of the front luminance. In the case of $D_{12}$=0.0 m in the first direction, or the second direction, or in each of the first direction and the second direction, the high intensity distribution region is substantially circular [See (B-1) in FIGS. 6, 7, and 8]. In contrast, in the case of $D_{12}$=0.5 µm or 1.0 µm in the first direction, the high intensity distribution region has an elliptical shape with the major axis in the second direction and the minor axis in the first direction [See (C-1) and (D-1) in FIG. 6]. Moreover, in the case of $D_{12}$=0.5 µm or 1.0 µm in the second direction, the high intensity distribution region has an elliptical shape with the major axis in the first direction and the minor axis in the second direction [See (C-1) and (D-1) in FIG. 7]. Furthermore, when $D_{12}$=0.5 µm or 1.0 µm in each of the first direction and the second direction, the high intensity distribution region has a smaller circular shape [See (C-1) and (D-1) in FIG. 8].

As described above, in the light-emitting element or the display device of Example 1, the front light outcoupling efficiency can be enhanced by displacing the optical axis of the first optical path control unit (first lens member) from the optical axis of the second optical path control unit (second lens member). Moreover, in the process of manufacturing the light-emitting element, a convex first optical path control unit (first lens member) protruding upward is required to be formed on a flat wavelength selector (color filter layer) in the above-described [Step-160], and a convex second optical path control unit (second lens member) protruding upward is required to be formed on a flat underlying layer in the above-described [Step-170] independently of the formation of the first optical path control unit. Therefore, there is no significant increase in the manufacturing processes of the light-emitting element and the display device and hence the manufacturing processes can be simplified, as compared with, for example, a case of assuming a process in which a convex first optical path control unit protruding upward is formed on a flat color filter layer, then a planarized layer is formed on the entire surface, and further a convex second optical path control unit protruding upward is formed on the planarized layer.

Figure 9:
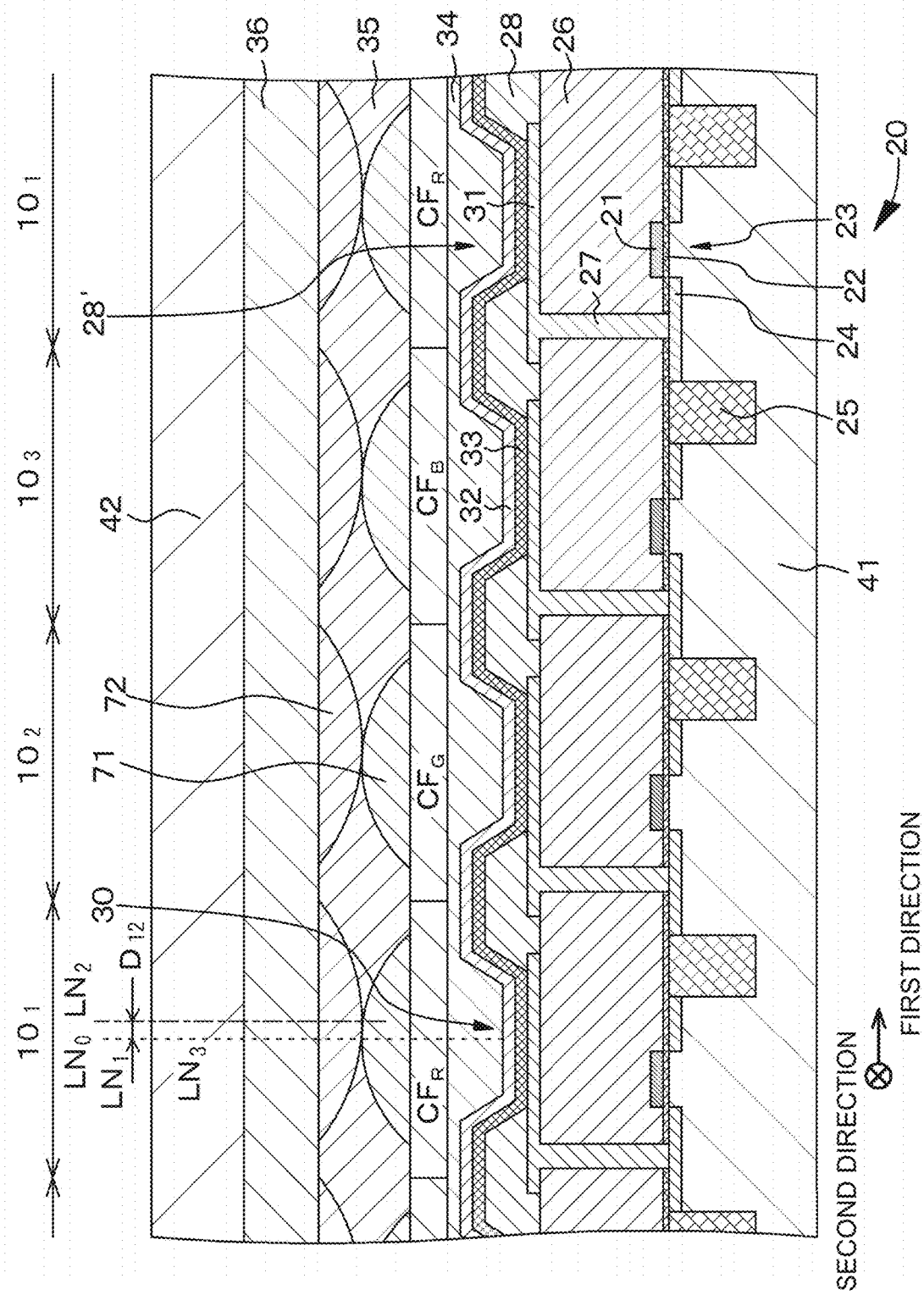
FIG. 9 is a schematic partial cross-sectional view of Modification-1 of the light-emitting element and the display device of Example 1.
Figure 10:
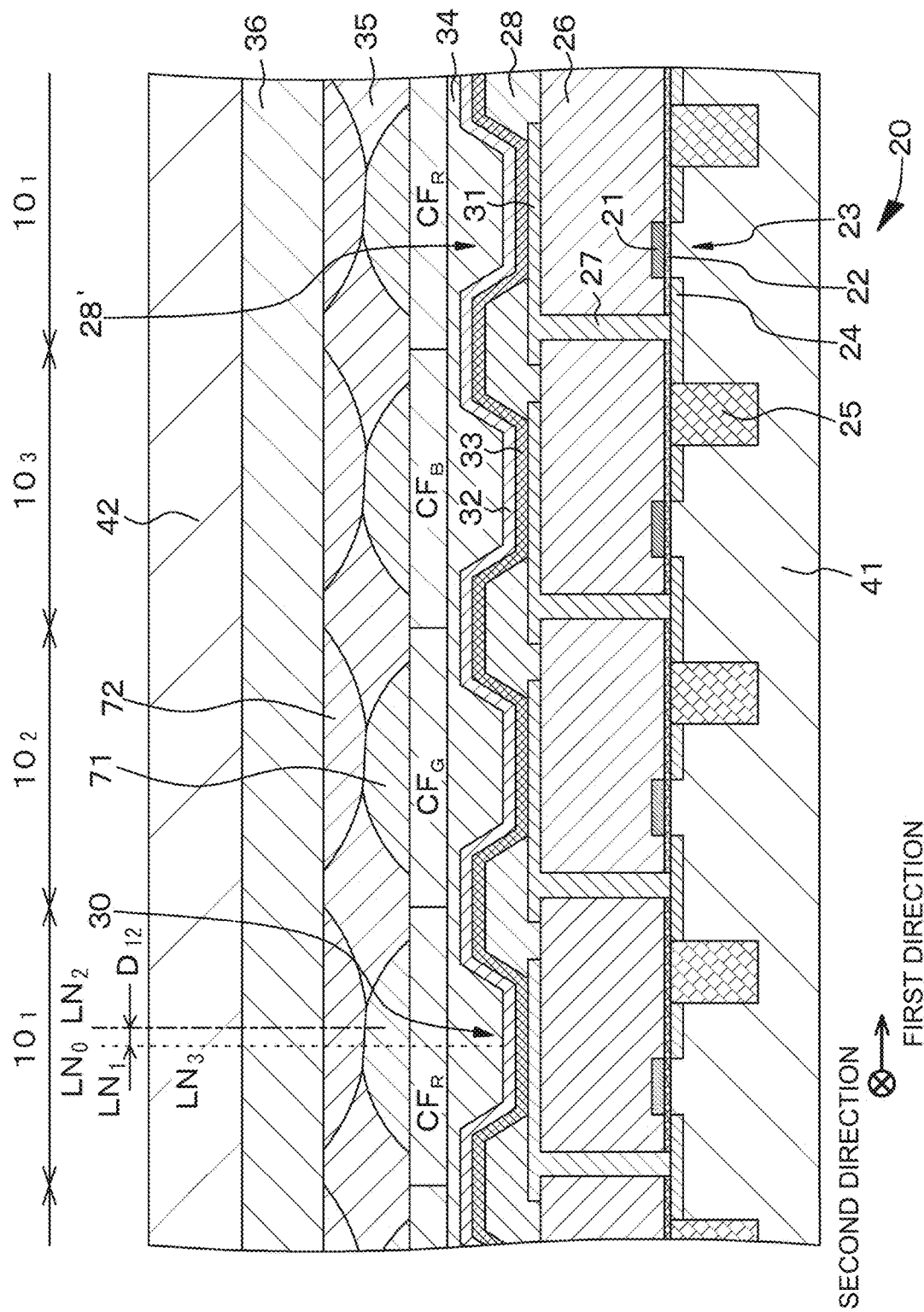
FIG. 10 is a schematic partial cross-sectional view of Modification-2 of the light-emitting element and the display device of Example 1.

As in FIGS. 9 and 10 illustrating schematic partial cross-sectional views of Modification-1 and Modification-2 of the light-emitting element of Example 1, the top of the first optical path control unit 71 may be in contact with the top of the second optical path control unit 72. In the example illustrated in FIG. 9, the top of the first optical path control unit 71 and the top of the second optical path control unit 72 are in a point contact state. Alternatively, in the example illustrated in FIG. 10, the top of the first optical path control unit 71 and the top of the second optical path control unit 72 are in a surface contact state. That is, a flat portion is formed by a top portion where the first optical path control unit 71 and the second optical path control unit 72 are in contact with each other.

Figure 11:
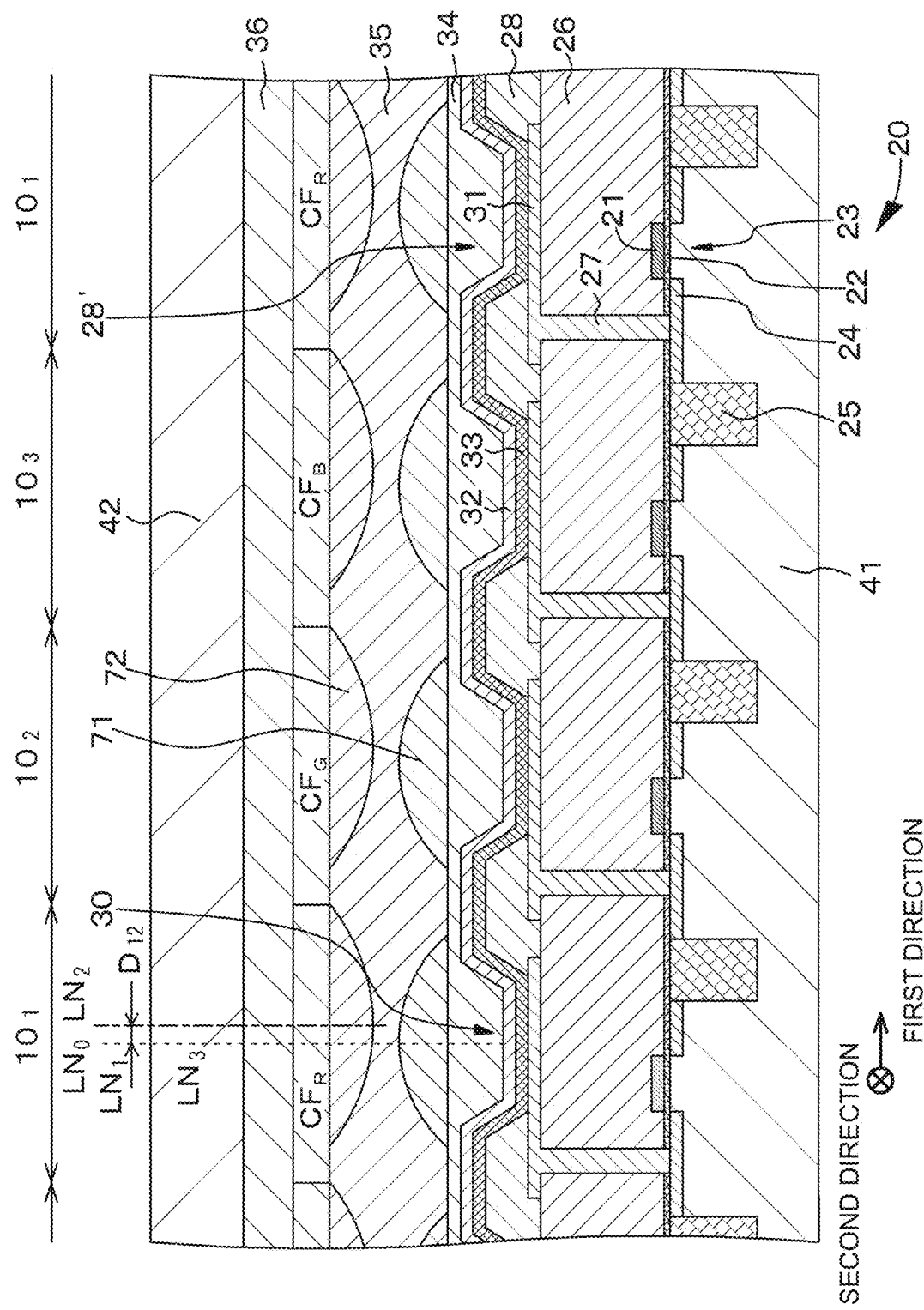
FIG. 11 is a schematic partial cross-sectional view of Modification-3 of the light-emitting element and the display device of Example 1.
Figure 12:
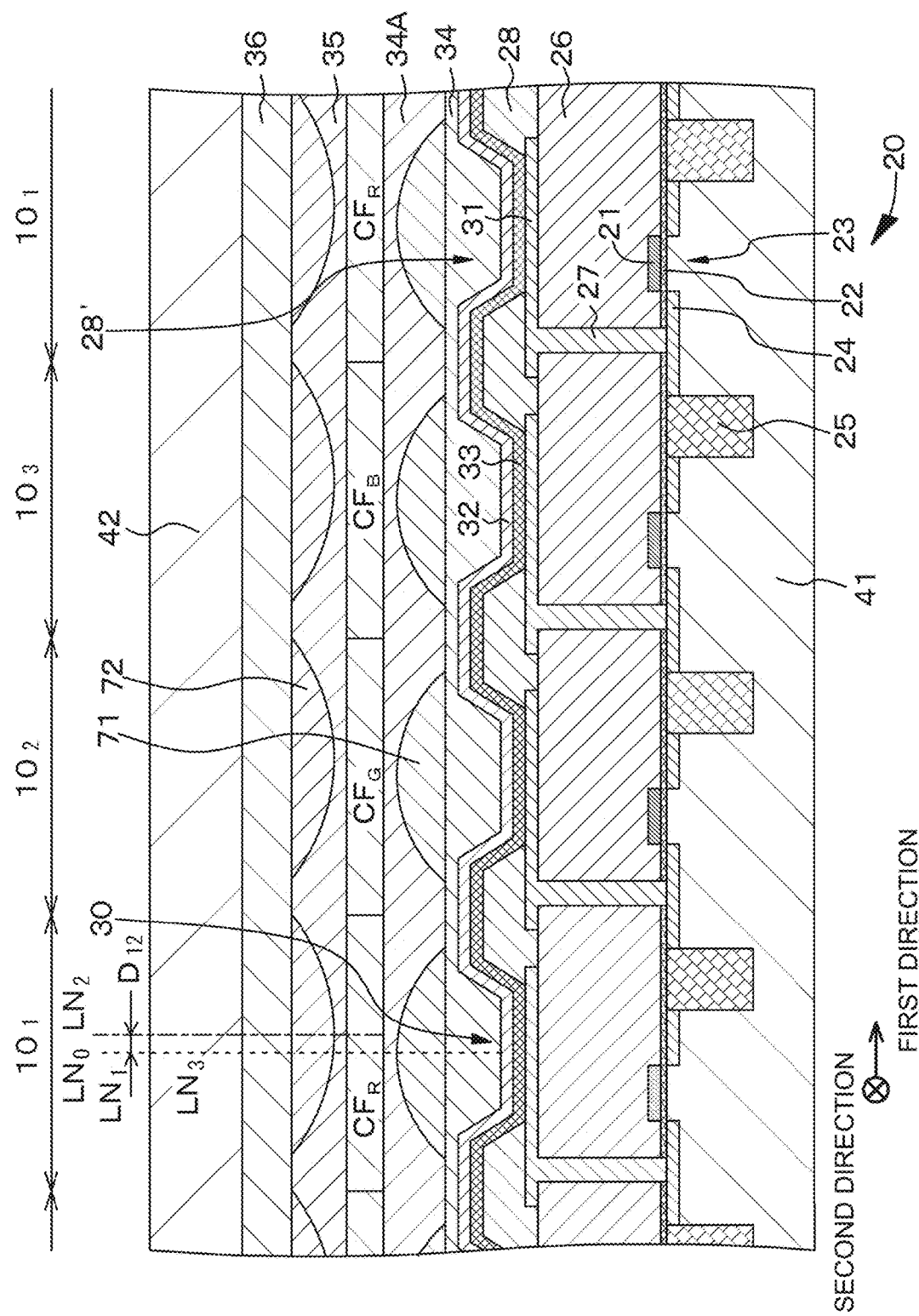
FIG. 12 is a schematic partial cross-sectional view of Modification-4 of the light-emitting element and the display device of Example 1.

As in FIG. 11 illustrating a schematic partial cross-sectional view of Modification-3 of the light-emitting element of Example 1, a wavelength selector CF may be provided between the second substrate 42 and the second optical path control unit 72 (more specifically, the underlying layer 36 and the second optical path control unit 72). Alternatively, as in FIG. 12 illustrating a schematic partial cross-sectional view of Modification-4 of the light-emitting element of Example 1, a wavelength selector CF may be provided between the first optical path control unit 71 and the second optical path control unit 72. Specifically, a second protective layer 34A is formed on the second optical path control unit 72 and the protective layer 34, and a wavelength selector CF is provided on the second protective layer 34A. The wavelength selector CF and the second optical path control unit 72 are laminated together by a bonding member 35.

Figure 13:
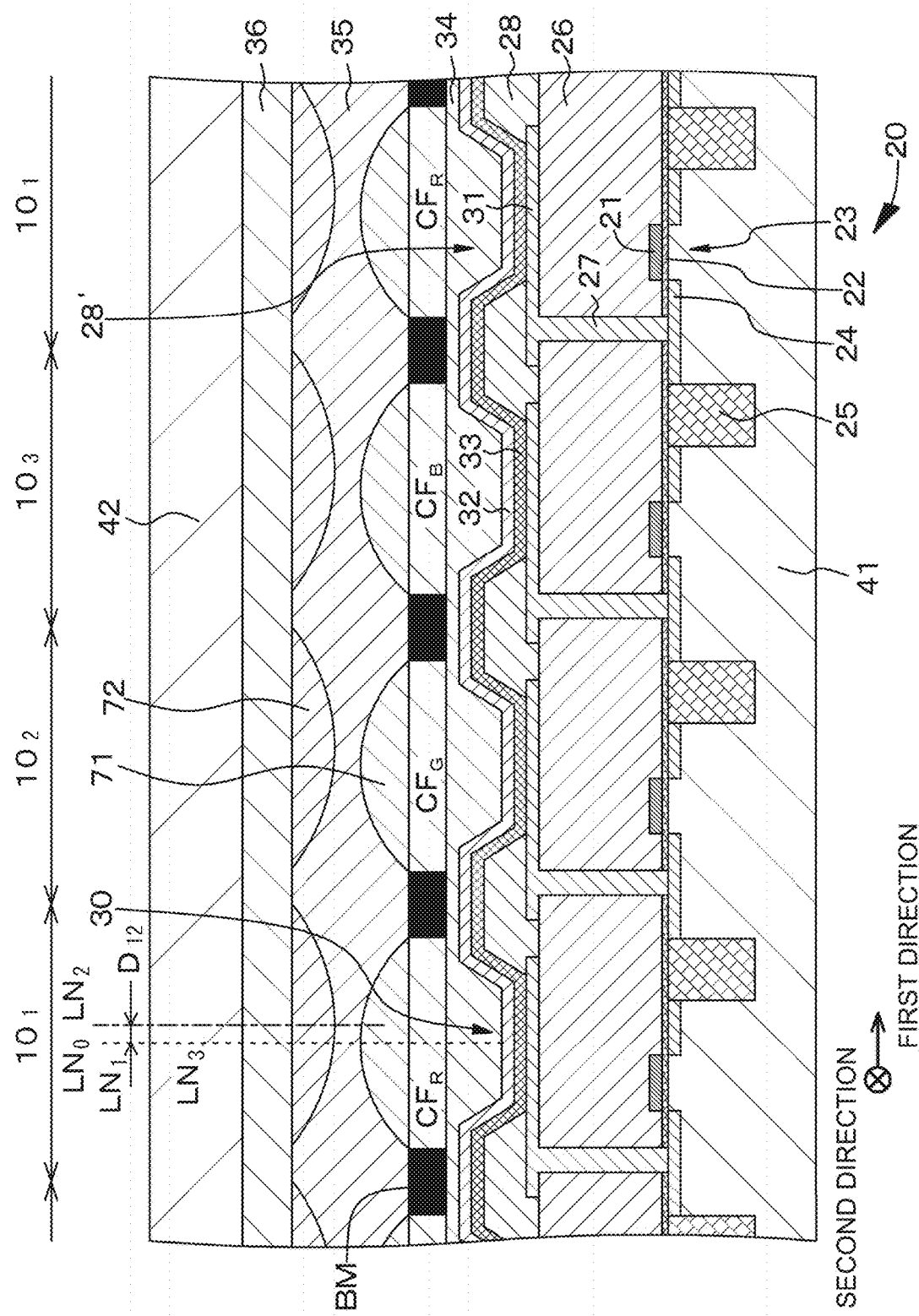
FIG. 13 is a schematic partial cross-sectional view of Modification-5 of the light-emitting element and the display device of Example 1.
Figure 14:
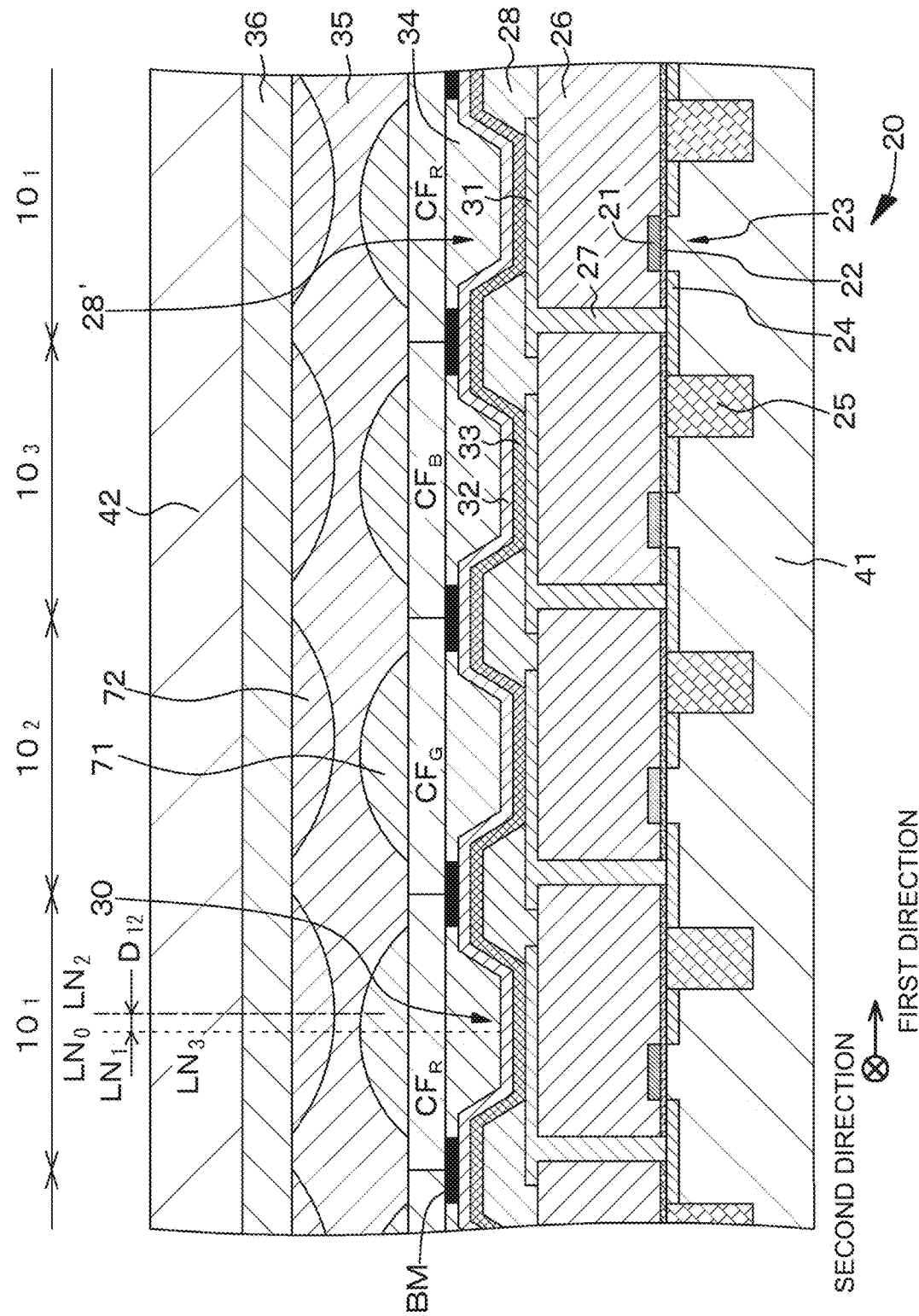
FIG. 14 is a schematic partial cross-sectional view of Modification-6 of the light-emitting element and the display device of Example 1.
Figure 15:
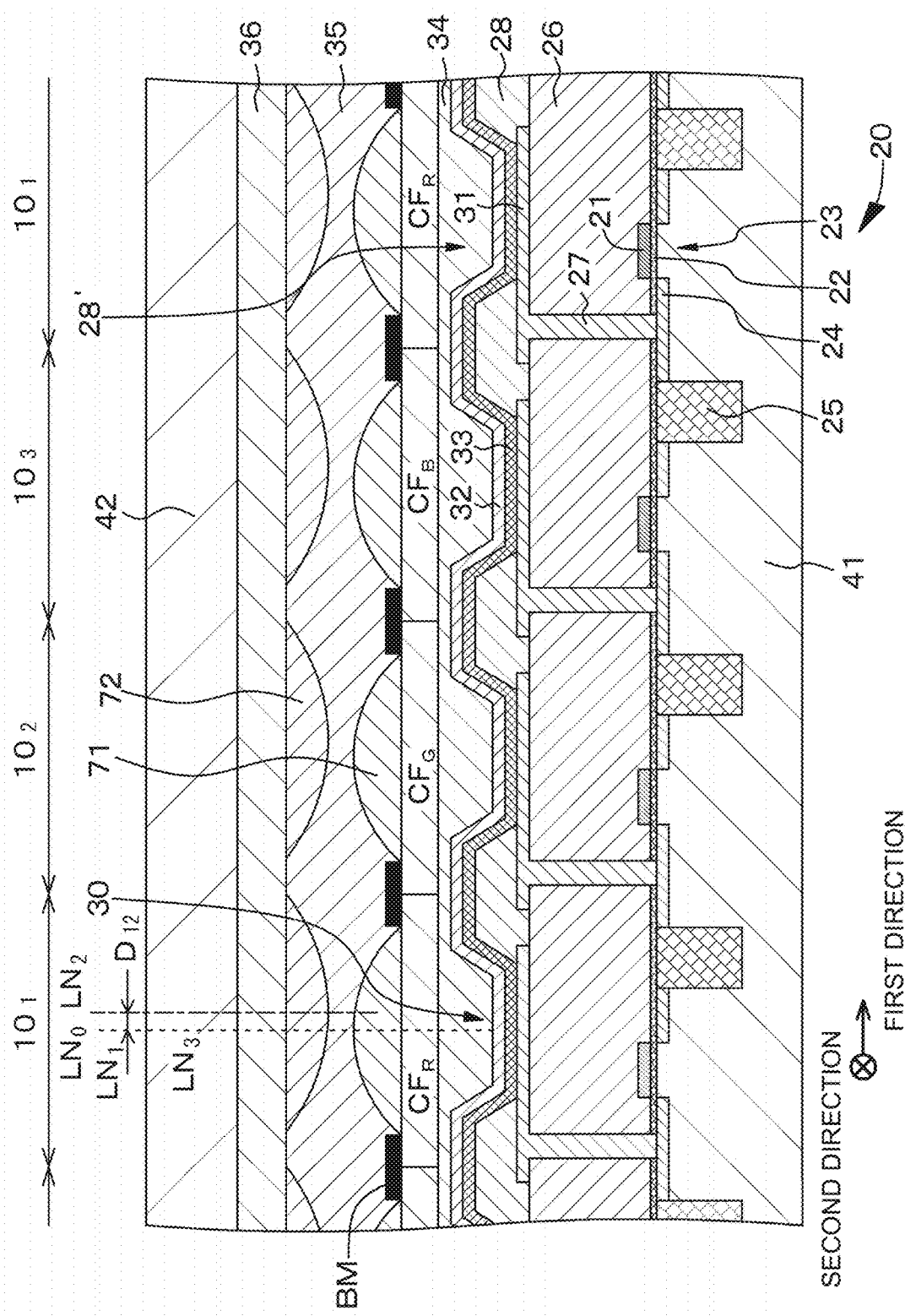
FIG. 15 is a schematic partial cross-sectional view of Modification-7 of the light-emitting element and the display device of Example 1.

Alternatively, as in FIG. 13 illustrating a schematic partial cross-sectional view of Modification-5 of the display device of Example 1, a light absorption layer (black matrix layer) BM can be configured to be formed between the wavelength selectors CF of adjoining light-emitting elements. As in FIG. 14 illustrating a schematic partial cross-sectional view of Modification-6 of the display device of Example 1, a light absorption layer (black matrix layer) BM can be configured to be formed below a position between the wavelength selectors CF of adjoining light-emitting elements. As in FIG. 15 illustrating a schematic partial cross-sectional view of Modification-7 of the display device of Example 1, a light absorption layer (black matrix layer) BM can be configured to be formed between the first optical path control unit 71 of a light-emitting element and the first optical path control unit 71 of an adjoining light-emitting element. The black matrix layer BM is made of, for example, a black resin film (specifically, for example, a black polyimide-based resin) mixed with a black colorant and having an optical density of 1 or more. Note that these Modification-5, Modification-6, and Modification-7 can be appropriately applied to Modification-1, Modification-2, Modification-3, and Modification-4.

The protective layer can also be configured to have a function as a color filter layer. That is, the protective layer having such a function just can be made of a well-known color resist material. As such, the protective layer is allowed to serve also as a color filter layer, whereby the organic layer and the protective layer can be arranged close to each other, so that color mixing can be effectively prevented even with wider angle of light emitted from the light-emitting element, and the viewing angle characteristic is improved.

Example 2

Figure 17:
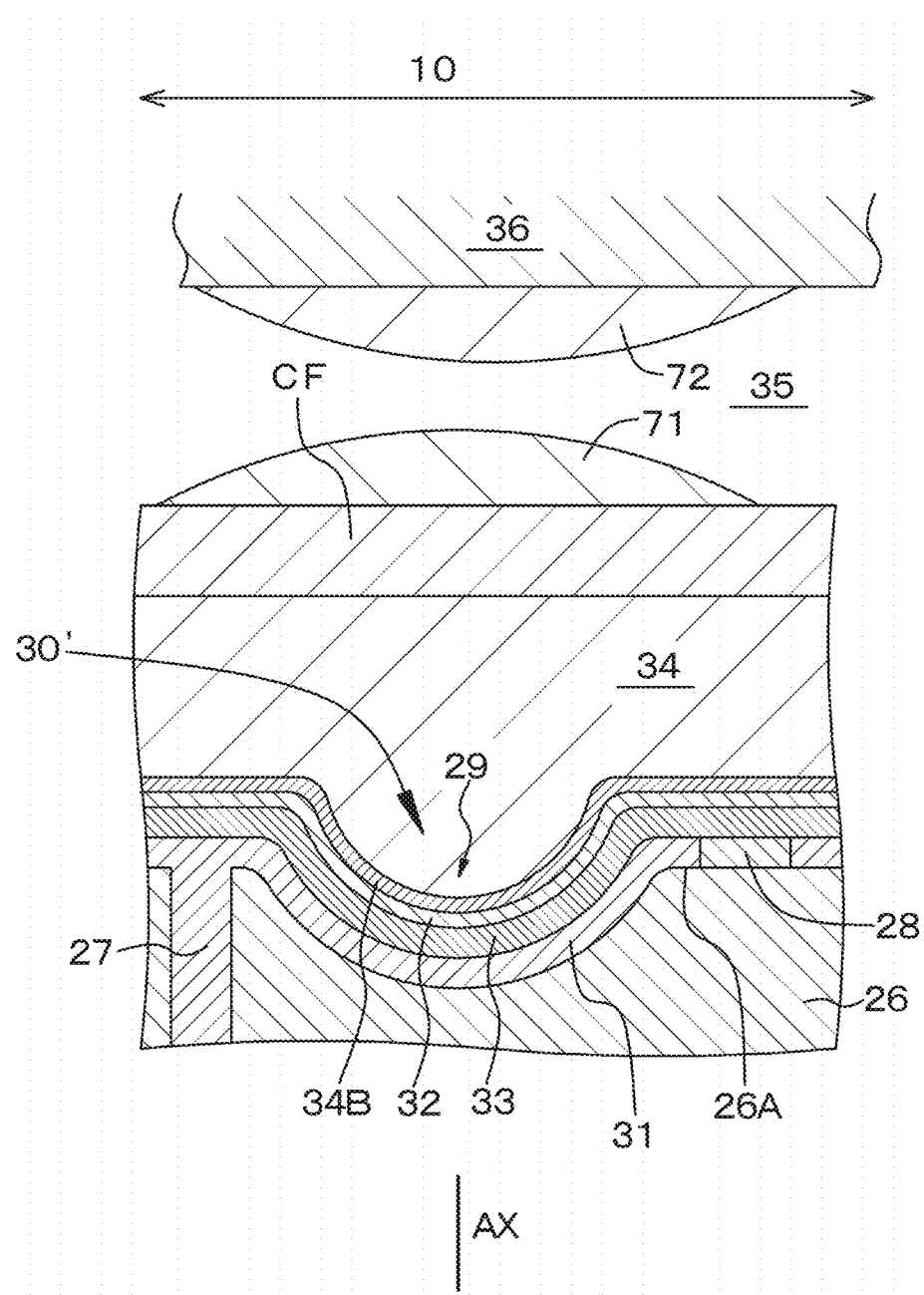
FIG. 17 is a schematic partial cross-sectional view of a light-emitting element of Example 2.
Figure 18:
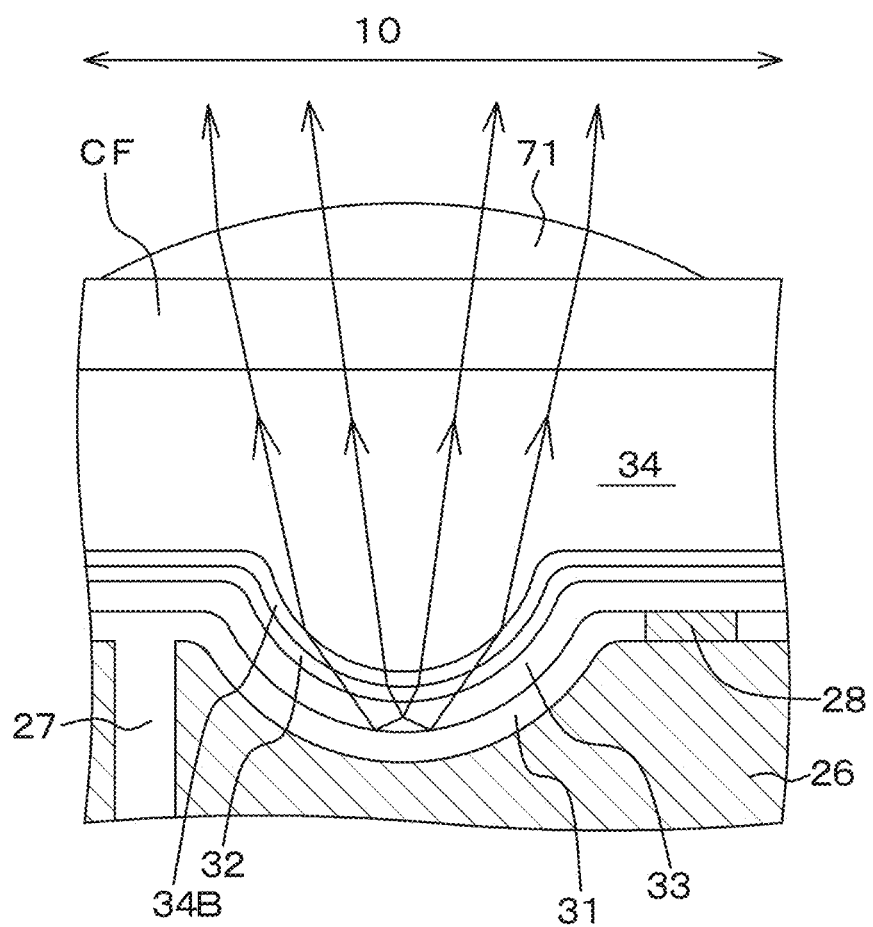
FIG. 18 is a schematic partial cross-sectional view of a light-emitting element, in order to explain the behavior of light from the light-emitting element of Example 2.

Example 2 is a modification of Example 1. FIG. 17 illustrates a schematic partial cross-sectional view of the light-emitting element of Example 2, and FIG. 18 illustrates a schematic partial cross-sectional view of the light-emitting element, for explaining the behavior of light from the light-emitting element of Example 2.

In the light-emitting element 10 of Example 2, the light-emitting part 30' has a convex cross-sectional shape protruding toward the first substrate 41. Specifically,

- a surface 26A of a substratum 26 is provided with a concave portion 29,
- at least a part of the first electrode 31 is formed similarly to the shape of the top surface of the concave portion 29,
- at least a part of the organic layer 33 is formed on the first electrode 31 similarly to the shape of the top surface of the first electrode 31,
- the second electrode 32 is formed on the organic layer 33 similarly to the shape of the top surface of the organic layer 33, and
- the protective layer 34 is formed on the second electrode 32.

In the light-emitting element of Example 2, in the concave portion 29, the entire first electrode 31 is formed similarly to the shape of the top surface of the concave portion 29, and the entire organic layer 33 is formed on the first electrode 31 similarly to the shape of the top surface of the first electrode 31.

In the light-emitting element 10 of Example 2, a third protective layer 34B is formed between the second electrode 32 and the protective layer 34. The third protective layer 34B is formed similarly to the shape of the top surface of the second electrode 32. Here, when the refractive index of the material included in the protective layer (planarized layer) 34 is denoted by $n_3$ and the refractive index of the material included in the third protective layer 34 is denoted by $n_4$, then $n_3>n_4$ is satisfied. As the value of $(n_3-n_4)$, there can be exemplified from 0.1 to 0.6, but not limited thereto. Specifically, the material included in the protective layer 34 is made of a material whose matrix made of an acrylic based resin is added with $TiO_2$ so as to have adjusted (enhanced) refractive index, or made of a material whose matrix made of the same type of material as a color resist material (with the proviso that a colorless transparent material with no pigment added) added with $TiO_2$ so as to have an adjusted (enhanced) refractive index, and the material included in the third protective layer 34B is made of SiN, SiON, $Al_2O_3$, or $TiO_2$. Note that, for example, $n_3=2.0$ and $n_4=1.6$.

When such third protective layer 34B is formed, as illustrated in FIG. 18, a part of light emitted from the organic layer 33 passes through the second electrode 32 and the third protective layer 34B and enters into the protective layer 34, and a part of light emitted from the organic layer 33 is reflected on the first electrode 31, passes through the second electrode 32 and the third protective layer 34B, and enters into the protective layer 34. As such, an internal lens is formed by the third protective layer 34B and the protective layer 34, as a result, the light emitted from the organic layer 33 can be condensed in a direction toward the central portion of the light-emitting element.

Alternatively, in the light-emitting element of Example 1, when light emitted from the organic layer 33 and through the second electrode 32 is incident on the protective layer 34 at an angle of incidence of $\theta_i$, and the angle of refraction of light incident on the protective layer 34 is denoted by $\theta_r$, in the case of $|\theta_r|\neq 0$, $|\theta_i|>|\theta_r|$ is satisfied. When such conditions are satisfied, a part of the light emitted from the organic layer 33 passes through the second electrode 32 and enters into the protective layer 34, and a part of the light emitted from the organic layer 33 is reflected on the first electrode 31, passes through the second electrode 32, and enters into the protective layer 34. As a result that an internal lens is formed in this manner, the light emitted from the organic layer 33 can be condensed in a direction toward the central portion of the light-emitting element.

As described above, when the concave portion is formed, the front light outcoupling efficiency can be further enhanced as compared with the case where the first electrode, the organic layer, and the second electrode have a flat layered structure.

Figure 20A:
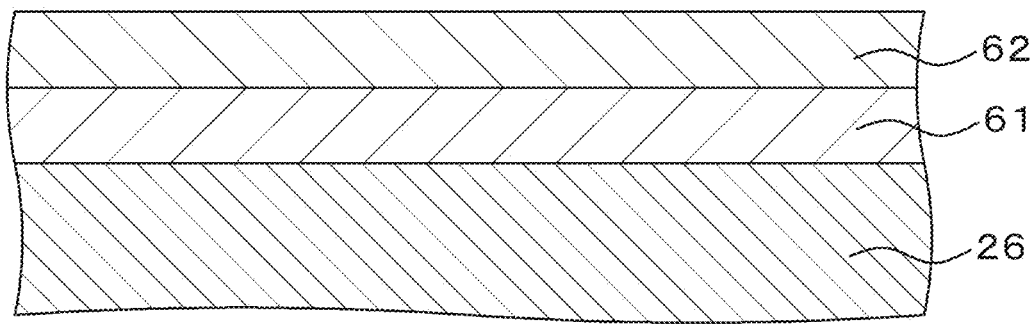
FIG. 20A is a schematic partial end view of a substratum and the like, in order to explain the method of manufacturing the light-emitting element of Example 2 illustrated in FIG. 17.
Figure 20B:
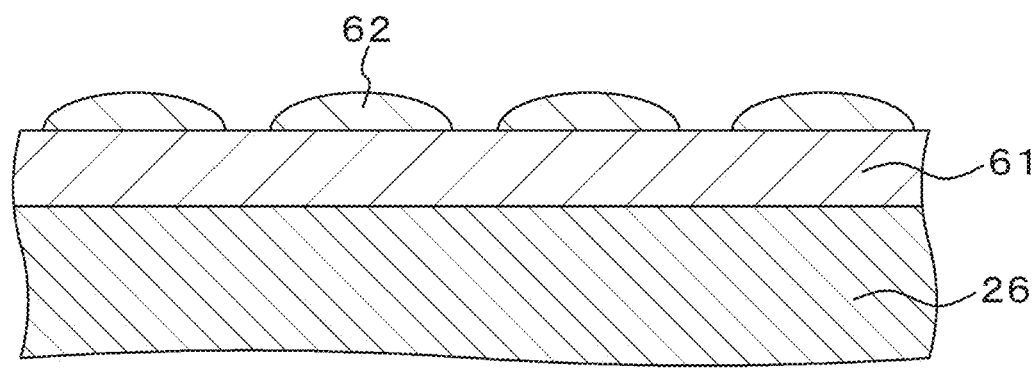
FIG. 20B is a schematic partial end view of a substratum and the like, in order to explain the method of manufacturing the light-emitting element of Example 2 illustrated in FIG. 17.
Figure 20C:
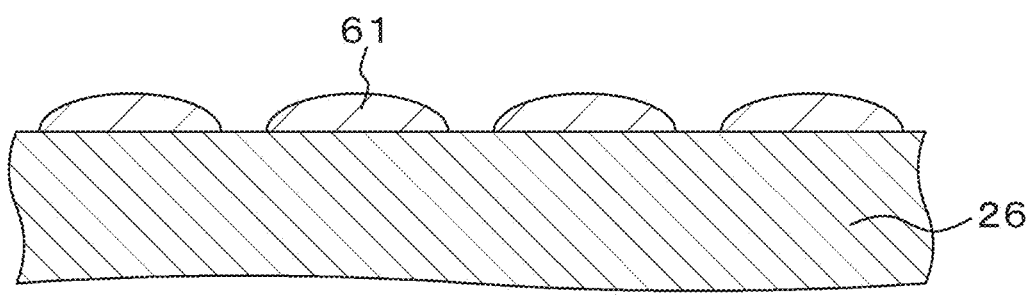
FIG. 20C is a schematic partial end view of a substratum and the like, in order to explain the method of manufacturing the light-emitting element of Example 2 illustrated in FIG. 17.
Figure 21A:
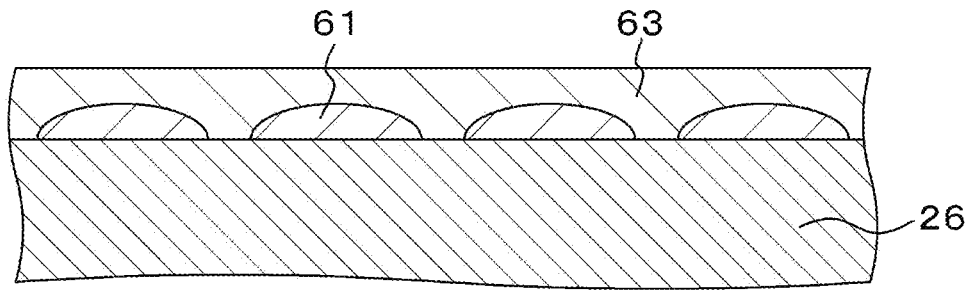
FIG. 21A is a schematic partial end view of a substratum and the like, in order to explain the method of manufacturing the light-emitting element of Example 2 illustrated in FIG. 17, following FIG. 21A.
Figure 21B:
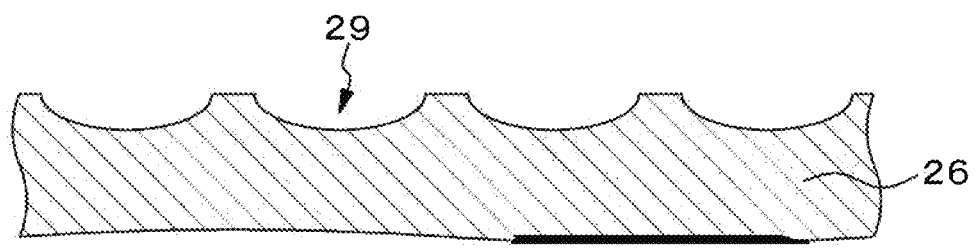
FIG. 21B is a schematic partial end view of a substratum and the like, in order to explain the method of manufacturing the light-emitting element of Example 2 illustrated in FIG. 17, following FIG. 20C.

In order to form the concave portion 29 in a part of the substratum 26 where the light-emitting element is to be formed, specifically, a mask layer 61 made of SiN is formed on the substratum 26 made of $SiO_2$, and a resist layer 62 having a shape to form the concave portion is formed on the mask layer 61 (see FIGS. 20A and 20B). Thereafter, the resist layer 62 and the mask layer 61 are etched back, whereby the shape formed on the resist layer 62 is transferred to the mask layer 61 (see FIG. 20C). Subsequently, a resist layer 63 is formed on the entire surface (see FIG. 21A), and then the resist layer 63, the mask layer 61, and the substratum 26 are etched back, whereby a concave portion 29 can be formed in the substratum 26 (see FIG. 21B). The material of the resist layer 63 is appropriately selected and the etching conditions for etching back the resist layer 63, the mask layer 61, and the substratum 26 are appropriately set, specifically, etching conditions and a material system in which the etching speed of the resist layer 63 is lower than the etching speed of the mask layer 61 are chosen, whereby the concave portion 29 can be formed in the substratum 26.

Figure 22A:
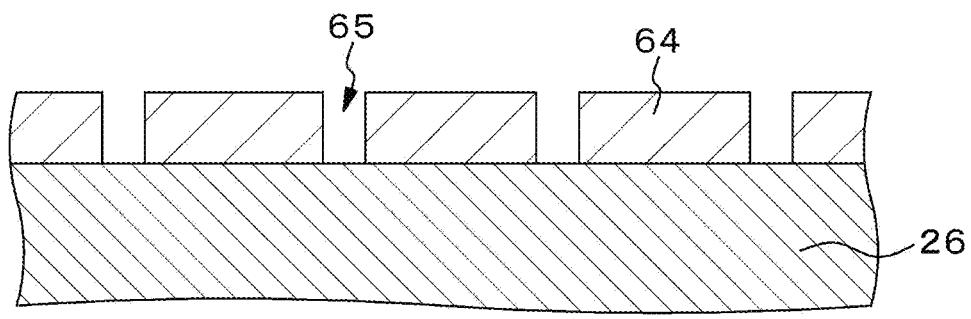
FIG. 22A is a schematic partial end view of a substratum and the like, in order to explain another method of manufacturing the light-emitting element of Example 2 illustrated in FIG. 17.
Figure 22B:
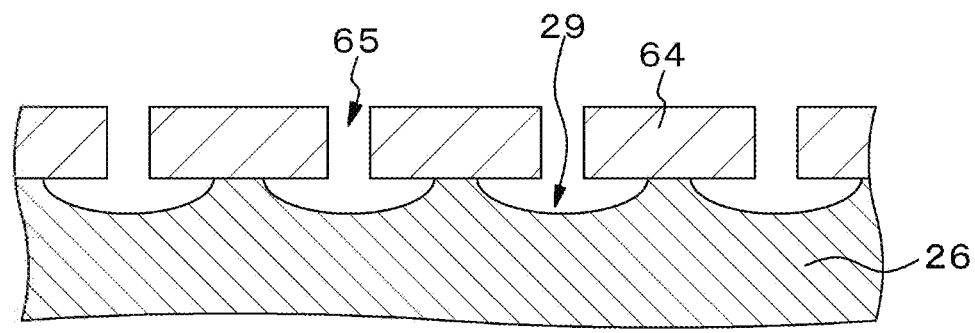
FIG. 22B is a schematic partial end view of a substratum and the like, in order to explain another method of manufacturing the light-emitting element of Example 2 illustrated in FIG. 17.

Alternatively, a resist layer 64 having openings 65 is formed on the substratum 26 (see FIG. 22A). Thereafter the substratum 26 is wet etched through the openings 65, whereby concave portions 29 can be formed in the substratum 26 (see FIG. 22B).

Alternatively, the third protective layer 34B can be formed on the entire surface based on, for example, an ALD method. The third protective layer 34B is formed on the second electrode 32 similarly to the shape of the top surface of the second electrode 32, and has a constant thickness in the concave portion 29. Subsequently, the protective layer 34 is formed on the entire surface based on a coating method, and then the top surface of the protective layer 34 needs to be planarized.

As such, in the light-emitting element of Example 2, concave portions are provided on the surface of the substratum, and the first electrode, the organic layer, and the second electrode are substantially formed similarly to the shape of the top surface of the concave portion. As the concave portion is formed in this manner, the concave portion can be allowed to serve as a kind of concave mirror, so that the front light outcoupling efficiency can be further enhanced, the current-luminous efficacy is remarkably improved, and there is no significant increase in the manufacturing processes. Moreover, as the organic layer has a constant thickness, a resonator structure can be easily formed. Furthermore, as the first electrode has a constant thickness, phenomena due to the thickness variation of the first electrode, such as coloring or luminance variation of the first electrode depending on the angle at which the display device is viewed, can be prevented from occurring.

Note that, the region other than the concave portion 29 also includes the layered structure of the first electrode 32, the organic layer 33, and the second electrode 32, and hence light is emitted also from this region. This may cause a decrease in condensing efficiency and a loss of monochromaticity due to light leakage from adjacent pixels. Here, the boundary between the insulating layer 28 and the first electrode 31 is the end of the light emitting area, and hence this boundary needs to be optimized in order to optimize the light emitting region.

In particular, in a microdisplay having a small pixel pitch, an elevated front light outcoupling efficiency can be achieved even when an organic layer is formed in a concave portion having a shallow depth, and thus such microdisplay is suitable to be used in future mobile applications. The light-emitting element of Example 2 has a further improved current-luminous efficacy as compared with conventional light-emitting elements, so that the light-emitting element and the display device with longer life and higher luminance are feasible. In addition, its application is remarkably expanded to eyewear, augmented reality (AR) glasses, and EVR.

The deeper the concave portion, the more the light emitted from the organic layer and reflected by the first electrode can be condensed in a direction toward the central portion of the light-emitting element. However, when the concave portion is deep, there may be a case where the organic layer on the upper part of the concave portion is difficult to be formed. Notwithstanding, as the internal lens is formed by the third protective layer and the protective layer, the light reflected by the first electrode can be condensed in the direction toward the central portion of the light-emitting element even when the concave portion has a shallow depth, so that the front light outcoupling efficiency can be further improved. Moreover, the internal lens is formed in a self-alignment manner (self-aligned) with respect to the organic layer, therefore no variations in alignment can be generated between the organic layer and the internal lens. In addition, the angle of the light passing through the color filter layer with respect to the substratum virtual plane can be increased by the formation of the concave portion and the internal lens, so that the color mixing between adjacent pixels can be effectively prevented from occurring. As a result of this, the color gamut reduction due to the optical color mixture between the adjacent pixels is mitigated, and hence the color gamut of a display device can be improved. In general, the closer the organic layer and the lens are, the more efficiently the spread angle of the light can be widened, and the distance between the internal lens and the organic layer is very short, and hence the design freedom, design width of the light-emitting element are widened. Moreover, by appropriately selecting the thicknesses and materials of the protective layer and the third protective layer, the distance between the internal lens and the organic layer and the curvature of the internal lens can be modified, and the design freedom, design width of the light-emitting element are further widened. Furthermore, heat treatment is unnecessary for forming the internal lens, so that the organic layer is not damaged.

Figure 19A:
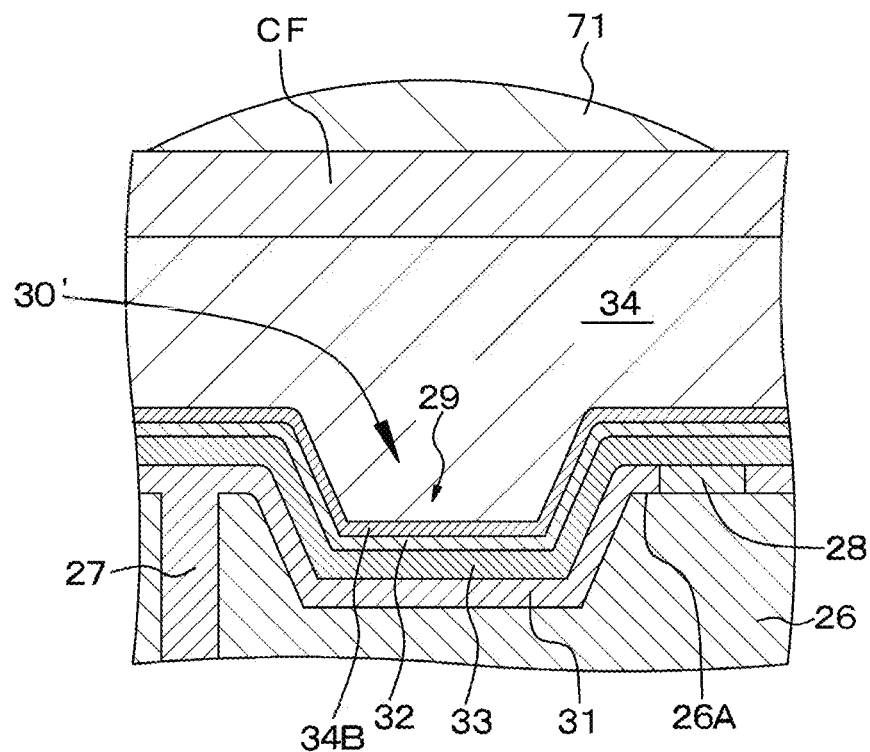
FIG. 19A is a schematic partial end view of a modification of the light-emitting element of Example 2.
Figure 19B:
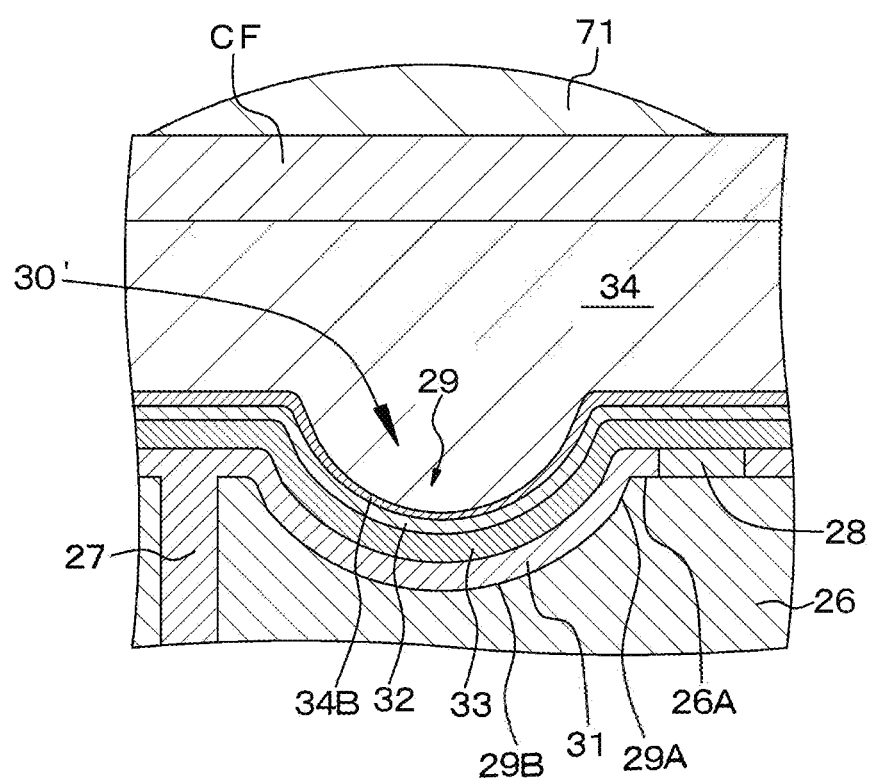
FIG. 19B is a schematic partial end view of a modification of the light-emitting element of Example 2.

In the example illustrated in FIG. 17, the cross-sectional shape of the concave portion 29 as a cutaway of the concave portion 29 along the virtual plane including the axis AX of the concave portion 29 is a smooth curve. However, as illustrated in FIG. 19A, the cross-sectional shape may be a part of a trapezoid, or as illustrated in FIG. 19B, the cross-sectional shape may be a combination of a linear slope 29A and a bottom 29B forming a smooth curve. In FIGS. 19A and 19B, the illustrations of the second optical path control unit 72 and the underlying layer 36 are omitted. Forming the cross-sectional shapes of the concave portion 29 into these shapes enables to increase the inclination angle of the slope 29A, so that, even when the concave portion 29 has a shallow depth, the front directional outcoupling of the light that is emitted from the organic layer 33 and is reflected on the first electrode 31 can be improved.

Example 3

Example 3 is a modification of Examples 1 and 2. The light-emitting element of Example 3 has a resonator structure. That is, the organic EL display device preferably has a resonator structure in order to further enhance the light outcoupling efficiency. In a case of providing a resonator structure, as described above, the resonator structure may be one in which an organic layer 33 serves as a resonator unit and is sandwiched between a first electrode 31 and a second electrode 32, alternatively, as described in Example 3, the resonator structure may be one in which a light reflection layer 37 is formed below a first electrode 31 (toward the first substrate 41 side), an interlayer insulating material layer 38 is formed between the first electrode 31 and the light reflection layer 37, an organic layer 33 and the interlayer insulating material layer 38 serve as a resonator unit and are sandwiched between the light reflection layer 37 and a second electrode 32.

Figure 23:
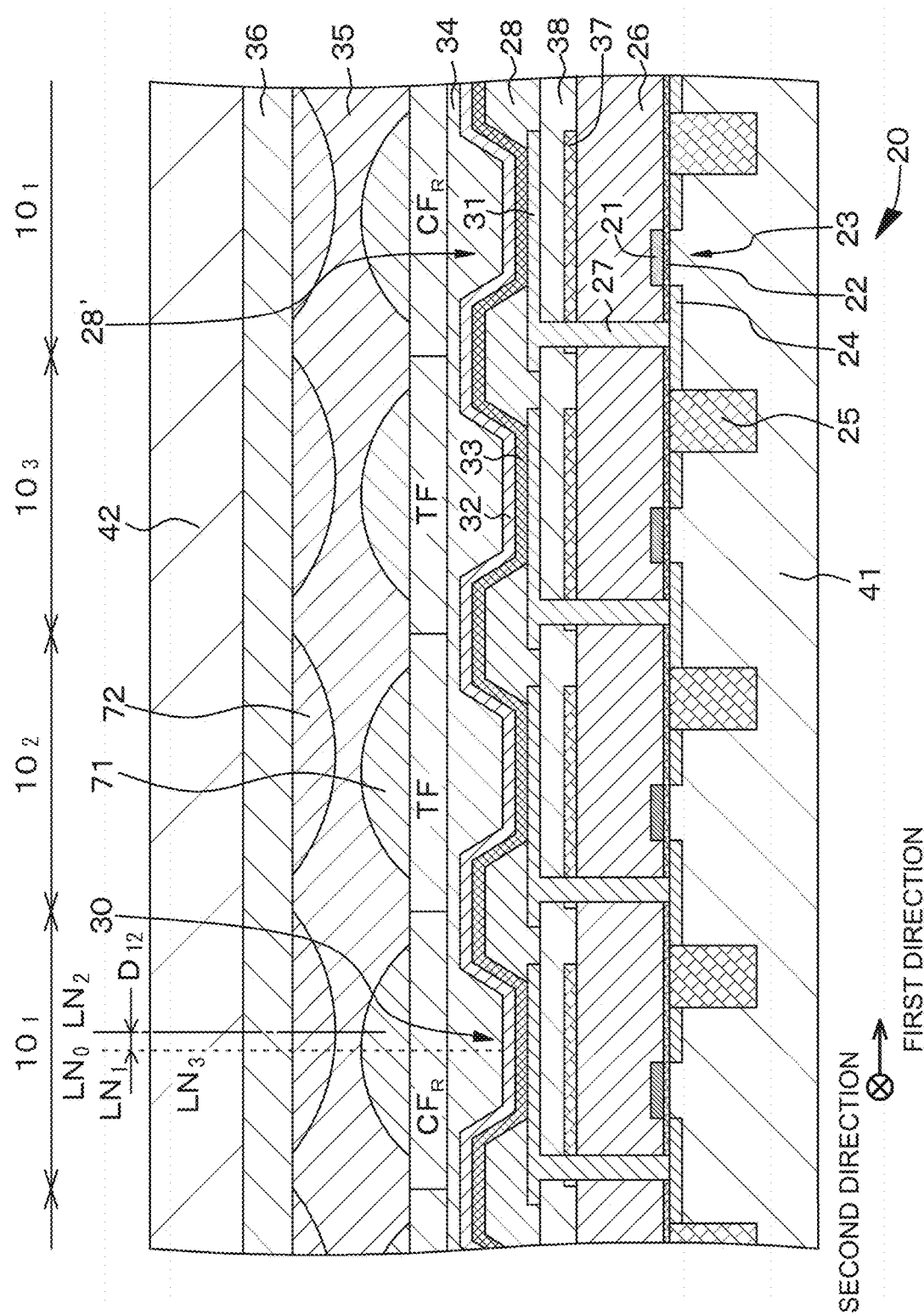
FIG. 23 is a schematic partial cross-sectional view of a display device of Example 3 (including a schematic partial cross-sectional view of a light-emitting element of Example 1).

That is, FIG. 23 illustrates a schematic partial cross-sectional view of the light-emitting element and the display device of Example 3. In the display device of Example 3,
  each light-emitting element 10 has a resonator structure,
  a first light-emitting element $10_1$ emits red light, a second light-emitting element $10_2$ emits green light, and a third light-emitting element $10_3$ emits blue light,
  the first light-emitting element $10_1$ is provided with a wavelength selector that transmits the emitted red light, and
  the second light-emitting element $10_2$ and the third light-emitting element $10_3$ are not provided with any wavelength selector.

Alternatively, the display device of Example 3 includes:
  a first substrate 41 and a second substrate 42; and
  a plurality of light-emitting element units each including a first light-emitting element $10_1$, a second light-emitting element $10_2$, and a third light-emitting element $10_3$, provided on the first substrate 41, in which each light-emitting element 10 includes a light-emitting part 30 provided above the first substrate 41, and each light-emitting element 10 has a resonator structure, and the first light-emitting element $10_1$ emits red light, the second light-emitting element $10_2$ emits green light, and the third light-emitting element $10_3$ emits blue light, the first light-emitting element $10_1$ is provided with a wavelength selector that transmits the emitted red light, and the second light-emitting element $10_2$ and the third light-emitting element $10_3$ are provided with no wavelength selectors.

Here, examples of the wavelength selector that transmits the emitted red light include a red color filter layer $CF_R$, but are not limited thereto. In the second light-emitting element $10_2$ and the third light-emitting element $10_3$, a transparent filter layer TF is provided instead of a color filter layer.

In each of the first light-emitting element $10_1$ to display red, the second light-emitting element $10_2$ to display green, and the third light-emitting element $10_3$ to display blue, the optimum $OL_1$ and $OL_2$ need to be determined based on the above-described Formulae (1-1) and (1-2), thereby enabling to obtain an emission spectrum having a sharp peak in each light-emitting element. The first light-emitting element $10_1$, the second light-emitting element $10_2$, and the third light-emitting element $10_3$ have the same configuration and structure, except for the color filter layer $CF_R$, the filter layer TF, and the resonator structure (the configuration of the light-emitting layer).

Incidentally, there may be a case where light having a wavelength $\lambda_R'$ shorter than $\lambda_R$ resonates in the resonator depending on the settings of $m_1$ and $m_2$, in addition to the maximum peak wavelength $\lambda_R$ (red) in the spectrum of the light produced in the light-emitting layer provided in the first light-emitting element $10_1$ to display red. Similarly, there may be a case where light having a wavelength $\lambda_G'$ shorter than $\lambda_G$ resonates in the resonator in addition to the maximum peak wavelength $\lambda_G$ (green) in the spectrum of the light produced in the light-emitting layer provided in the second light-emitting element $10_2$ to display green. Equally, there may be a case where light having a wavelength $\lambda_B'$ shorter than $\lambda_B$ resonates in the resonator in addition to the maximum peak wavelength $\lambda_B$ (blue) in the spectrum of the light produced in the light-emitting layer provided in the third light-emitting element $10_3$ to display blue. In general, light having the wavelengths $\lambda_G'$, or $\lambda_B'$ is out of the visible light range and thus is not observed by a display observer. However, there may be a case where light having the wavelength $\lambda_R'$ is observed as blue by a display observer.

Therefore, in such a case, there is no need to provide any wavelength selector for the second light-emitting element $10_2$ and the third light-emitting element $10_3$, but the first light-emitting element $10_1$ is preferably provided with a wavelength selector that transmits the emitted light. As a result of this, the first light-emitting element $10_1$ can display an image with high color purity, and an elevated luminous efficacy can be achieved in the second light-emitting element $10_2$ and the third light-emitting element $10_3$ since the second light-emitting element $10_2$ and the third light-emitting element $10_3$ are provided with no wavelength selectors.

Specifically, the resonator structure needs to include, as a material included in the first electrode 31, a material that reflects light with high efficiency as described above. In addition, in a case where the light reflection layer 37 is provided below the first electrode 31 (toward the first substrate 41 side), a transparent conductive material needs to be included as a material included in the first electrode 31 as described above. In a case where the light reflection layer 37 is provided on the substratum 26 and the first electrode 31 is provided on the interlayer insulating material layer 38 overlaying the light reflection layer 37, the first electrode 31, the light reflection layer 37, and the interlayer insulating material layer 38 need to include the above-described materials. The light reflection layer 37 may be connected to the contact hole (contact plug) 27 (see FIG. 23), or need not be connected thereto.

In some cases, instead of the filter layer TF, as a wavelength selector that transmits green light emitted in the second light-emitting element $10_2$, a green color filter layer $CF_G$ may be provided; or as a wavelength selector that transmits blue light emitted in the third light-emitting element $10_3$, a blue color filter layer $CF_B$ may be provided.

Hereinafter, the resonator structure will be described based on Examples 1 to 8 with reference to FIGS. 24A (First example), 24B (Second example), 25A (Third example), 25B (Fourth example), 26A (Fifth example), 26B (Sixth example), 27A (Seventh example), and 27B and 27C (Eighth example). Here, in the first to fourth examples and the seventh example, the first electrodes and the second electrodes have the same thickness among light-emitting parts. In contrast, in the fifth to sixth examples, the thicknesses of first electrodes are different from each other among light-emitting parts, and the thicknesses of the second electrodes are the same among light-emitting parts. In the eighth example, the thicknesses of first electrodes may be different from each other or may be the same among light-emitting parts, and the thicknesses of the second electrodes are the same among light-emitting parts.

Note that, in the following description, the light-emitting parts included in the first light-emitting element $10_1$, the second light-emitting element $10_2$, and the third light-emitting element $10_3$ are denoted by reference numerals $30_1$, $30_2$, and $30_3$, respectively, the first electrodes therein are denoted by reference numerals $31_1$, $31_2$, and $31_3$, respectively, the second electrodes therein are denoted by reference numerals $32_1$, $32_2$, and $32_3$, respectively, the organic layers therein are denoted by reference numerals $33_1$, $33_2$, and $33_3$, respectively, the light reflection layers therein are denoted by reference numerals $37_1$, $37_2$, and $37_3$, respectively, and the interlayer insulating material layers therein are denoted by reference numerals $38_1$, $38_2$, $38_3$, $38_1'$, $38_2'$, and $38_3'$, respectively. In the following description, materials used are illustrative, and can be modified appropriately.

In the illustrated examples, the lengths of the resonators in the first light-emitting element $10_1$, in the second light-emitting element $10_2$, and in the third light-emitting element $10_3$, derived from Formulae (1-1) and (1-2) are decreasing in the order of the first light-emitting element $10_1$, the second light-emitting element $10_2$, and the third light-emitting element $10_3$, that is, the value of the $SD_{12}$ is decreasing in the order of the first light-emitting element $10_1$, the second light-emitting element $10_2$, and the third light-emitting element $10_3$, but the lengths of the resonators are not limited thereto, and the values of $m_1$ and $m_2$ need to be appropriately set in order to determine the optimum length of the resonator.

Figure 24A:
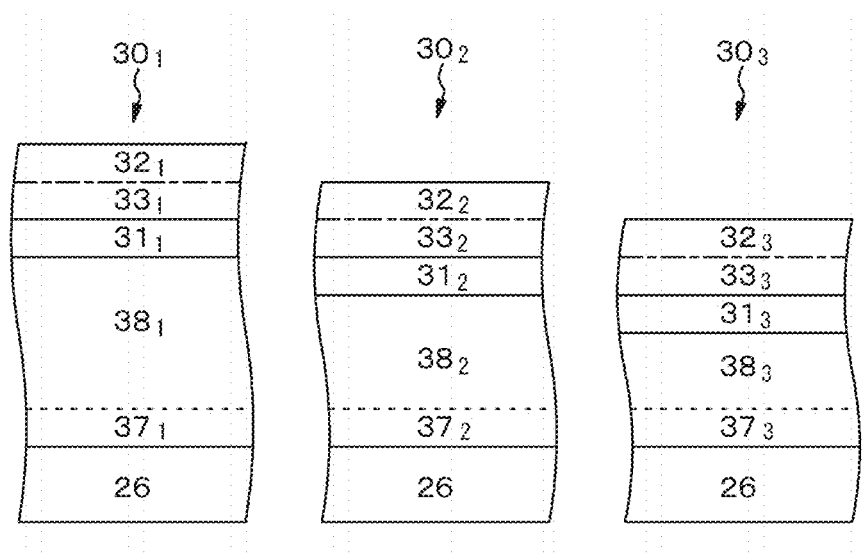
FIG. 24A is a conceptual diagram of a light-emitting element having a first example and a second example of a resonator structure in Example 3.
Figure 24B:
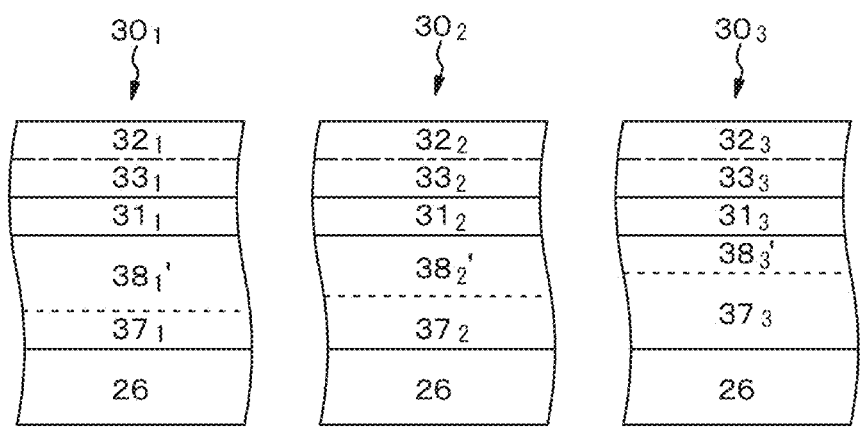
FIG. 24B is a conceptual diagram of a light-emitting element having the first example and the second example of the resonator structure in Example 3.
Figure 25A:
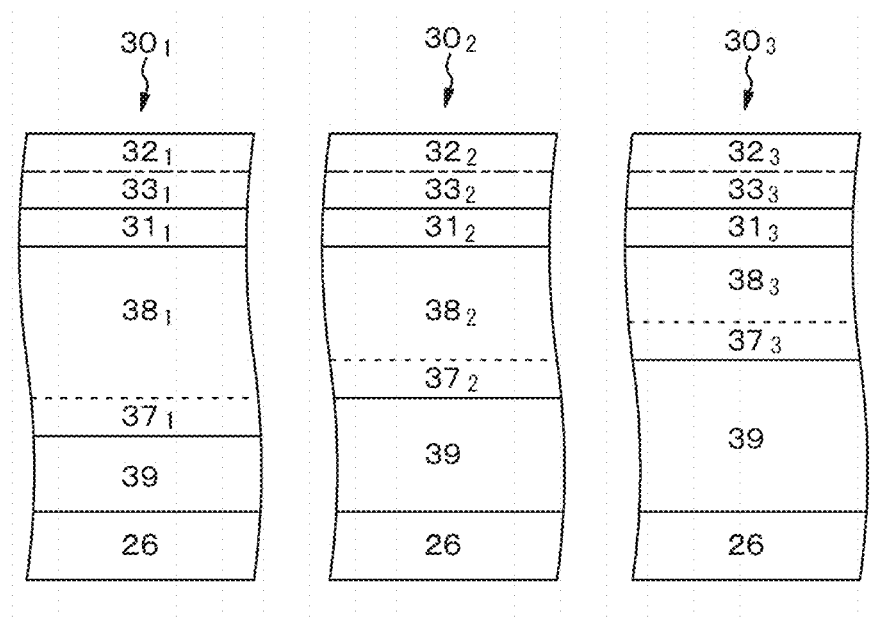
FIG. 25A is a conceptual diagram of a light-emitting element having a third example and a fourth example of a resonator structure in Example 3.
Figure 25B:
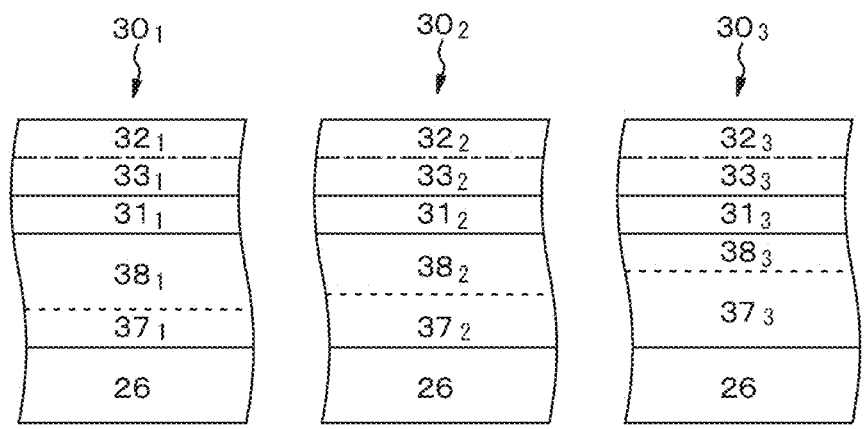
FIG. 25B is a conceptual diagram of a light-emitting element having the third example and the fourth example of the resonator structure in Example 3.
Figure 26A:
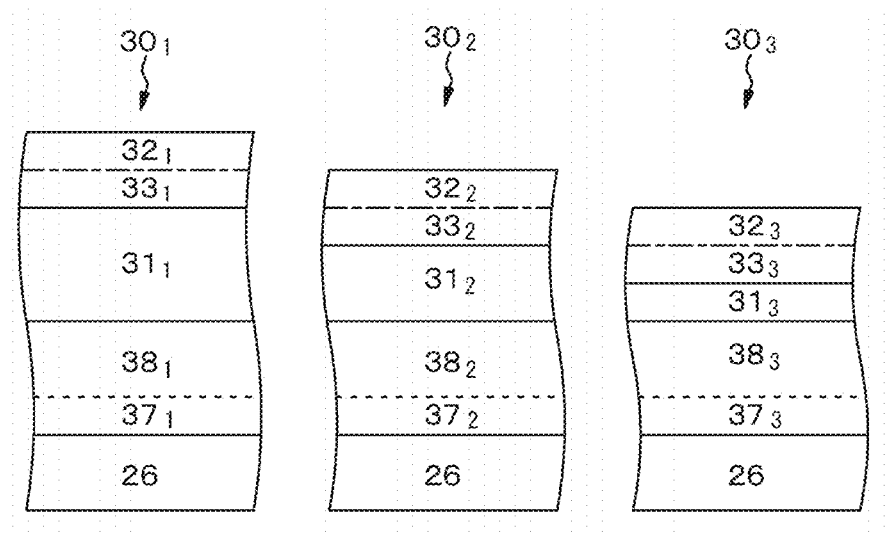
FIG. 26A is a conceptual diagram of a light-emitting element having a fifth example and a sixth example of the resonator structure in Example 3.
Figure 26B:
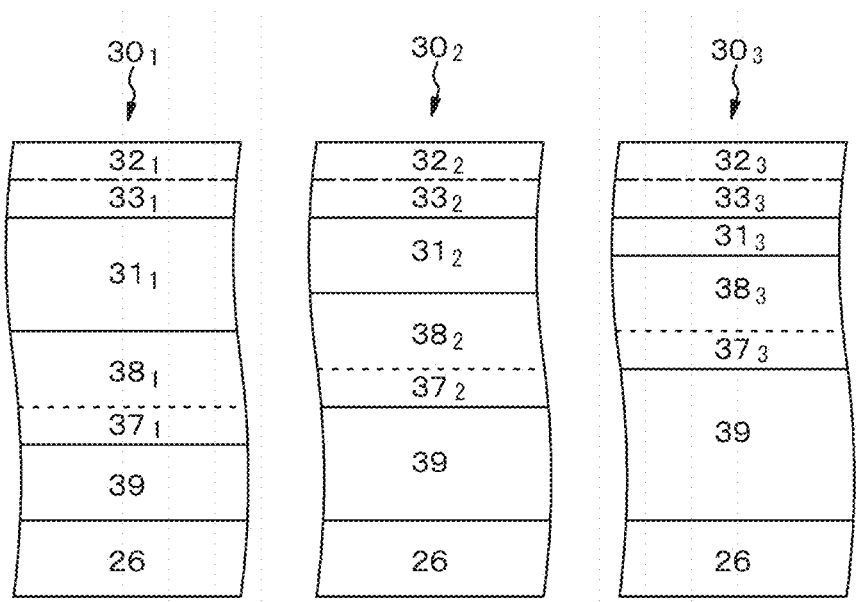
FIG. 26B is a conceptual diagram of a light-emitting element having the fifth example and the sixth example of the resonator structure in Example 3.
Figure 27A:
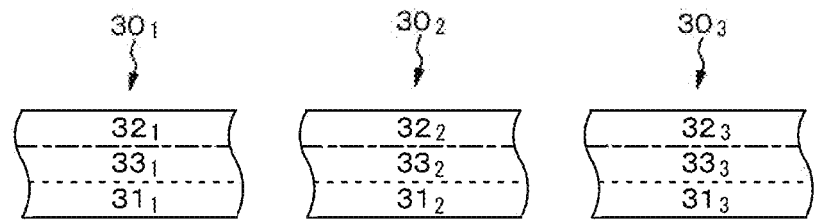
FIG. 27A is a conceptual diagram of a light-emitting element having a seventh example of the resonator structure in Example 3.
Figure 27B:
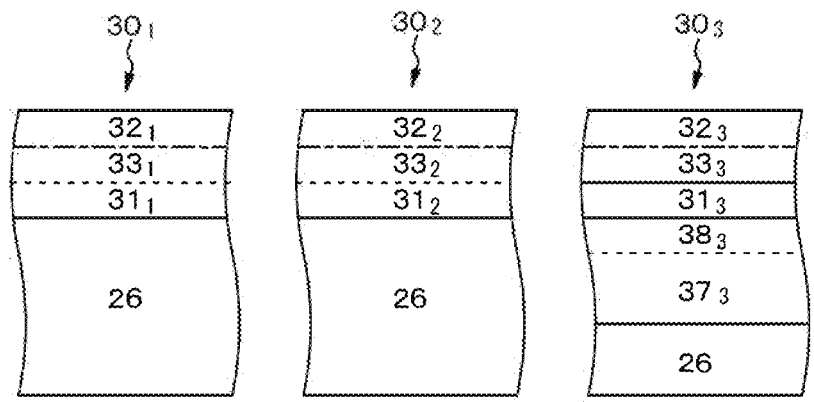
FIG. 27B is a conceptual diagram of a light-emitting element having an eighth example of the resonator structure in Example 3.
Figure 27C:
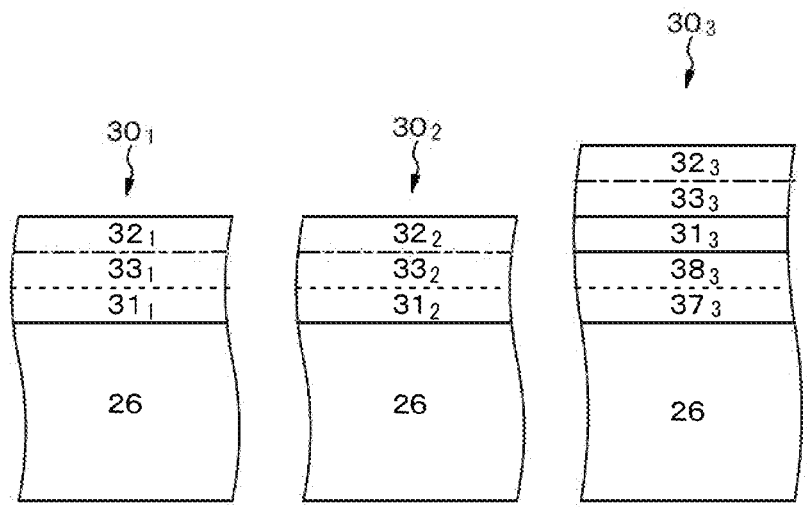
FIG. 27C is a conceptual diagram of a light-emitting element having the eighth example of the resonator structure in Example 3.

FIG. 24A illustrates a conceptual diagram of a light-emitting element having a first example of a resonator structure, FIG. 24B illustrates a conceptual diagram of a light-emitting element having a second example of a resonator structure, FIG. 25A illustrates a conceptual diagram of a light-emitting element having a third example of a resonator structure, and FIG. 25B illustrates a conceptual diagram of a light-emitting element having a fourth example of a resonator structure. In some of the first to sixth examples and the eighth example, an interlayer insulating material layers 38 and 38' are formed under a first electrode 31 of a light-emitting part 30, and a light reflection layer 37 is formed under the interlayer insulating material layers 38 and 38'. In the first to fourth examples, the thicknesses of the interlayer insulating material layers 38 and 38' are different from each other among the light-emitting part $30_1$, $30_2$, and $30_3$. The thicknesses of the interlayer insulating material layers $38_1$, $38_2$, $38_3$, $38_1'$, $38_2'$, and $38_3'$ are appropriately set, thereby enabling to set an optical distance at which optimum resonance is created with respect to the emission wavelength of the light-emitting part 30.

In the first example, the first interfaces (indicated by dotted lines in the drawings) are at the same level among the light-emitting parts $30_1$, $30_2$, and $30_3$, while the levels of the second interfaces (indicated by alternate long and short dash lines in the drawings) are different from each other among the light-emitting parts $30_1$, $30_2$, and $30_3$. In the second example, the first interfaces are at different levels among the light-emitting parts $30_1$, $30_2$, and $30_3$, while the levels of the second interfaces are the same among the light-emitting parts $30_1$, $30_2$, and $30_3$.

In the second example, the interlayer insulating material layers $38_1'$, $38_2'$, and $38_3'$ includes an oxide film as an oxidized surface of the light reflection layer 37. The interlayer insulating material layer 38' made of the oxide film includes, for example, aluminum oxide, tantalum oxide, titanium oxide, magnesium oxide, zirconium oxide, or the like in accordance with the material included in the light reflection layer 37. The oxidization of the surface of the light reflection layer 37 can be carried out by, for example, the following method. That is, a first substrate 41 having a light reflection layer 37 formed is immersed into an electrolytic solution filled in a vessel. A cathode is placed so as to face the light reflection layer 37. Subsequently, the light reflection layer 37 is used as an anode thereby anodizing the light reflection layer 37. The thickness of the oxide film formed by the anodization is proportional to the potential difference between the cathode and the light reflection layer 37 as the anode. Therefore, the anodization is carried out in a state where voltages corresponding to the light-emitting part $30_1$, $30_2$, and $30_3$ are applied to the light reflection layers $37_1$, $37_2$, and $37_3$, respectively. As a result, the interlayer insulating material layers $38_1'$, $38_2'$, and $38_3'$ including oxide films having different thicknesses can be formed all at once on the surface of the light reflection layer 37. The thicknesses of the light reflection layers $37_1$, $37_2$, and $37_3$ and the thicknesses of the interlayer insulating material layers $38_1'$, $38_2'$, and $38_3'$ vary among the light-emitting parts $30_1$, $30_2$, $30_3$.

In the third example, an underlying film 39 is disposed under the light reflection layer 37, and the underlying films 39 have different thicknesses among the light-emitting parts $30_1$, $30_2$, and $30_3$. That is, in the illustrated example, the thicknesses of the underlying films 39 are increasing in the order of the light-emitting part $30_1$, the light-emitting part $30_2$, and the light-emitting part $30_3$.

In the fourth example, the thicknesses of the light reflection layers $37_1$, $37_2$, and $37_3$ at the time of film formation are different among the light-emitting parts $30_1$, $30_2$, and $30_3$. In the third to fourth examples, the second interfaces are at the same level among the light-emitting parts $30_1$, $30_2$, and $30_3$, while the levels of the first interfaces are different among the light-emitting parts $30_1$, $30_2$, and $30_3$.

In the fifth to sixth examples, the thicknesses of the first electrodes 311, 312, and 313 are different among the light-emitting part $30_1$, $30_2$, and $30_3$. The light reflection layers 37 have the same thickness among the light-emitting parts 30.

In the fifth example, the levels of the first interfaces are the same among the light-emitting parts $30_1$, $30_2$, and $30_3$, while the levels of the second interfaces are different among the light-emitting parts $30_1$, $30_2$, and $30_3$.

In the sixth example, an underlying film 39 is disposed under the light reflection layer 37, and the underlying films 39 have different thicknesses among the light-emitting parts $30_1$, $30_2$, and $30_3$. That is, in the illustrated example, the thicknesses of the underlying films 39 are increasing in the order of the light-emitting part $30_1$, the light-emitting part $30_2$, and the light-emitting part $30_3$. In the sixth example, the second interfaces are at the same level among the light-emitting parts $30_1$, $30_2$, and $30_3$, while the levels of the first interfaces are different among the light-emitting parts $30_1$, $30_2$, and $30_3$.

In the seventh example, the first electrodes $31_1$, $31_2$, and $31_3$ each also serve as a light reflection layer, and the optical constants (specifically, the phase shift amounts) of the materials included in the first electrodes $31_1$, $31_2$, and $31_3$ are different among the light-emitting parts $30_1$, $30_2$, and $30_3$. For example, the first electrode $31_1$ of the light-emitting part $30_1$ can be made of copper (Cu), and the first electrode $31_2$ of the light-emitting part $30_2$ and the first electrode $31_3$ of the light-emitting part $30_3$ can be made of aluminum (Al).

In the eighth example, the first electrodes $31_1$, and $31_2$ each also serve as a light reflection layer, and the optical constants (specifically, the phase shift amounts) of the materials included in the first electrodes $31_1$, and $31_2$ are different among the light-emitting parts $30_1$, and $30_2$. For example, the first electrode $31_1$ of the light-emitting part $30_1$ can be made of copper (Cu), and the first electrode $31_2$ of the light-emitting part $30_2$ and the first electrode $31_3$ of the light-emitting part $30_3$ can be made of aluminum (Al). In the eighth example, for example, the seventh example is applied to the light-emitting parts $30_1$, and $30_2$, and the first example is applied to the light-emitting part $30_3$. The thicknesses of the first electrodes $31_1$, $31_2$, and $31_3$ may be different from each other, or may be the same.

Example 4

Figure 28:
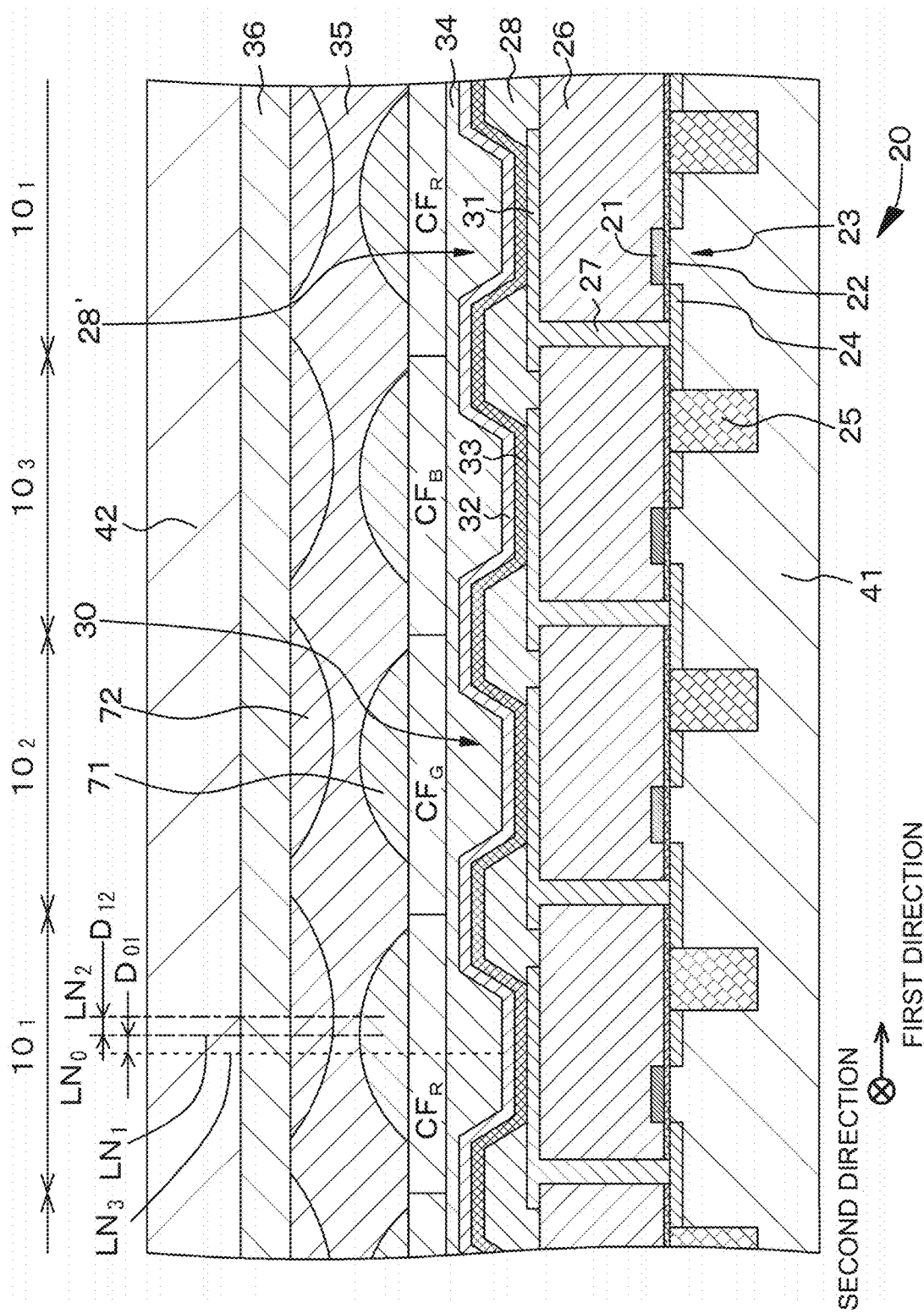
FIG. 28 is a schematic partial cross-sectional view of a light-emitting element and a display device of Example 4.

Example 4 is a modification of Examples 1 to 3. FIG. 28 illustrates a schematic partial cross-sectional view of a light-emitting element and a display device of Example 4.

In Example 4, an arrangement relationship among a light-emitting region, a wavelength selector, and a first optical path control unit will be described. Here, a light-emitting element having the value of the distance $D_{01}$ being not 0 can be in:

(a) a configuration in which the normal line $LN_3$ passing through the center of the wavelength selector coincides with the normal line $LN_0$ passing through the center of the light-emitting region;

(b) a configuration in which the normal line $LN_3$ passing through the center of the wavelength selector coincides with the normal line $LN_1$ passing through the center of the first optical path control unit; or (c) a configuration in which the normal line $LN_3$ passing through the center of the wavelength selector does not coincide with the normal line $LN_0$ passing through the center of the light-emitting region, and the normal line $LN_3$ passing through the center of the wavelength selector does not coincide with the normal line $LN_1$ passing through the center of the first optical path control unit. By adopting the configuration of (b) or the latter configuration of (c), the occurrence of color mixing between adjacent light-emitting elements can be reliably suppressed.

Figure 29A:
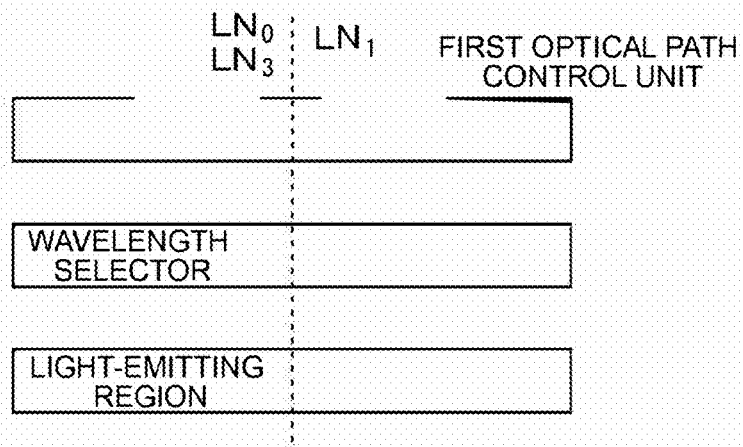
FIG. 29A is a conceptual diagram for describing a relationship among a normal line $LN_0$ passing through the center of a light-emitting region, a normal line $LN_1$ passing through the center of a first optical path control unit, and a normal line $LN_3$ passing through the center of a wavelength selector in a display device of Example 4.

As illustrated in the conceptual diagram of FIG. 29A, there may be a case where the normal line $LN_0$ passing through the center of the light-emitting region, the normal line $LN_3$ passing through the center of the wavelength selector, and the normal line $LN_1$ passing through the center of the first optical path control unit 71 coincide with each other. That is, $D_{01}=d_0=0$. Note that, as described above, $d_0$ is the distance (offset amount) between the normal line $LN_0$ passing through the center of the light-emitting region and the normal line $LN_3$ passing through the center of the wavelength selector.

For example, in a case where one pixel includes three subpixels, the values of $d_0$ and $D_{01}$ may be the same value among three subpixels included in one pixel, may be the same value between two subpixels except one subpixel, or may be different values among three subpixels.

Figure 29B:
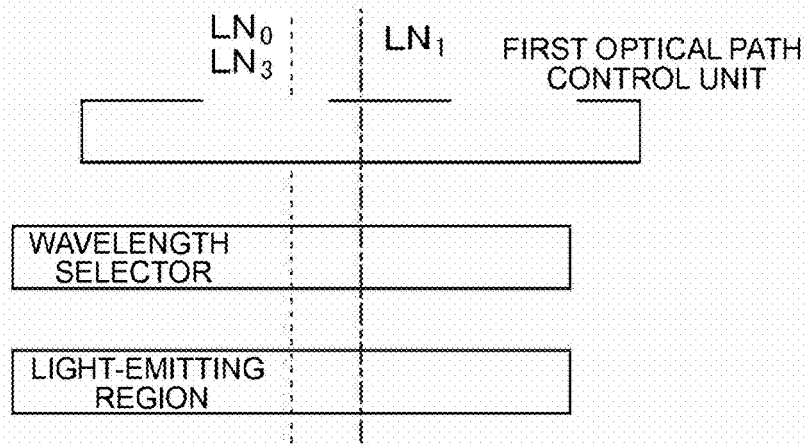
FIG. 29B is a conceptual diagram for describing a relationship among a normal line $LN_0$ passing through the center of the light-emitting region, a normal line $LN_1$ passing through the center of the first optical path control unit, and a normal line $LN_3$ passing through the center of the wavelength selector in the display device of Example 4.

Moreover, as illustrated in the conceptual diagram of FIG. 29B, there may be a case where the normal line $LN_0$ passing through the center of the light-emitting region coincides with the normal line $LN_3$ passing through the center of the wavelength selector, but the normal line $LN_0$ passing through the center of the light-emitting region and the normal line $LN_3$ passing through the center of the wavelength selector each $d_0$ not coincide with the normal line $LN_1$ passing through the center of the first optical path control unit 71. That is, $D_{01} \neq d_0 = 0$.

Figure 29C:
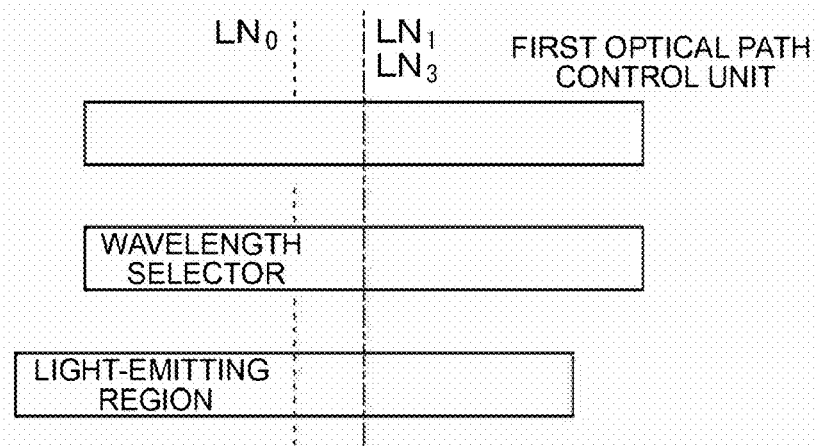
FIG. 29C is a conceptual diagram for describing a relationship among a normal line $LN_0$ passing through the center of the light-emitting region, a normal line $LN_1$ passing through the center of the first optical path control unit, and a normal line $LN_3$ passing through the center of the wavelength selector in the display device of Example 4.

Furthermore, as illustrated in the conceptual diagram of FIG. 29C, there may be a case where the normal line $LN_0$ passing through the center of the light-emitting region does not coincide with each of the normal line $LN_3$ passing through the center of the wavelength selector and the normal line $LN_1$ passing through the center of the first optical path control unit 71, and the normal line $LN_3$ passing through the center of the wavelength selector coincides with the normal line $LN_1$ passing through the center of the first optical path control unit 71. That is, $D_{01}=d_0>0$.

Figure 30:
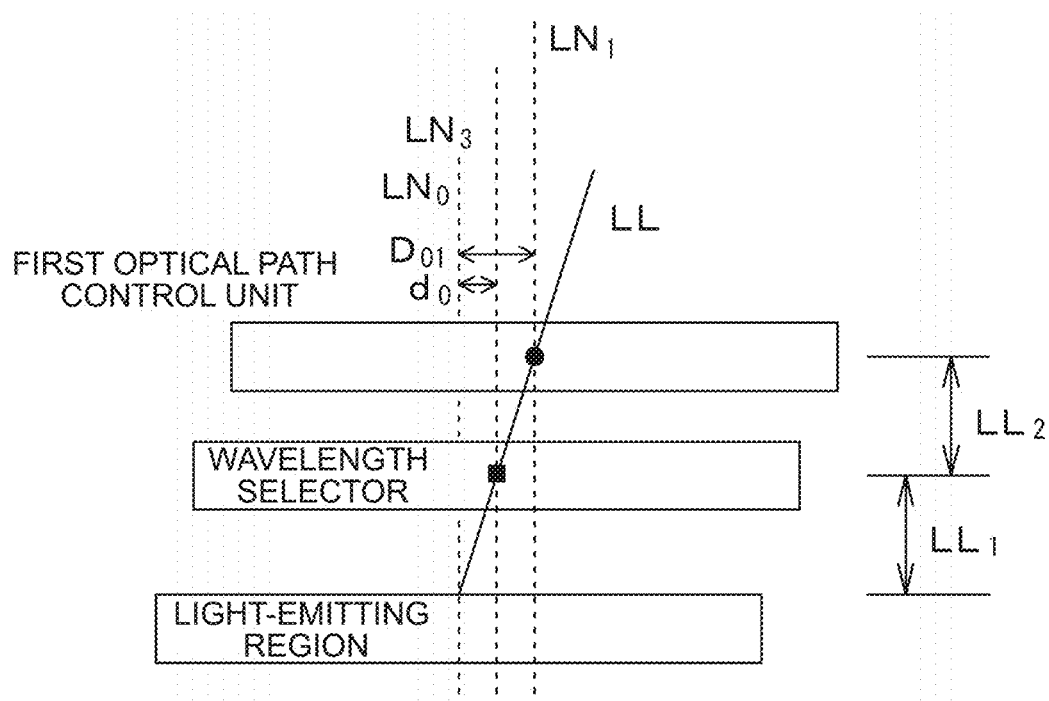
FIG. 30 is a conceptual diagram for describing a relationship among a normal line $LN_0$ passing through the center of the light-emitting region, a normal line $LN_1$ passing through the center of the first optical path control unit, and a normal line $LN_3$ passing through the center of the wavelength selector in the display device of Example 4.

In addition, as illustrated in the conceptual diagram of FIG. 30, there may be a case where the normal line $LN_0$ passing through the center of the light-emitting region does not coincide with each of the normal line $LN_3$ passing through the center of the wavelength selector and the normal line $LN_1$ passing through the center of the first optical path control unit 71, and the normal line $LN_1$ passing through the center of the first optical path control unit 71 does not coincide with each of the normal line $LN_0$ passing through the center of the light-emitting region and the normal line $LN_3$ passing through the center of the wavelength selector. Here, the center (indicated by the black square in FIG. 30) of the wavelength selector is preferably located on the straight line LL connecting the center (indicated by the black circle in FIG. 30) of the light-emitting region and the center of the first optical path control unit 71. Specifically, when the distance in the thickness direction from the center of the light-emitting region to the center of the wavelength selector is denoted by $LL_1$, and a distance in the thickness direction from the center of the wavelength selector to the center of the first optical path control unit 71 is denoted by $LL_2$, then $$D_{01}>d_0>0$$

is satisfied, and in consideration of manufacturing variations, $$d_0:D_{01}=LL_1:(LL_1+LL_2)$$

is preferably satisfied.

Figure 31A:
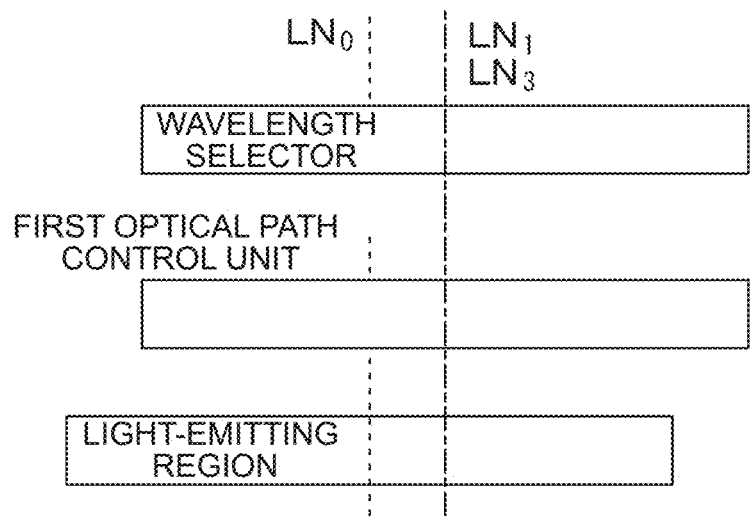
FIG. 31A is a conceptual diagram for describing a relationship among a normal line $LN_0$ passing through a center of a light-emitting region, a normal line $LN_1$ passing through a center of a first optical path control unit, and a normal line $LN_3$ passing through a center of a wavelength selector in a display device of Example 4.

Alternatively, as illustrated in the conceptual diagram of FIG. 31A, there may be a case where the normal line $LN_0$ passing through the center of the light-emitting region, the normal line $LN_3$ passing through the center of the wavelength selector, and the normal line $LN_1$ passing through the center of the first optical path control unit 71 coincide with each other. That is, $D_{01}=d_0=0$.

Figure 31B:
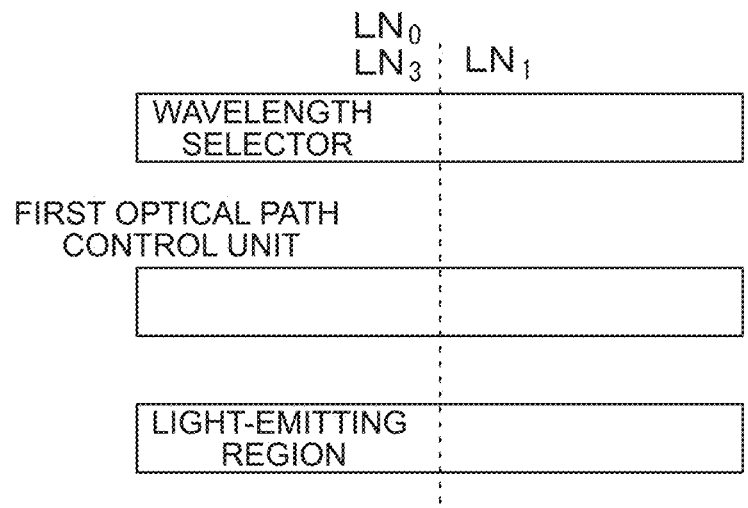
FIG. 31B is a conceptual diagram for describing a relationship among a normal line $LN_0$ passing through the center of the light-emitting region, a normal line $LN_1$ passing through the center of the first optical path control unit, and a normal line $LN_3$ passing through the center of the wavelength selector in the display device of Example 4.

In addition, as illustrated in the conceptual diagram of FIG. 31B, there may be a case where the normal line $LN_0$ passing through the center of the light-emitting region does not coincide with each of the normal line $LN_3$ passing through the center of the wavelength selector and the normal line $LN_1$ passing through the center of the first optical path control unit 71, and the normal line $LN_3$ passing through the center of the wavelength selector coincides with the normal line $LN_1$ passing through the center of the first optical path control unit 71. That is, $$D_{01}=d_0>0.$$

Figure 32:
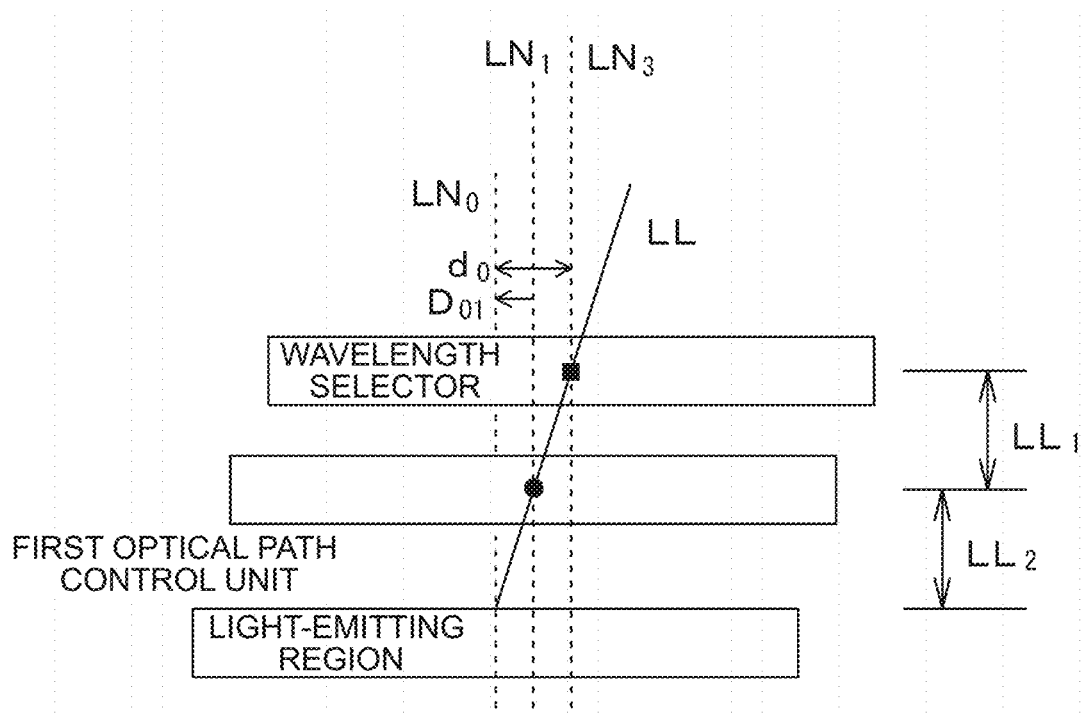
FIG. 32 is a conceptual diagram for describing a relationship among a normal line $LN_0$ passing through the center of the light-emitting region, a normal line $LN_1$ passing through the center of the first optical path control unit, and a normal line $LN_3$ passing through the center of the wavelength selector in the display device of Example 4.

Furthermore, as illustrated in the conceptual diagram of FIG. 32, there may be a case where the normal line $LN_0$ passing through the center of the light-emitting region does not coincide with each of the normal line $LN_3$ passing through the center of the wavelength selector and the normal line $LN_1$ passing through the center of the first optical path control unit 71, and the normal line $LN_1$ passing through the center of the first optical path control unit 71 does not coincide with each of the normal line $LN_0$ passing through the center of the light-emitting region and the normal line $LN_3$ passing through the center of the wavelength selector. Here, the center of the wavelength selector is preferably located on the straight line LL connecting the center of the light-emitting region and the center of the first optical path control unit 71. Specifically, when the distance in the thickness direction from the center of the light-emitting region to the center (indicated by a black square in FIG. 32) of the wavelength selector is denoted by $LL_1$, and the distance in the thickness direction from the center of the wavelength selector to the center (indicated by a black circle in FIG. 32) of the first optical path control unit 71 is denoted by $LL_2$, $$d_0>D_{01}>0$$

is satisfied, and in consideration of manufacturing variations, $$D_{01}:d_0=LL_2:(LL_1+LL_2)$$

is preferably satisfied.

Example 5

Figure 33:
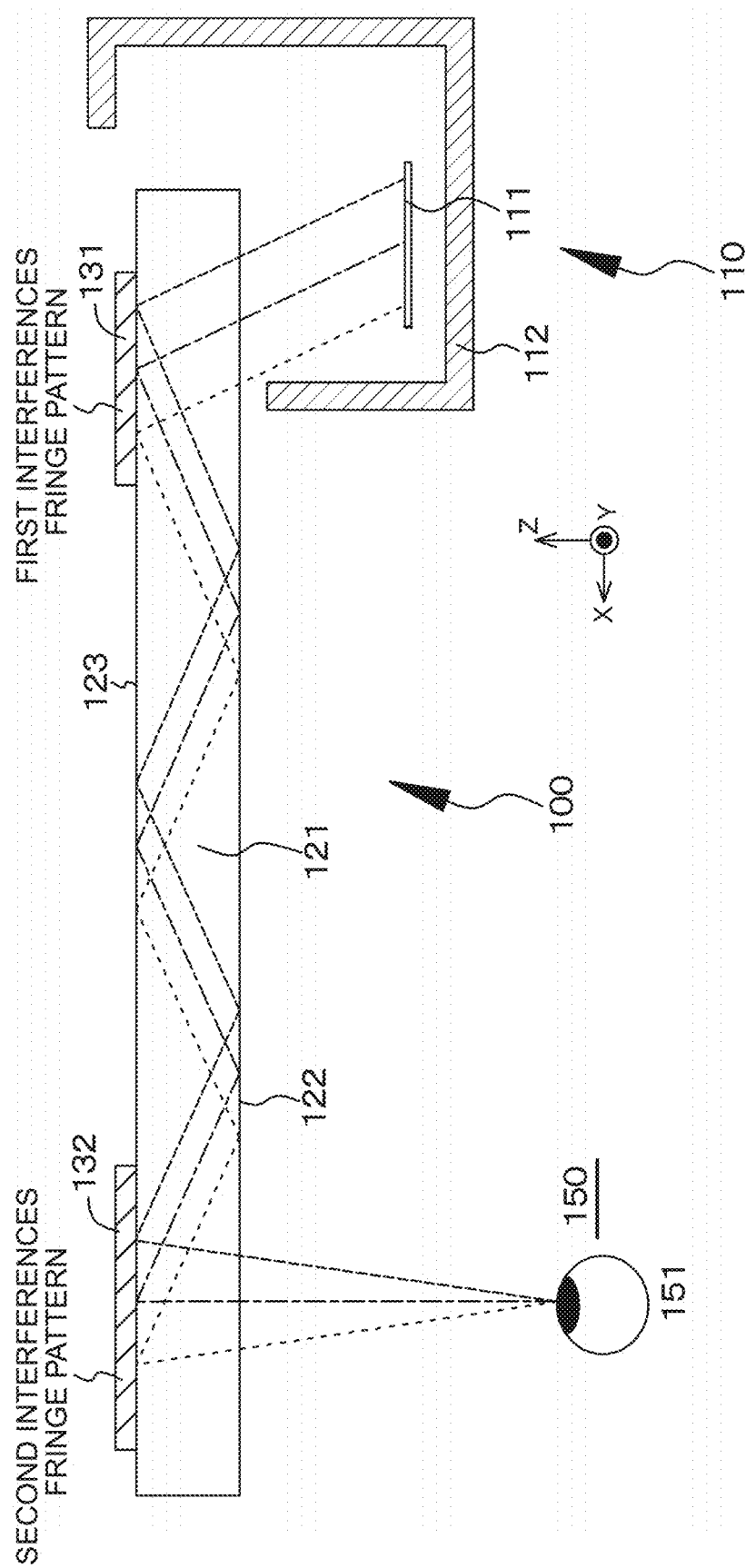
FIG. 33 is a conceptual diagram of an image display device as a component of a head-mounted display of Example 5.
Figure 34:
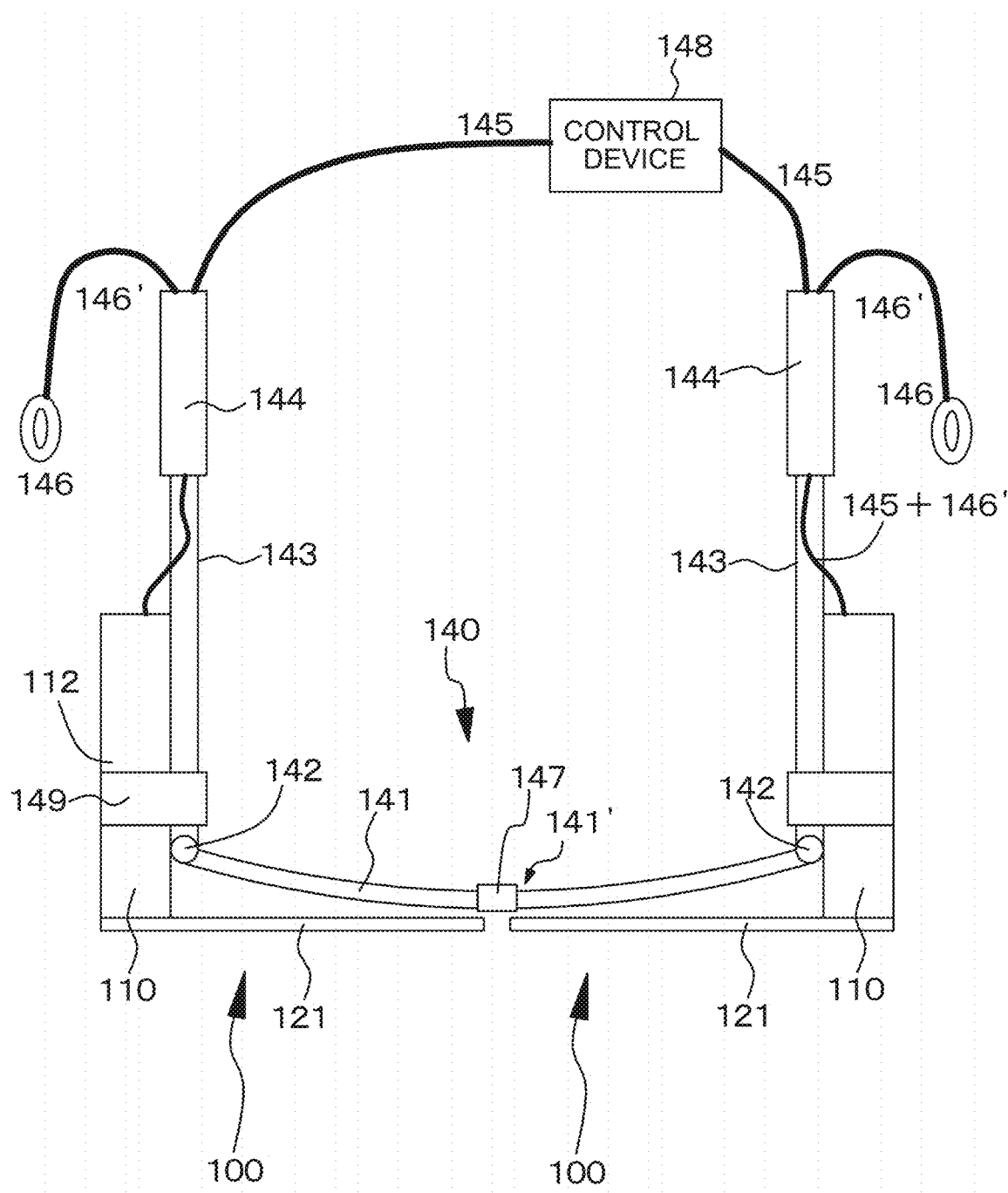
FIG. 34 is a schematic diagram of a head-mounted display of Example 5 as viewed from above.
Figure 35:
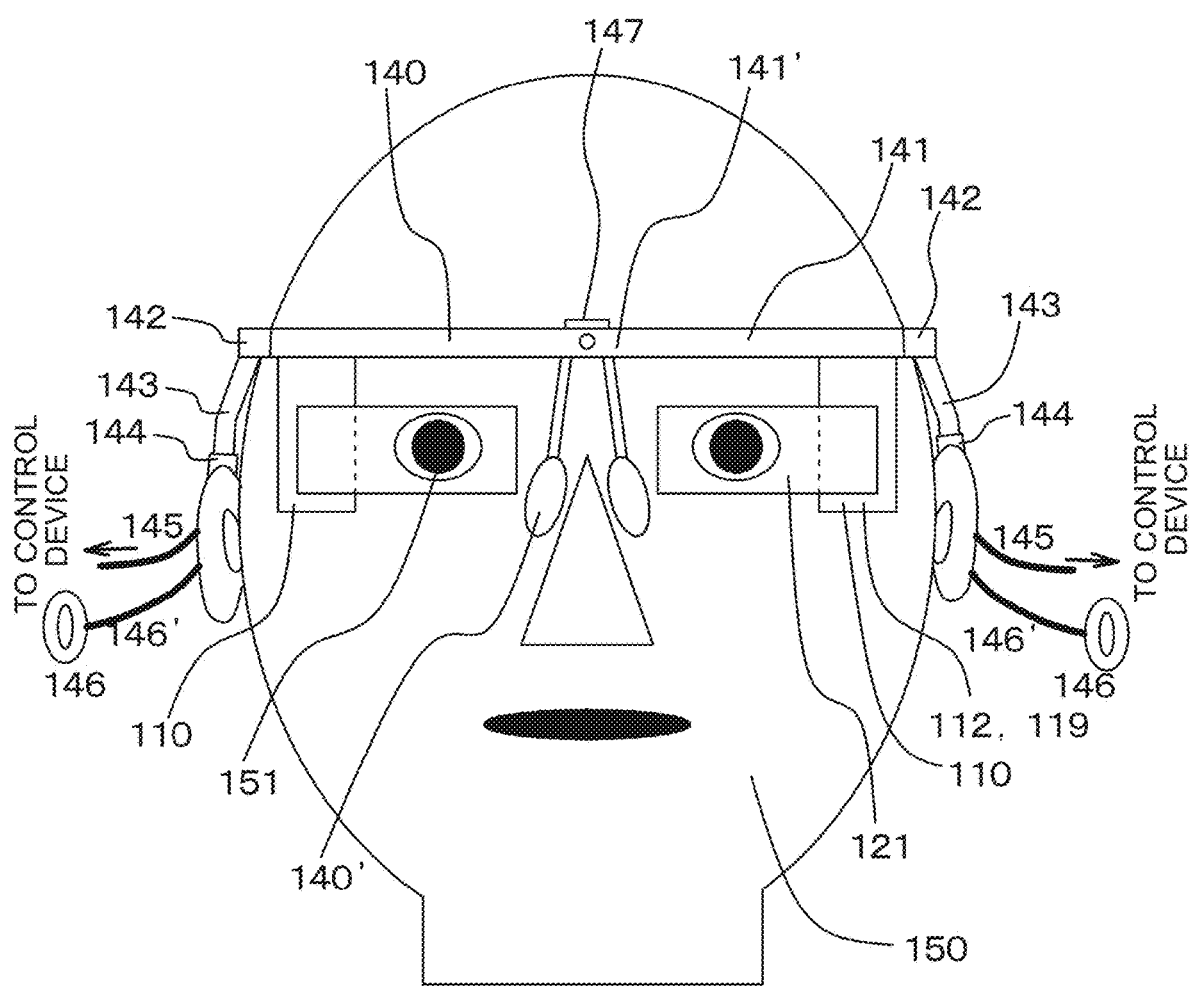
FIG. 35 is a schematic diagram of a head-mounted display of Example 5 as viewed from the front.
Figure 36A:
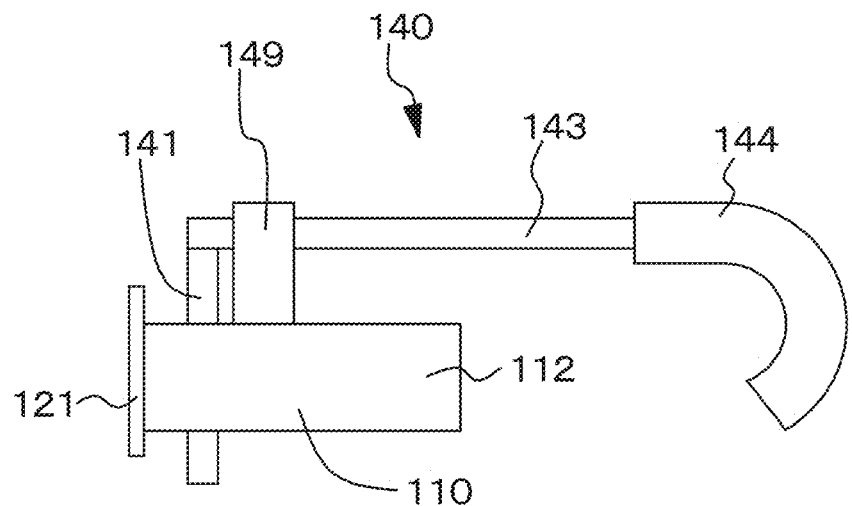
FIG. 36A is a schematic diagram of a head-mounted display of Example 5 as viewed from the side, and is a schematic cross-sectional view illustrating a part of a reflection-type volume hologram diffraction grating in the head-mounted display of Example 5 in an enlarged manner, respectively.
Figure 36B:
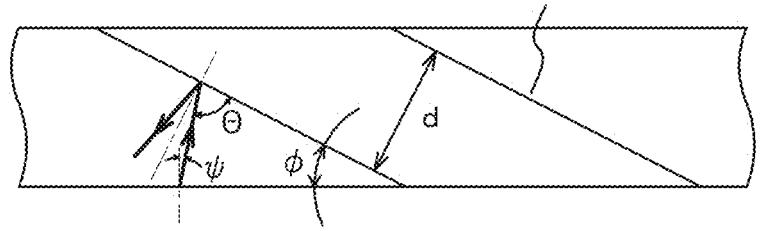
FIG. 36B is a schematic diagram of the head-mounted display of Example 5 as viewed from the side, and is a schematic cross-sectional view illustrating a part of a reflection-type volume hologram diffraction grating in the head-mounted display of Example 5 in an enlarged manner, respectively.

In Example 5, the display device described in Examples 1 to 4 is applied to a head-mounted display (HMD). FIG. 33 illustrates a conceptual diagram of an image display device included in the head-mounted display of Example 5, FIG. 34 illustrates a schematic diagram of the head-mounted display of Example 5 as viewed from above, FIG. 35 illustrates a schematic diagram of the head-mounted display of Example 5 as viewed from the front, and FIG. 36A illustrates a schematic diagram of the head-mounted display of Example 5 as viewed from the side. In addition, FIG. 36B illustrates an enlarged schematic partial cross-sectional view illustrating a part of the reflection-type volume hologram diffraction grating in the display device of Example 5.

An image display device 100 of Example 5 includes:
an image forming device 110 including the display device 111 described in Example 1 to Example 4;
a light guide plate 121;

a first deflection unit 131 attached to the light guide plate 121; and a second deflection unit 132 attached to the light guide plate 121, in which the light from the image forming device 110 is deflected (or reflected) at the first deflection unit 131, propagates through the inside of the light guide plate 121 by total reflection, is deflected at the second deflection unit 132, and is outputted toward the pupil 151 of an observer 150.

The system including the light guide plate 121 and the second deflection unit 132 is a semi-transparent type (see-through type) system.

A head-mounted display of Example 5 includes: (A) a frame 140 (e.g., spectacles-type frame 140) to be worn on the head of an observer 150; and (B) an image display device 100 attached to the frame 140. Note that the head-mounted display of Example 5 is specifically a binocular head-mounted display provided with two image display devices, but may be a monocular head-mounted display provided with one image display device. The image display device 100 may be fixedly attached to the frame, or may be detachably attached to the frame 140. The head-mounted display is, for example, a direct drawing type head-mounted display that draws an image directly onto the pupil 151 of the observer 150.

The light guide plate 121 has: a first surface 122 to which light from the image forming device 110 enters; and a second surface 123 opposing to the first surface 122. That is, the light guide plate 121 made of an optical glass or a plastic material has two parallel surfaces (the first surface 122 and the second surface 123) extending in parallel with the light propagation direction (X direction) by the total internal reflection of the light guide plate 121. The first surface 122 and the second surface 123 oppose each other. Furthermore, the first deflection unit 131 is disposed (specifically, laminated) on the second surface 123 of the light guide plate 121, and the second deflection unit 132 is disposed (specifically, laminated) on the second surface 123 of the light guide plate 121.

The first deflection unit (first diffraction grating member) 131 includes a hologram diffraction grating, specifically, a reflection-type volume hologram diffraction grating, and the second deflection unit (second diffraction grating member) 132 also includes a hologram diffraction grating, specifically, a reflection-type volume hologram diffraction grating. A first interference fringe pattern is formed inside the hologram diffraction grating included in the first deflection unit 131, and a second interference fringe pattern is formed inside the hologram diffraction grating included in the second deflection unit 132.

The first deflection unit 131 causes a diffraction and reflection in such a way that the parallel light that enters into the light guide plate 121 from the second surface 123 is totally reflected inside the light guide plate 121. The second deflection unit 132 diffracts and reflects the light that has propagated inside the light guide plate 121 by total reflection, and guides the light to the pupil 151 of the observer 150. A virtual image forming region on the light guide plate 121 is formed by the second deflection unit 132. The axes of the first deflection unit 131 and of the second deflection unit 132 each are parallel to the X direction, and the normal lines thereof each are parallel to the Z direction. In each reflection-type volume hologram diffraction grating made of a photopolymer material, an interference fringe pattern corresponding to one type of wavelength band (or the wavelength) is formed, and the reflection-type volume hologram diffraction grating is manufactured by a conventional method. The pitch of the interference fringe pattern formed in the reflection-type volume hologram diffraction grating is constant, and the interference fringe pattern is linear and parallel to the Y direction.

FIG. 36B is an enlarged schematic partial cross-sectional view of the reflection-type volume hologram diffraction grating. In the reflection-type volume hologram diffraction grating, an interference fringe pattern having an inclination angle (slant angle) ϕ is formed. Here, the inclination angle ϕ refers to an angle between the surface of the reflection-type volume hologram diffraction grating and the interference fringe pattern. The interference fringe pattern is formed extending from the inside to the surface of the reflection-type volume hologram diffraction grating. The interference fringe pattern satisfies Bragg condition. Here, Bragg condition refers to a condition that satisfies the following Formula (A). In Formula (A), m represents a positive integer, λ represents a wavelength, d represents a lattice plane pitch (a spacing in the normal direction of a virtual plane including an interference fringe pattern), and Θ represents the complementary angle of an angle incident on the interference fringe pattern. In addition, in a case where light enters the diffraction grating member at an incident angle ψ, the relationship among Θ, an inclination angle ϕ, and the incident angle ψ is as indicated in Formula (B).

$$m \cdot \lambda = 2 \cdot d \cdot \sin(\Theta) \tag{A}$$

$$\Theta = 90° - (\phi + \psi) \tag{B}$$

In Example 5, the display device 111 included in the image forming device 110 includes the display device of Examples 1 to 4. The entirety of the image forming device 110 is accommodated in a housing 112. Note that, an optical system through which an image outputted from the display device 111 passes may be disposed in order to control a display dimension, a display position, and the like of the image outputted from the display device 111. The type of optical system to be disposed is in accordance with specifications required for the head-mounted display and the image forming device 110. In a head-mounted display or an image forming device in a form of sending an image from one display device 111 to both eyes, the display device of Examples 1 to 4 can be adopted.

A frame 140 includes: a front portion 141 disposed in front of an observer 150; two temple parts 143 rotatably attached to both ends of the front portion 141 via hinges 142; and temple tip parts (also called tip, ear contact, or ear pad) 144 attached to the distal end portion of each of the temple parts 143. Moreover, a nose pad 140' is attached. That is, basically, the assembly of the frame 140 and the nose pad 140' has approximately the same structure as ordinary spectacles. Furthermore, each housing 112 is attached to the temple part 143 by an attachment member 149. The frame 140 is made of a metal or a plastic material. Note that each housing 112 may be detachably attached to the temple part 143 with use of the attachment member 149. In addition, for an observer who owns and wears spectacles, each housing 112 may be detachably attached to the temple part 143 of the frame 140 of the eyeglasses owned by the observer with use of the attachment member 149. Each housing 112 may be attached to the outside of the temple part 143, or may be attached to the inside of the temple part 143. Alternatively, the light guide plate 121 may be fitted into a rim provided in the front portion 141.

Furthermore, a wiring (signal line, power supply line, etc.) 145 extending from one of the image forming devices 110 extends from the distal end portion of the temple tip part 144 to the outside via the inside of the temple part 143 and the temple tip part 144, and is connected to a control device (control circuit, controller) 148. Furthermore, each image forming device 110 includes a headphone unit 146; and a wiring for headphone unit 146' extending from each image forming device 110 extends from the distal end portion of the temple tip part 144 to the headphone unit 146 via the temple part 143 and the inside of the temple tip part 144. More specifically, the wiring for headphone unit 146' extends from the distal end portion of the temple tip part 144 to the headphone unit 146 in such a way as to go around the back side of the pinna (auricle). With such a configuration, a neat head-mounted display can be made without giving an impression that the headphone unit 146 and the wiring for headphone unit 146' are randomly displaced.

As described above, the wiring (signal line, power supply line, etc.) 145 is connected to the control device (control circuit) 148, and processing for image display is performed in the control device 148. The control device 148 can include a well-known circuit.

A camera 147 including a solid state image sensor having CCD or CMOS sensors and a lens (not illustrated) is attached to a central portion 141' of the front portion 141 with use of an appropriate attachment member (not illustrated) as necessary. A signal from the camera 147 is transmitted to the control device (control circuit) 148 via a wiring (not illustrated) extending from the camera 147.

In the image display device of Example 5, light outputted from the display device 111 at a certain moment (e.g., corresponds to the size of one pixel or one subpixel) is parallel light. Thereafter, this light reaches to the pupil 151 (specifically, the crystalline lens) of the observer 150, and the light passing through the crystalline lens is finally formed into an image on the retina of the pupil 151 of the observer 150.

The present disclosure has been described above based on preferable Examples, but the present disclosure is not limited to these Examples. The configurations and structures of the display device (organic EL display device) and the light-emitting element (organic EL element) described in Examples are illustrative and can be appropriately modified, and the manufacturing method of the display device is also illustrative and can be appropriately modified.

In Examples, one pixel principally includes three subpixels out from a combination of a white light-emitting element and a color filter layer, but for example, one pixel may include four subpixels added with light-emitting element that emits white light. Alternatively, the light-emitting elements each are a red light-emitting element whose organic layer produces red, a green light-emitting element whose organic layer produces green, and a blue light-emitting element whose organic layer produces blue, and one pixel may include a combination of these three types of light-emitting elements (subpixels). In Examples, the light-emitting element driving unit (driving circuit) includes a MOSFET, but may include a TFT. The first electrode or the second electrode may have a single-layer structure, or may have a multilayer structure.

In order to prevent an occurrence of optical crosstalk as a result that the light emitted from a light-emitting part included in one light-emitting element enters into another light-emitting element adjacent thereto, a light shielding unit may be provided between the light-emitting elements. That is, a groove is formed between the light-emitting elements, and this groove may be filled with a light shielding material to form the light shielding unit When the light shielding unit is provided in this manner, an entering percentage of the light emitted from a light emitting part included in one light-emitting element into an adjacent light-emitting element can be reduced, and a phenomenon in which the chromaticity of the entire pixel deviates from a desired chromaticity due to the occurrence of color mixing can be suppressed from occurring. As a result, color mixing can be prevented, so that the color purity is increased at the time when a pixel emits monochromatic light, resulting in higher depth of chromaticity point. Therefore, the color gamut is widened, and the range of color representation of the display device is extended. As specific examples of the light shielding material included in the light shielding unit, there can be mentioned materials capable of shielding light, such as titanium (Ti), chromium (Cr), tungsten (W), tantalum (Ta), aluminum (Al), and $MOSi_2$. The light shielding layer can be formed by a vapor deposition method (including an electron beam vapor deposition method, a hot filament vapor deposition method, and a vacuum vapor deposition method), a sputter deposition method, a CVD method, an ion plating method, or the like. In order to increase color purity, a color filter layer is disposed for each pixel, but in accordance with the configuration of the light-emitting element, the color filter layer can be thinned or the color filter layer can be omitted, and light, which would otherwise be absorbed by the color filter layer, can be outcoupled, as a result, leading to an improvement of the luminous efficacy. Alternatively, a light shielding property may be imparted to black matrix layer BM.

Figure 37A:
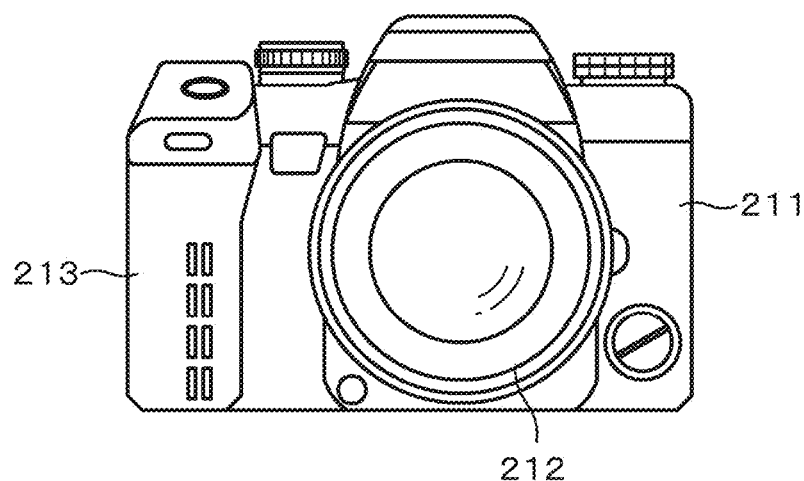
FIG. 37A is a front view of a digital still camera, illustrating an example in which the display device of the present disclosure is applied to a lens interchangeable mirrorless type digital still camera.
Figure 37B:
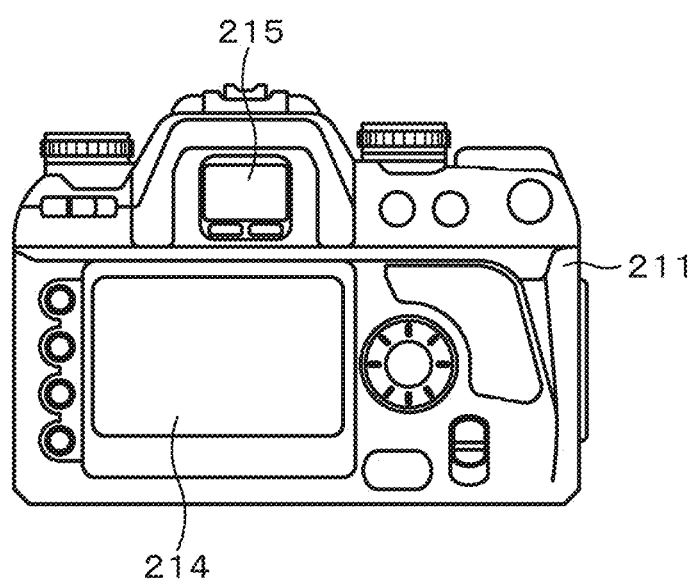
FIG. 37B is a rear view of a digital still camera, illustrating an example in which the display device of the present disclosure is applied to a lens interchangeable mirrorless type digital still camera.

The display device of the present disclosure can be applied to a lens interchangeable mirrorless type digital still camera. A front view of the digital still camera is illustrated in FIG. 37A, and a rear view thereof is illustrated in FIG. 37B. This lens interchangeable mirrorless type digital still camera includes, for example, an interchangeable imaging lens unit (interchangeable lens) 212 on the front right side of a camera main body (camera body) 211, and a grip portion 213 on the front left side thereof for gripping by a photographer. In addition, a monitor device 214 is provided at an approximate center of the back surface of the camera main body 211. An electronic viewfinder (eyepiece window) 215 is provided above the monitor device 214. By looking into the electronic view finder 215, a photographer can determine a composition with visually recognizing the optical image of a subject guided from the imaging lens unit 212. In the lens interchangeable mirrorless type digital still camera having such a configuration, the display device of the present disclosure can be used as the electronic viewfinder 215.

Figure 38:
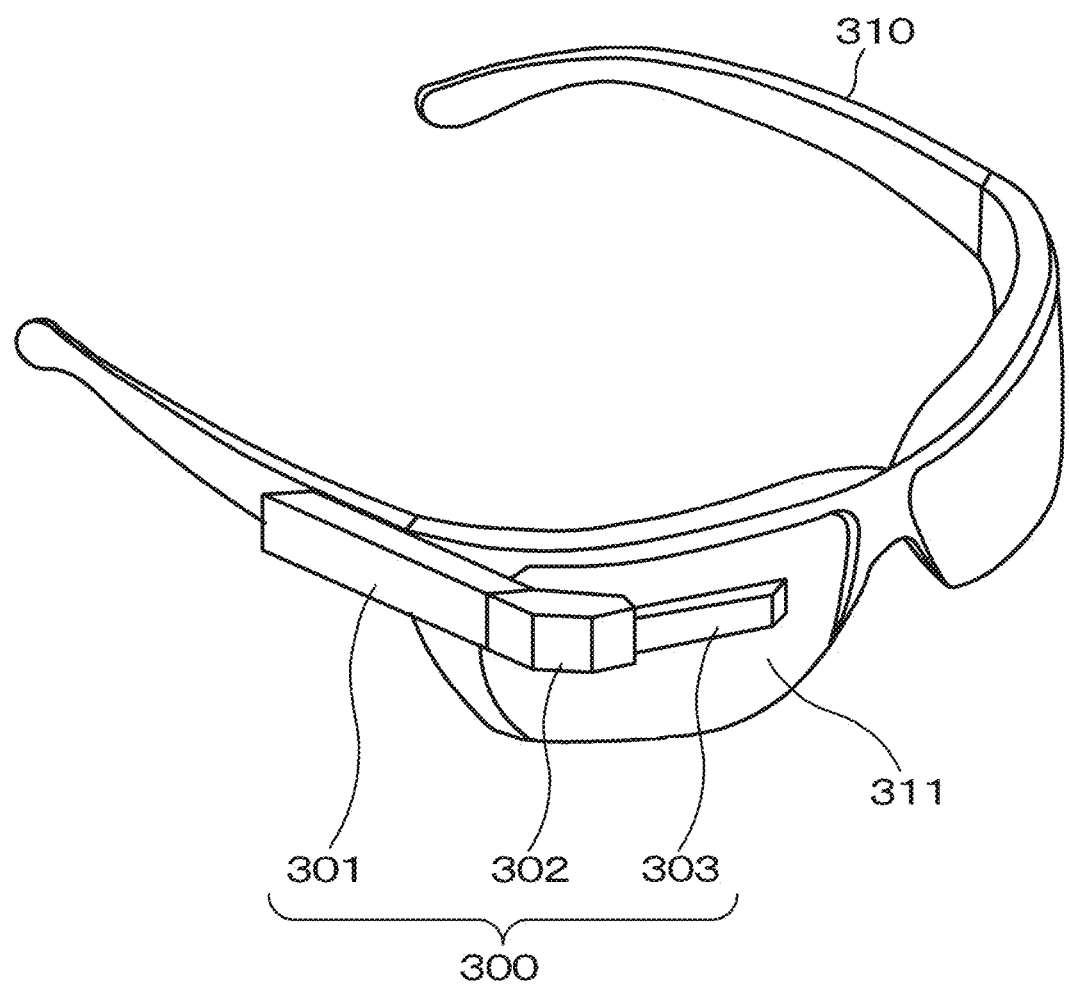
FIG. 38 is an external view of a head-mounted display, illustrating an example in which the display device of the present disclosure is applied to the head-mounted display.

Alternatively, the display device of the present disclosure can be applied to a head-mounted display. As illustrated in the external view in FIG. 38, the head-mounted display 300 includes a transmission-type head-mounted display having a main body 301, an arm portion 302, and a lens barrel 303. The main body 301 is connected to the arm portion 302 and spectacles 310. Specifically, an end portion in the long side direction of the main body 301 is attached to the arm portion 302. One side of the side surface of the main body 301 is connected to the spectacles 310 via a connection member (not illustrated). Note that the main body 301 may be directly worn on the head of a human body. The main body 301 includes: a built-in control board for controlling the operation of the head-mounted display 300; and a built-in display unit. The arm portion 302 couples the main body 301 and the lens barrel 303 together thereby supporting the lens barrel 303 with respect to the main body 301. Specifically, the arm portion 302 is connected to the end portion of the main body 301 and the end portion of the lens barrel 303 thereby fixing the lens barrel 303 with respect to the main body 301. Furthermore, the arm portion 302 has a built-in signal line for communicating data related to an image provided from the main body 301 to the lens barrel 303. The lens barrel 303 projects an image light provided from the main body 301 via the arm portion 302 toward the eye of the user wearing the head-mounted display 300 through the lens 311 of the spectacles 310. In the head-mounted display 300 having the above-described configuration, the display device of the present disclosure can be used as a display unit to be built in the main body 301.

Figure 39A:
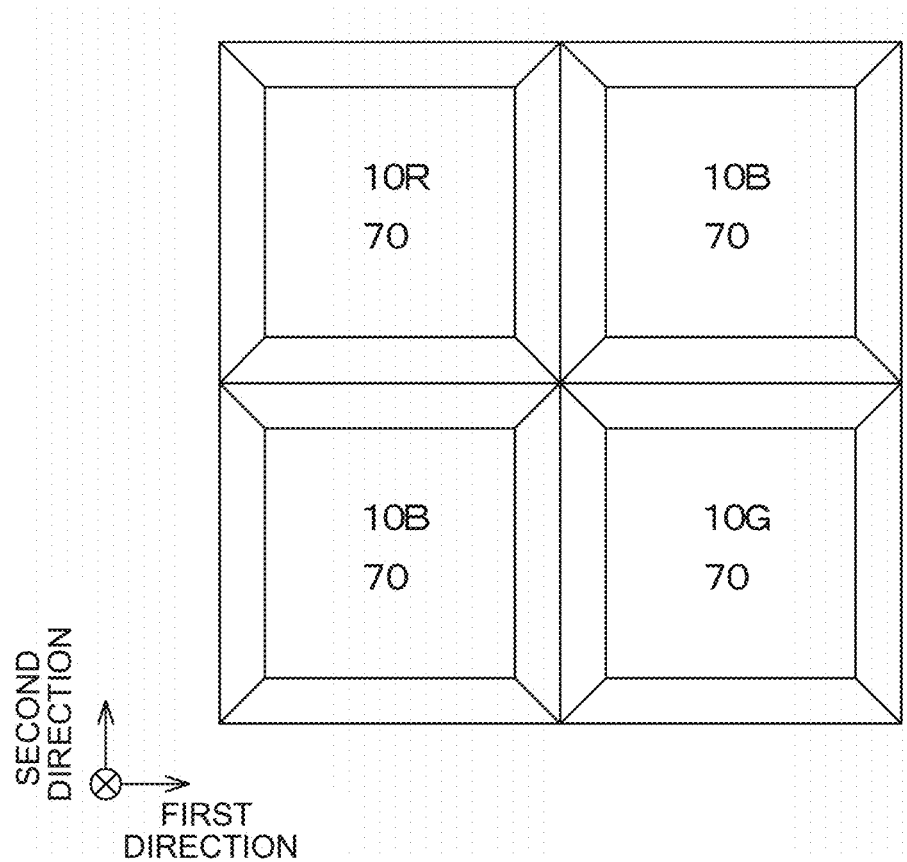
FIG. 39A is a schematic plan view of a lens member having a truncated quadrangular pyramid shape.
Figure 39B:
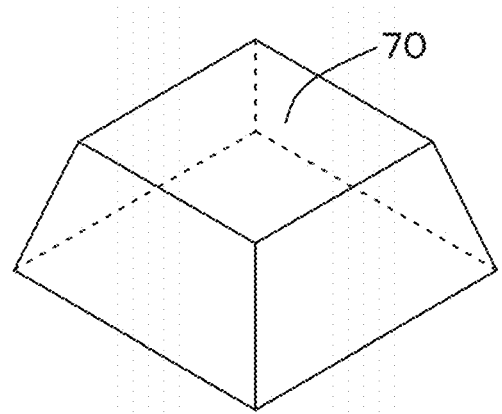
FIG. 39B is a schematic plan perspective view of a lens member having a truncated quadrangular pyramid shape.

In Examples, the planar shapes of the optical path control unit and the like 71 and 72 are circular, but are not limited thereto. As illustrated in FIGS. 39A and 39B, the lens member may have a truncated quadrangular pyramid shape. Note that FIG. 39A is a schematic plan view of a lens member having a truncated quadrangular pyramid shape, and FIG. 39B is a schematic perspective view thereof.

Note that the present disclosure can also adopt the following configurations.

[A01]<<Light-Emitting Element>

A light-emitting element, comprising:
a light-emitting part including a light-emitting region;
a first optical path control unit on which light emitted from the light-emitting region is incident, the first optical path control unit having positive optical power;
a second optical path control unit to which light exited from the first optical path control unit enters, the second optical path control unit having positive optical power; and
a bonding member interposed between the first optical path control unit and the second optical path control unit, wherein
an optical axis of the first optical path control unit is displaced from an optical axis of the second optical path control unit.

[A02]
The light-emitting element according to [A01], wherein the optical axis of the first optical path control unit passes through a center of the light-emitting region.

[A03]
The light-emitting element according to [A01] or [A02], wherein the bonding member is present between a top of the first optical path control unit and a top of the second optical path control unit.

[A04]
The light-emitting element according to [A01] or [A02], wherein a top of the first optical path control unit and a top of the second optical path control unit are in contact with each other.

[A05]
The light-emitting element according to any one of [A01] to [A04], wherein
when a refractive index of a material included in the first optical path control unit is denoted by $n_1$, a refractive index of a material included in the second optical path control unit is denoted by $n_2$, and a refractive index of a material included in the bonding member is denoted by $n_0$, $n_1 > n_0$ and $n_2 > n_0$ are satisfied.

[A06]
The light-emitting element according to any one of [A01] to [A05], comprising a wavelength selector between the light-emitting part and the first optical path control unit.

[A07]
The light-emitting element according to any one of [A01] to [A06], wherein
the first optical path control unit includes a plano-convex lens having a convex shape protruding in a direction away from the light-emitting part, and
the second optical path control unit includes a plano-convex lens having a convex shape protruding in a direction toward the light-emitting part.

[A08]<<Display Device>>

A display device, comprising:
a first substrate and a second substrate; and
a plurality of light-emitting element units each including a first light-emitting element, a second light-emitting element, and a third light-emitting element, provided on the first substrate, wherein
each light-emitting element includes:
a light-emitting part provided above the first substrate, the light-emitting part including a light-emitting region;
a first optical path control unit to which light emitted from the light-emitting region enters, the first optical path control unit having positive optical power;
a second optical path control unit to which light exited from the first optical path control unit enters, the second optical path control unit having positive optical power; and
a bonding member interposed between the first optical path control unit and the second optical path control unit, and
an optical axis of the first optical path control unit is displaced from an optical axis of the second optical path control unit.

[A09]
The display device according to [A08], wherein, an amount of displacement between the optical axis of the first optical path control unit and the optical axis of the second optical path control unit is the same among the first light-emitting element, the second light-emitting element, and the third light-emitting element in each light-emitting element unit.

REFERENCE SIGNS LIST

10, $10_1$, $10_2$, $10_3$ LIGHT-EMITTING ELEMENT
20 TRANSISTOR
21 GATE ELECTRODE
22 GATE INSULATING LAYER
23 CHANNEL FORMATION REGION
24 SOURCE/DRAIN REGION
25 ELEMENT ISOLATION REGION
26 SUBSTRATUM
26A SURFACE OF SUBSTRATUM
27 CONTACT PLUG
28 INSULATING LAYER
28' OPENING
29 CONCAVE PORTION
29A SLOPE OF CONCAVE PORTION
29B BOTTOM OF CONCAVE PORTION
30, $30_1$, $30_2$, $30_3$, 30' LIGHT-EMITTING PART
31, $31_1$, $31_2$, $31_3$ FIRST ELECTRODE
32, $32_1$, $32_2$, $32_3$ SECOND ELECTRODE
33, $33_1$, $33_2$, $33_3$ ORGANIC LAYER
34 PROTECTIVE LAYER (PLANARIZED LAYER)
34A SECOND PROTECTIVE LAYER

34B THIRD PROTECTIVE LAYER
35 BONDING MEMBER
36 UNDERLYING LAYER
37, $37_1$, $37_2$, $37_3$ LIGHT REFLECTION LAYER
$38_1$, $38_2$, $38_3$, 38', $38_1$', $38_2$', $38_3$' INTERLAYER INSULATING MATERIAL LAYER
39 UNDERLYING FILM
41 FIRST SUBSTRATE
42 SECOND SUBSTRATE
61 MASK LAYER
62, 63, 64 RESIST LAYER
65 OPENING
71 FIRST OPTICAL PATH CONTROL UNIT (FIRST OPTICAL PATH CONTROLLER)
71a LIGHT INCIDENT SURFACE OF FIRST OPTICAL PATH CONTROL UNIT
71b LIGHT EXIT SURFACE OF FIRST OPTICAL PATH CONTROL UNIT
72 SECOND OPTICAL PATH CONTROL UNIT (SECOND OPTICAL PATH CONTROLLER)
72a LIGHT INCIDENT SURFACE OF SECOND OPTICAL PATH CONTROL UNIT
72b LIGHT EXIT SURFACE OF SECOND OPTICAL PATH CONTROL UNIT
73, 74 LIGHT OUTPUT DIRECTION CONTROL MEMBER
73a, 74a LIGHT INCIDENT SURFACE OF LIGHT OUTPUT DIRECTION CONTROL MEMBER
73b, 74b LIGHT EXIT SURFACE OF LIGHT OUTPUT DIRECTION CONTROL MEMBER
CF, $CF_R$, $CF_G$, $CF_B$ COLOR FILTER LAYER (WAVELENGTH SELECTOR)
TF TRANSPARENT FILTER LAYER
BM BLACK MATRIX LAYER
$LN_0$ NORMAL LINE PASSING TROUGH THE CENTER OF LIGHT-EMITTING REGION
$LN_1$ OPTICAL AXIS OF FIRST OPTICAL PATH CONTROL UNIT
$LN_2$ OPTICAL AXIS OF SECOND OPTICAL PATH CONTROL UNIT
$LN_3$ NORMAL LINE PASSING TROUGH THE CENTER OF WAVELENGTH SELECTOR
100 IMAGE DISPLAY DEVICE
110 IMAGE FORMING DEVICE
111 DISPLAY DEVICE
112 HOUSING
121 LIGHT GUIDE PLATE
122 FIRST SURFACE OF LIGHT GUIDE PLATE
123 SECOND SURFACE OF LIGHT GUIDE PLATE
131 FIRST DEFLECTION UNIT
132 SECOND DEFLECTION UNIT
140 FRAME
140' NOSE PAD
141 FRONT PART
141' CENTRAL PORTION OF FRONT PART
142 HINGE
143 TEMPLE PART
144 TEMPLE TIP PART (TIP, EAR CONTACT, EAR PAD)
145 WIRING (SIGNAL LINE, POWER LINE, ETC.)
146 HEADPHONE UNIT
146' WIRING FOR HEADPHONE UNIT
147 CAMERA
148 CONTROL DEVICE (CONTROL CIRCUIT, CONTROL UNIT)
149 FITTING MEMBER
150 OBSERVER
151 PUPIL
211 CAMERA MAIN BODY (CAMERA BODY)
212 PHOTOGRAPHING LENS UNIT (INTERCHANGEABLE LENS)
213 GRIP PORTION
214 MONITOR DEVICE
215 ELECTRONIC VIEW FINDER (EYEPIECE WINDOW)
300 HEAD-MOUNTED DISPLAY
301 MAIN BODY
302 ARM PORTION
303 LENS BARREL
310 SPECTACLES

The invention claimed is:

1. A light-emitting element, comprising:
a light-emitting part including a light-emitting region;
a first optical path control unit on which light emitted from the light-emitting region is incident, the first optical path control unit having positive optical power;
a second optical path control unit to which light exited from the first optical path control unit enters, the second optical path control unit having positive optical power; and
a bonding member interposed between the first optical path control unit and the second optical path control unit, wherein
an optical axis of the first optical path control unit is displaced from an optical axis of the second optical path control unit.

2. The light-emitting element according to claim 1, wherein the optical axis of the first optical path control unit passes through a center of the light-emitting region.

3. The light-emitting element according to claim 1, wherein the bonding member is present between a top of the first optical path control unit and a top of the second optical path control unit.

4. The light-emitting element according to claim 1, wherein a top of the first optical path control unit and a top of the second optical path control unit are in contact with each other.

5. The light-emitting element according to claim 1, wherein
when a refractive index of a material included in the first optical path control unit is denoted by $n_1$, a refractive index of a material included in the second optical path control unit is denoted by $n_2$, and a refractive index of a material included in the bonding member is denoted by $n_0$, $$n_1 > n_0$$

and $$n_2 > n_0$$

are satisfied.

6. The light-emitting element according to claim 1, comprising a wavelength selector between the light-emitting part and the first optical path control unit.

7. The light-emitting element according to claim 1, wherein
the first optical path control unit includes a plano-convex lens having a convex shape protruding in a direction away from the light-emitting part, and
the second optical path control unit includes a plano-convex lens having a convex shape protruding in a direction toward the light-emitting part.

8. A display device, comprising:

a first substrate and a second substrate; and a plurality of light-emitting element units each including a first light-emitting element, a second light-emitting element, and a third light-emitting element, provided on the first substrate, wherein each light-emitting element includes:

a light-emitting part provided above the first substrate, the light-emitting part including a light-emitting region;

a first optical path control unit to which light emitted from the light-emitting region enters, the first optical path control unit having positive optical power;

a second optical path control unit to which light exited from the first optical path control unit enters, the second optical path control unit having positive optical power; and a bonding member interposed between the first optical path control unit and the second optical path control unit, and an optical axis of the first optical path control unit is displaced from an optical axis of the second optical path control unit.

9. The display device according to claim 8, wherein, an amount of displacement between the optical axis of the first optical path control unit and the optical axis of the second optical path control unit is the same among the first light-emitting element, the second light-emitting element, and the third light-emitting element in each light-emitting element unit.

\* \* \* \* \*